(12) United States Patent
Oda et al.

(10) Patent No.: US 9,236,487 B2
(45) Date of Patent: Jan. 12, 2016

(54) METHOD OF MANUFACTURING SUBSTRATE HAVING THIN FILM THEREABOVE, METHOD OF MANUFACTURING THIN-FILM-DEVICE SUBSTRATE, THIN-FILM SUBSTRATE, AND THIN-FILM-DEVICE SUBSTRATE

(71) Applicant: JOLED INC., Tokyo (JP)

(72) Inventors: Tomohiko Oda, Osaka (JP); Takahiro Kawashima, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/187,692

(22) Filed: Feb. 24, 2014

(65) Prior Publication Data

US 2014/0167049 A1 Jun. 19, 2014

Related U.S. Application Data

(63) Continuation of application No. PCT/JP2012/005414, filed on Aug. 28, 2012.

(30) Foreign Application Priority Data

Aug. 30, 2011 (WO) .................. PCT/JP2011/004841
Sep. 20, 2011 (JP) ................. 2011-204263
Sep. 20, 2011 (JP) ................. 2011-204264

(51) Int. Cl.
*H01L 21/20* (2006.01)
*H01L 21/36* (2006.01)
(Continued)

(52) U.S. Cl.
CPC .... *H01L 29/78663* (2013.01); *H01L 21/02422* (2013.01); *H01L 21/02488* (2013.01);
(Continued)

(58) Field of Classification Search
CPC ............ H01L 27/1229; H01L 27/1222; H01L 27/1285; H01L 27/1281; H01L 27/1274; H01L 21/02691

USPC .............................................. 438/487; 257/66
See application file for complete search history.

(56) References Cited

U.S. PATENT DOCUMENTS 5,529,951 A 6/1996 Noguchi et al.
5,869,803 A 2/1999 Noguchi et al.
(Continued)

FOREIGN PATENT DOCUMENTS

JP 07-235490 9/1995
JP 08-340118 12/1996
(Continued)

OTHER PUBLICATIONS

U.S. Appl. No. 14/346,989 to Tomohiko Oda et al., filed Mar. 25, 2014.
(Continued)

*Primary Examiner* — Nicholas Tobergte
(74) *Attorney, Agent, or Firm* — Greenblum & Bernstein, P.L.C.

(57) ABSTRACT

A method of manufacturing a substrate having a thin film thereabove includes: forming a thin film above the substrate; and crystallizing at least a predetermined area of the silicon thin film into a crystallized area through relative scan of the silicon thin film which is performed while the thin film is being irradiated with a continuous wave light beam, wherein in the crystallizing, a projection of the light beam on the thin film has a major axis in a direction crossing a direction of the relative scan, and the formed crystallized area includes a strip-shaped first area extending in the direction crossing the direction of the relative scan and a second area adjacent to the strip-shaped first area, the strip-shaped first area including crystal grains having an average grain size larger than that of crystal grains in the second area.

13 Claims, 28 Drawing Sheets

(51) Int. Cl.
  *H01L 29/786* (2006.01)
  *H01L 21/02* (2006.01)
  *H01L 21/324* (2006.01)
  *H01L 21/268* (2006.01)
  *H01L 27/12* (2006.01)

(52) U.S. Cl.
  CPC .... *H01L 21/02532* (2013.01); *H01L 21/02658* (2013.01); *H01L 21/02678* (2013.01); *H01L 21/02683* (2013.01); *H01L 21/02691* (2013.01); *H01L 21/268* (2013.01); *H01L 21/324* (2013.01); *H01L 27/1285* (2013.01); *H01L 27/1222* (2013.01); *H01L 27/1229* (2013.01); *H01L 27/1274* (2013.01); *H01L 27/1281* (2013.01)

(56) References Cited

U.S. PATENT DOCUMENTS

| | | | |
|---|---|---|---|
| 6,071,765 | A | 6/2000 | Noguchi et al. |
| 6,479,837 | B1 * | 11/2002 | Ogawa et al. ............... 257/59 |
| 6,741,621 | B2 | 5/2004 | Asano |
| 6,756,614 | B2 | 6/2004 | Hatano et al. |
| 7,115,454 | B2 | 10/2006 | Hatano et al. |
| 7,172,932 | B2 | 2/2007 | Hatano et al. |
| 7,556,993 | B2 | 7/2009 | Hatano et al. |
| 7,859,016 | B2 | 12/2010 | Hatano et al. |
| 8,421,080 | B2 | 4/2013 | Saitoh et al. |
| 8,440,581 | B2 * | 5/2013 | Im et al. .................. 438/795 |
| 2002/0119609 | A1 | 8/2002 | Hatano et al. |
| 2003/0057418 | A1 | 3/2003 | Asano |
| 2003/0230749 | A1 * | 12/2003 | Isobe et al. ............. 257/59 |
| 2004/0063337 | A1 | 4/2004 | Hatano et al. |
| 2004/0224453 | A1 | 11/2004 | Hatano et al. |
| 2005/0259709 | A1 * | 11/2005 | Das et al. ............... 372/55 |
| 2006/0001878 | A1 * | 1/2006 | Das et al. .............. 356/400 |
| 2007/0105263 | A1 | 5/2007 | Hatano et al. |
| 2008/0105879 | A1 * | 5/2008 | Kuramachi et al. ........ 257/75 |
| 2008/0188012 | A1 * | 8/2008 | Yazaki et al. ............ 438/7 |
| 2009/0269892 | A1 | 10/2009 | Hatano et al. |
| 2010/0258808 | A1 * | 10/2010 | Cheng et al. ............ 257/66 |
| 2011/0297950 | A1 | 12/2011 | Kato et al. |
| 2011/0318891 | A1 | 12/2011 | Oda et al. |
| 2012/0309140 | A1 | 12/2012 | Oda et al. |
| 2013/0277678 | A1 | 10/2013 | Ootaka et al. |
| 2014/0231812 | A1 * | 8/2014 | Nishida et al. .......... 257/66 |
| 2014/0231813 | A1 * | 8/2014 | Oda et al. .............. 257/66 |

FOREIGN PATENT DOCUMENTS

| | | |
|---|---|---|
| JP | 10-189450 | 7/1998 |
| JP | 10-229202 | 8/1998 |
| JP | 2000-260709 | 9/2000 |
| JP | 2002-222959 | 8/2002 |
| JP | 2003-178982 | 6/2003 |
| JP | 2007-035812 | 2/2007 |
| JP | 2008-016717 | 1/2008 |
| JP | 2011-165717 | 8/2011 |

OTHER PUBLICATIONS

U.S. Appl. No. 14/243,294 to Takahiro Kawashima et al., filed Apr. 2, 2014.
International Search Report (ISR) in International Patent Application No. PCT/JP2012/005414, dated Dec. 4, 2012.
Preliminary Report on Patentability in International Patent Application No. PCT/JP2012/005414, dated Dec. 10, 2013.
International Search Report (ISR) in International Patent Application No. PCT/JP2011/004841, dated Dec. 6, 2011.
Preliminary Report on Patentability in International Patent Application No. PCT/JP2011/004841, dated Nov. 20, 2012.

* cited by examiner

|  | Perpendicular (Driver transistor) | Parallel (Switching transistor) |
|---|---|---|
| Ion (A) | $3.45 \times 10^{-4}$ | $1.09 \times 10^{-5}$ |
| Ioff (A) | $9.34 \times 10^{-11}$ | $1.53 \times 10^{-11}$ |

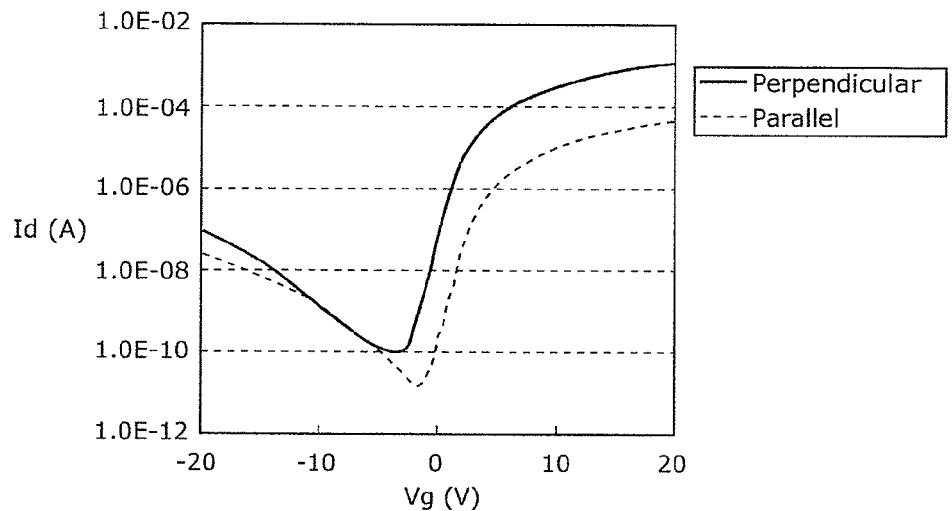
FIG. 31
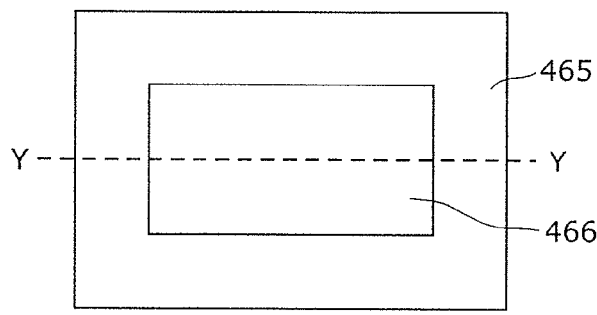
FIG. 32
|  | Perpendicular (Peripheral transistor) | Parallel (Pixel transistor) |
|---|---|---|
| Ion (A) | $3.45 \times 10^{-4}$ | $1.09 \times 10^{-5}$ |
| Ioff (A) | $9.34 \times 10^{-11}$ | $1.53 \times 10^{-11}$ |
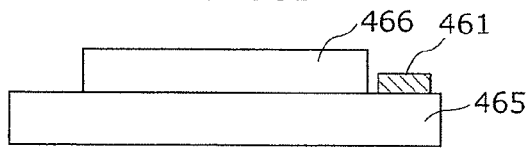
FIG. 33A
FIG. 33B

METHOD OF MANUFACTURING SUBSTRATE HAVING THIN FILM THEREABOVE, METHOD OF MANUFACTURING THIN-FILM-DEVICE SUBSTRATE, THIN-FILM SUBSTRATE, AND THIN-FILM-DEVICE SUBSTRATE

CROSS REFERENCE TO RELATED APPLICATIONS

This is a continuation application of PCT International Application No. PCT/JP2012/005414 filed on Aug. 28, 2012, designating the United States of America, which is based on and claims priority of PCT International Application No. PCT/JP2011/004841 filed on Aug. 30, 2011, Japanese Patent Application No. 2011-204263 filed on Sep. 20, 2011, and Japanese Patent Application No. 2011-204264 filed on Sep. 20, 2011. The entire disclosures of the above-identified applications, including the specifications, drawings and claims are incorporated herein by reference in their entirety.

FIELD

One or more exemplary embodiments disclosed herein relate generally to a method of manufacturing a substrate having a thin film thereabove, a method of manufacturing thin-film-device substrate, a thin-film substrate, and a thin-film-device substrate.

BACKGROUND

Active-matrix-driven organic electro luminescence (or organic light-emitting diode (OLED)) display devices and active-matrix-driven liquid-crystal display devices include thin-film semiconductor devices referred to as thin film transistors (TFTs).

In a display device of this type, TFTs are arranged in an array to form a TFT array device. Each pixel of the display device has a TFT for driving the pixel (driver transistor) and a TFT for selecting the pixel (switching transistor).

A pixel area where the pixels are disposed is surrounded by a peripheral circuit area where gate driver circuits and source driver circuits used for driving or switching of the pixels are disposed.

The driver transistor and switching transistor among transistors in a self-emitting OLED display device including OLED devices are required to have different characteristics. In order to increase drive performance of such OLED devices, the driver transistor is required to have excellent ON-state current characteristics, and the switching transistor is required to have excellent OFF-state current characteristics.

As for a display device including low temperature poly silicon (LTPS), such as a liquid-crystal display device, TFTs in peripheral circuit area and TFTs in the pixel area are required to have different characteristics. The TFTs in the peripheral circuit area are required to have excellent ON-state current characteristics, and the TFTs in the pixel area are required to have excellent OFF-state current characteristics.

A TFT is a transistor having a gate electrode, a semiconductor layer (channel layer), a source electrode, and a drain electrode formed on a substrate. The channel layer is typically a silicon thin film. The silicon thin film comes in two main types. One is silicon thin film not crystalline (amorphous silicon film), and the other is a silicon thin film having crystallinity (crystalline silicon thin film).

In comparison with a TFT having a channel layer of an amorphous silicon thin film, a TFT having a channel layer of a crystalline silicon thin film has large carrier mobility and is thus excellent in ON-state current characteristics. Thus, use of a crystalline silicon thin film as a channel layer of a driver transistor is a known technique.

In a conventional method of forming a crystalline silicon thin film, an amorphous crystalline silicon thin film on a substrate is polycrystallized by applying heat to the amorphous crystalline silicon thin film with the addition of a metal catalyst. This method has the advantage that the amorphous crystalline silicon thin film can be crystallized at low temperature, while having a problem of higher cost due to a larger number of processes and a problem of difficulty in complete removal of metal elements after crystallization.

In another conventional method of forming a crystalline silicon thin film, a crystalline silicon thin film is formed on a substrate by chemical vapor deposition (CVD). This method has the advantage that manufacturing cost is lower because the number of processes is smaller, while having a problem of difficulty in achieving the ON-state current characteristics required for driver transistors because of microlite structure of the resulting amorphous crystalline silicon.

In another conventional method of forming a crystalline silicon thin film, an amorphous silicon film is polycrystallized by irradiating the amorphous silicon film with a light beam of an excimer laser having a predetermined energy density at a predetermined film formation temperature (Japanese Unexamined Patent Application Publication No. 07-235490 (Patent Literature 1)). However, this method has a problem of high running cost because of the laser system which shapes laser beams obtained by gas discharge and thus requires frequent overhaul.

There is another conventional method of crystallization of amorphous silicon using a laser, in which amorphous silicon film is changed into a polycrystalline silicon thin film by irradiating the amorphous silicon film with a pulsed laser having a wavelength of 532 nm (Japanese Unexamined Patent Application Publication No. 07-235490 (Patent Literature 2)).

CITATION LIST

Patent Literature

[Patent Literature 1] Japanese Unexamined Patent Application Publication No. 07-235490
[Patent Literature 2] Japanese Unexamined Patent Application Publication No. 2008-016717

SUMMARY

Technical Problem

It is necessary in some cases to form a single device with semiconductor thin films each having excellent different characteristics using an easy and convenient method. However, it is difficult to form semiconductor thin films each having different characteristics in the same process without increasing input energy.

One non-limiting and exemplary embodiment provides a method of manufacturing a substrate with a thin film thereabove, a method of manufacturing a thin-film-device substrate, a thin-film substrate, and a thin-film-device substrate. Either of the methods provides a semiconductor thin film formed in the same process and including regions different in crystalline state without causing increase in input energy.

Solution to Problem

In one general aspect, the techniques for manufacturing a substrate with a thin film thereabove disclosed here feature:

preparing a substrate; forming a thin film above the substrate; and crystallizing at least a predetermined area of the thin film into a crystallized area through relative scan of the thin film with the substrate irradiated with a continuous wave light beam, wherein a projection of the light beam on the thin film has a major axis in a direction crossing a direction of the relative scan, and in the crystallizing, the crystallized area is formed to include a strip-shaped first area extending in the direction crossing the direction of the relative scan and a second area adjacent to the strip-shaped first area in the direction of the relative scan, the strip-shaped first area including crystal grains having an average grain size larger than an average grain size of crystal grains included in the second area.

General and specific aspects disclosed above may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The method of manufacturing a substrate with a thin film thereabove according to one or more exemplary embodiments or features disclosed herein enables formation of strip-shaped first areas and second areas having different average grain size without requiring increase in input energy of a laser. With this, the formed crystalline thin film has grain structure including areas different in crystalline state. Thus, a single device having two types of devices (TFTs, for example) having different characteristics can be easily manufactured.

Furthermore, in the method disclosed herein, the strip-shaped first areas are formed by faster scanning of a thin film with a laser beam for thin film crystallization, so that throughput can be increased.

Furthermore, the resulting crystalline thin film has a crystallized area where the grain size is large (the first area). Thus, a TFT including the crystalline thin film as a channel layer is excellent in ON-state current characteristics with high charge carrier mobility.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 31 shows Id-Vg characteristics of the pixel transistor and the peripheral transistors according to Embodiment 3.

FIG. 32 shows Ion and Ioff of the pixel transistor and the peripheral transistors according to Embodiment 3.

FIG. 33A shows a plan view of a display panel according to Embodiment 4.

FIG. 33B shows a cross-sectional view of the display panel according to Embodiment 4.

DESCRIPTION OF EMBODIMENTS

Figure 1:
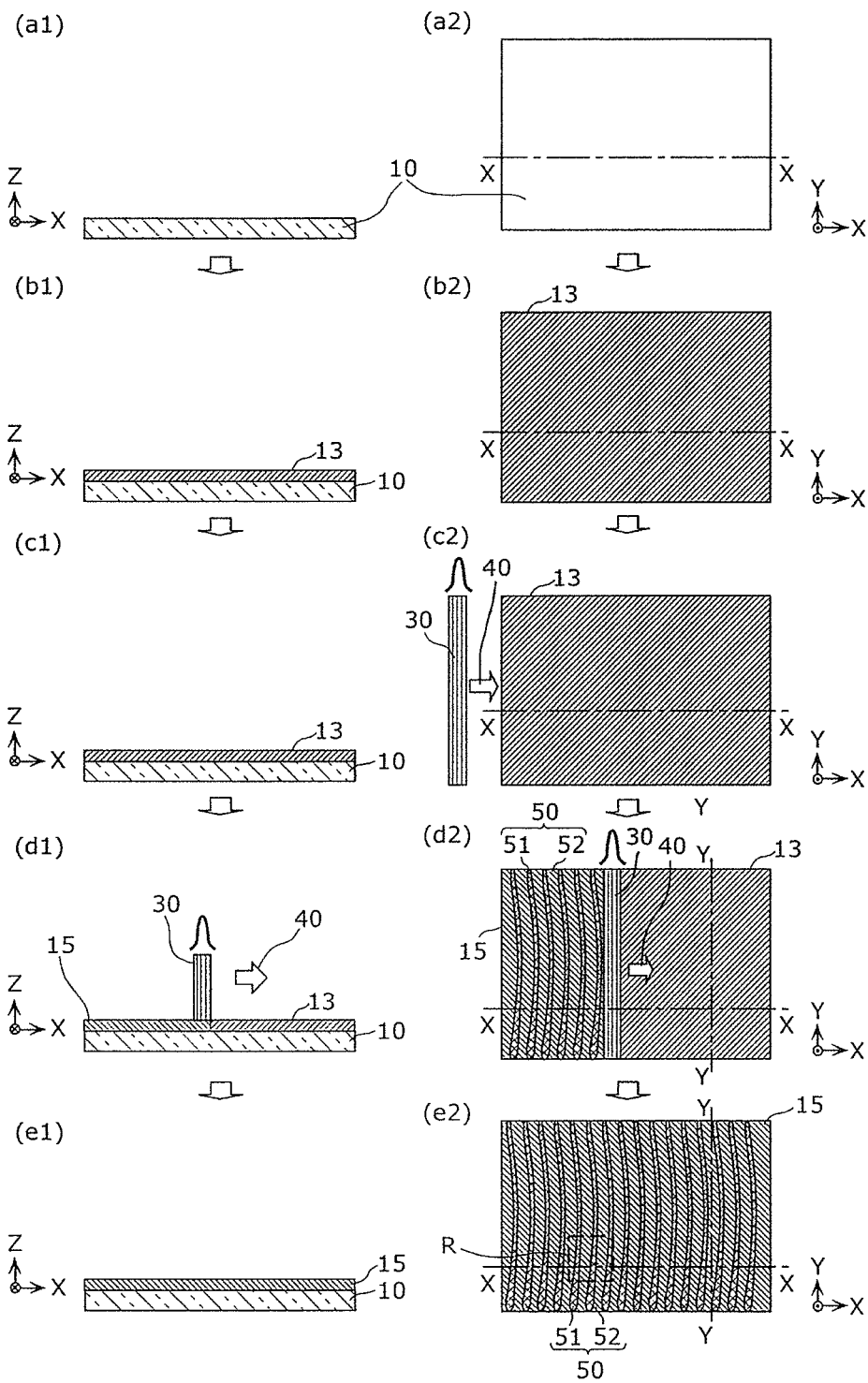
FIG. 1 (a1)-(e1) and (a2)-(e2) shows cross-sectional views schematically illustrating steps of a method of manufacturing a substrate with a thin film thereabove according to Embodiment 1.

Recent years have seen increase in demand for higher-definition displays which can be driven at higher speed. This leads to an increasing requirement for TFTs with further enhanced ON-state current characteristics. ON-state current characteristics of a TFT is enhanced when, for example, crystal grains in a crystalline semiconductor thin film included in the TFT as a channel layer has an increased size. For example, when an amorphous silicon film is made into a crystalline silicon thin film by irradiation with laser light, the crystalline silicon thin film has an increased crystal grain size when the amorphous silicon film is irradiated with laser light having an increased maximum intensity. However, merely increasing a maximum intensity of laser light involves increase in output energy of the laser light. This leads to a problem of increase in input energy and a problem of need for high-power laser equipment.

There may be a need for a single device which includes a crystalline semiconductor thin film having different sets of characteristics. For example, there is a need for a single device which includes a TFT excellent in ON-state current characteristics and a TFT excellent in OFF-state current characteristics.

As described above, a crystalline semiconductor thin film which functions as a channel layer of a TFT and has an increased crystal grain size will provide the TFT with enhanced ON-state current characteristics. On the other hand, a crystalline semiconductor thin film which functions as a channel layer of a TFT and has a reduced crystal grain size will provide the TFT with enhanced OFF-state current characteristics. It is thus difficult to form, in a single device, a thin-film device excellent in ON-state current characteristics and a thin-film device excellent in OFF-state current characteristics in parallel in the same process. There is the problem.

For OLED display devices, characteristics required for driver transistors and characteristics required for switching transistors are different as described above. Thus, it is preferable that crystalline semiconductor thin films different in grain structure be formed in a single pixel so that the pixel has two types of TFTs different in characteristics. In order to form the two types of TFTs, an amorphous semiconductor thin film is irradiated with laser light which is output under different sets of conditions between a driver transistor and a switching transistor. However, this may cause problems such as variation in characteristics of transistors among pixels, inplane uniformity of grain structure, and complication of laser equipment. Furthermore, when laser irradiation is performed over several times in this manner, there is a problem of decreased throughput.

Similarly, for display devices including LTPS, such as a liquid-crystal display device, TFTs in the peripheral circuit area and TFTs in pixel areas are required to be different in characteristics. Thus, it is preferable that crystalline semiconductor thin films different in grain structure be formed in a single pixel so that the pixel has two types of TFTs differing in characteristics from each other. In order to form the two types of TFTs, an amorphous semiconductor thin film is irradiated with laser light which is output under different sets of conditions between a TFT in the peripheral circuit area and a TFT in the pixel area. However, this may cause problems such as variation in characteristics of the peripheral circuit area and the pixel area among pixels, inplane uniformity of grain structure, and complication of laser equipment.

One non-limiting and exemplary embodiment provides a method of manufacturing crystalline thin films. By using the method, it is possible to form in the same process a crystalline thin film having areas different in crystalline states from each other without increasing input energy.

According to an exemplary embodiment disclosed herein, a method of manufacturing a substrate having a thin film thereabove includes: preparing a substrate; forming a thin film above the substrate; and crystallizing at least a predetermined area of the thin film into a crystallized area through relative scan of the thin film with the substrate irradiated with a continuous wave light beam, wherein a projection of the light beam on the thin film has a major axis in a direction crossing a direction of the relative scan, and in the crystallizing, the crystallized area is formed to include a strip-shaped first area extending in the direction crossing the direction of the relative scan and a second area adjacent to the strip-shaped first area in the direction of the relative scan, the strip-shaped first area including crystal grains having an average grain size larger than an average grain size of crystal grains included in the second area.

By using this method, a strip-shaped first area and second areas different in average grain size are formed without requiring increase in input energy of a laser. With this, the formed crystalline thin film has grain structure including areas different in crystalline state.

Furthermore, the strip-shaped first area is formed by performing faster scanning on a thin film with a laser beam for thin film crystallization. Thus, speed of scanning with a laser beam is increased, so that throughput can be increased.

Furthermore, the strip-shaped first area formed by such faster scan has a crystallized area where the grain size is relatively large. Thus, a TFT including the crystalline thin film as a channel layer has excellent ON-state current characteristics.

For example, in method of manufacturing a substrate having a thin film thereabove, the second area may lie on each side of the strip-shaped first area, and the strip-shaped first area may include crystal grains which are in contact with the second area on the each side of the strip-shaped first area. In this case, the crystal grains included in the strip-shaped first area and in contact with the second area on the each side of the strip-shaped first area preferably account for at least 80% of the strip-shaped first area in length.

In this configuration, the strip-shaped first area includes a plurality of crystalline grains stretching from one end of a shorter dimension of the strip-shaped first area to the other end (or across the full width of the strip-shaped first area).

With this, a TFT including the crystalline thin film as a channel layer has excellent ON-state current characteristics has less varied, uniform charge carrier mobility.

Furthermore, in method of manufacturing a substrate having a thin film thereabove, the strip-shaped first area may be continuous within a length of the major axis.

With this, mobility of charge carriers is further increased, and resulting crystalline silicon thin film is excellent in uniformity.

For example, the average grain size of the crystal grains included in the strip-shaped first area formed in the crystallizing may be 100 nm to 500 nm, inclusive, and the average grain size of the crystal grains included in the second area formed in the crystallizing is 30 nm or larger and smaller than 100 nm.

In this configuration, the grain structure provides the substrate with excellent inplane uniformity, so that resulting devices are less varied in characteristics. Furthermore, a TFT including the thin film which includes the first area where the average grain size is 100 nm to 500 nm, inclusive has excellent ON-state current characteristics.

For example, in the crystallizing, a plurality of the strip-shaped first areas may be formed at a regular pitch.

With this, the grain structure provides the substrate with excellent inplane uniformity, so that resulting devices are less varied in characteristics.

For example, in the crystallizing, each of the strip-shaped first areas may be formed to have a Raman shift peak having a full width at half maximum of 4.8 $cm^{-1}$ to 5.5 $cm^{-1}$, inclusive, in a Raman scattering spectrum measured using Raman spectroscopy.

With this, the formed crystalline thin film has grain structure including the strip-shaped first areas where crystal grains are large in size.

For example, the regular pitch between adjacent ones of the strip-shaped first areas formed in the crystallizing may be 2.0 µm or shorter.

With this, the strip-shaped first areas are formed at a regular pitch in the plane of the substrate and include crystal grains larger in size. Thus, a TFT array of TFTs including, as a channel layer, a crystalline thin film which includes such first areas has excellent ON-state current characteristics and excellent inplane uniformity.

For example, the light beam may be laser light having a wavelength of 405 nm to 632 nm, inclusive.

Grain structure in which the strip-shaped first areas and the second area coexists are provided easily by high-speed scanning laser irradiation. Furthermore, use of such a laser enables easy high-speed scanning, and thus the strip-shaped first areas can be formed at a regular pitch with ease.

Furthermore, division of a minor axis width of intensity distribution of the laser light by a speed of the relative scan of the thin film with the laser light may give a quotient of 60 µsec or less.

With this, the strip-shaped first areas are formed at a regular pitch.

For example, according to an exemplary embodiment disclosed herein, a method of manufacturing a thin-film-device substrate includes: preparing a substrate; forming a first gate electrode and a second gate electrode apart from each other above the substrate; forming a gate insulating film on the first gate electrode and the second gate electrode; forming a thin film on the gate insulating film; crystallizing the thin film above the first gate electrode and the second gate electrode through relative scan of the thin film with the substrate irradiated with a continuous wave light beam from above the first gate electrode and the second gate electrode; and forming a source electrode and a drain electrode above the thin film located above each of the first gate electrode and the second gate electrode, wherein a projection of the light beam on the thin film has a major axis in a direction crossing a direction of the relative scan, and in the crystallizing, the crystallized area is formed to include a strip-shaped first area extending in the direction crossing the direction of the relative scan and a second area adjacent to the strip-shaped first area in a direction of the relative scan, the strip-shaped first area including crystal grains having an average grain size larger than an average grain size of crystal grains included in the second area.

By using this method, strip-shaped first areas and second areas different in average grain size are formed to correspond to the first gate electrode and the second gate electrode, respectively, without requiring increase in input energy of a laser. Thus, a single device having TFTs of different sets of characteristics can be easily manufactured.

For example, in the method of manufacturing a thin-film-device substrate, the second area may lie on each side of the strip-shaped first area, and the strip-shaped first area may include crystal grains which are in contact with the second area on both of the each side of the strip-shaped first area. In this case, the crystal grains included in the strip-shaped first area and in contact with the second area on the each side of the strip-shaped first area preferably account for at least 80% of the strip-shaped first area in length.

In this configuration, the strip-shaped first area includes a plurality of crystalline grains stretching from one end of a shorter dimension of the strip-shaped first area to the other end (or across the full width of the strip-shaped first area). With this, a TFT is provided which has excellent ON-state current characteristics and less varied charge carrier mobility.

For example, according to an exemplary embodiment disclosed herein, a thin-film substrate includes: a substrate; and a thin film located above the substrate and including a strip-shaped first area and a second area lying on each widthwise side of the strip-shaped first area, the second area including crystal grains having an average grain size smaller than an average grain size of crystal grains included in the strip-shaped first area, wherein the strip-shaped first area includes crystal grains which are in contact with the second area on the each side of the strip-shaped first area.

The thin-film substrate in this exemplary embodiment includes, in the plane of the substrate, a thin film having a strip-shaped first area where crystal grains are relatively large in size and a second area where crystal grains are relatively small in size. With this, a single device having two types of devices (TFTs, for example) having different characteristics can be easily manufactured.

Furthermore, in the configuration in this exemplary embodiment, the strip-shaped first area each includes a plurality of crystalline grains stretching from one end of a shorter dimension of the strip-shaped first area to the other end (or across the full width of the strip-shaped first area). A device is thereby provided which has excellent ON-state current characteristics and less varied charge carrier mobility.

For example, in the thin-film substrate, the crystal grains included in the strip-shaped first area and in contact with the second area on the each side of the strip-shaped first area preferably account for at least 80% of the strip-shaped first area in length.

A device is thereby provided which has more excellent ON-state current characteristics and even less varied charge carrier mobility. The device has excellent uniformity.

For example, in the thin-film substrate, the average grain size of the crystal grains included in the strip-shaped first area may be 100 nm to 500 nm, inclusive, and the average grain size of the crystal grains included in the second area may be 30 nm or larger and smaller than 100 nm.

In this configuration, the grain structure provides a substrate with excellent inplane uniformity, so that resulting devices are less varied in characteristics. Furthermore, a TFT including the thin film which includes the first area where the average grain size is 100 nm to 500 nm, inclusive, has excellent ON-state current characteristics.

For example, the thin-film substrate may further include a plurality of the strip-shaped first areas, wherein pitches between the first areas may be approximately regular.

With this, the grain structure provides a substrate with excellent inplane uniformity, so that resulting devices are less varied in characteristics.

For example, in the thin-film substrate, each of the strip-shaped first areas may be formed to have a Raman shift peak having a full width at half maximum of 4.8 $cm^{-1}$ to 5.5 $cm^{-1}$, inclusive, in a Raman scattering spectrum measured using Raman spectroscopy.

With this, the formed crystalline thin film has grain structure including strip-shaped first areas where grain size is large.

For example, in the thin-film substrate, the regular pitch between adjacent ones of the strip-shaped first areas may be 2.0 μm or shorter.

With this, the strip-shaped first areas are formed at a regular pitch in the plane of the substrate and include crystal grains larger in size. Thus, TFTs including, as a channel layer, a crystalline thin film which includes such first areas have excellent ON-state current characteristics and excellent inplane uniformity.

According to an exemplary embodiment disclosed herein, a thin-film-device substrate includes: a substrate; a thin film located above the substrate and including a strip-shaped first area and a second area lying on each widthwise side of the strip-shaped first area, the second area including crystal grains having an average grain size smaller than an average grain size of crystal grains included in the strip-shaped first area; a first device having a channel which is at least a part of the strip-shaped first area and has a channel direction parallel to a lengthwise direction of the strip-shaped first area; and a second device having a channel which is at least a part of the strip-shaped first area and has a channel direction crossing the lengthwise direction of the strip-shaped first area, wherein the strip-shaped first area includes crystal grains in contact with the second area on the each widthwise side of the strip-shaped first area.

The thin-film device substrate in this exemplary embodiment has a thin film which includes: a strip-shaped first area where crystal grains are relatively large in size and a second area where crystal grains are relatively small in size; a first device having a channel which has a channel direction parallel to a lengthwise direction of the strip-shaped first area; and a second device having a channel which has a channel direction crossing the lengthwise direction of the strip-shaped first area. Thus, the thin-film-device substrate has two types of devices (TFTs, for example) having different characteristics.

Furthermore, in the configuration in this exemplary embodiment, the strip-shaped first area includes a plurality of crystalline grains stretching from one end of a shorter dimension of the strip-shaped first area to the other end (or across the full width of the strip-shaped first area). With this, a device is provided which has excellent ON-state current characteristics and less varied charge carrier mobility.

For example, in the thin-film-device substrate, the crystal grains included in the strip-shaped first area and in contact with the second area lying on the each widthwise side of the strip-shaped first area preferably account for at least 80% of the strip-shaped first area in length.

A device is thereby provided which has more excellent ON-state current characteristics and even less varied charge carrier mobility.

For example, in the thin-film-device substrate, the first device may be formed in a peripheral area above the substrate, and the second device may be formed in an inner area surrounded by the peripheral area on the substrate.

The first device, which has relatively high charge carrier mobility and excellent ON-state characteristics can be used as of a driver circuit in the peripheral area, and the second device, which has relatively low charge carrier mobility and OFF-state characteristics more excellent than the OFF-state characteristics of the first device can be used as a switching transistor in the pixel area. With this, the requirement for a device including devices different in current characteristics in a single substrate can be easily fulfilled.

For example, in the thin-film-device substrate, the substrate may have pixels arranged in matrix, the first device and the second device may be included in each of the pixels, the first device may be a transistor that drives the pixel including the first device, and the second device may be a switching transistor that selectively switches pixels to be driven among the pixels arranged in matrix.

The first device, which has relatively high charge carrier mobility and excellent ON-state characteristics can be used as of a driver circuit, and the second device, which has relatively low charge carrier mobility and OFF-state characteristics more excellent than the OFF-state characteristics of the first device can be used as a switching transistor. With this, the requirement for a device including devices different in current characteristics in a single pixel can be easily fulfilled.

For example, thin-film-device substrate may further include: a gate electrode of the first device and a gate electrode of the second device, the gate electrodes being formed above the substrate; a gate insulating film formed above the gate electrode of the first device and the gate electrode of the second device and facing the gate electrodes; a source electrode and a drain electrode which are located above the channel of the first device; and a source electrode and a drain electrode which are located above the channel of the second device, wherein a region where the source electrode and the drain electrode above the first device face each other may have a center line crossing a center line of a region where the source electrode and the drain electrode above the second device face each other.

The channel directions of the devices and the second device cross each other. With this, the TFTs included in a single substrate and different in current characteristics can be easily fulfilled.

For example, in the thin-film-device substrate, the average grain size of the crystal grains included in the strip-shaped first area may be 100 nm to 500 nm, inclusive, and the average grain size of the crystal grains included in the second area may be 30 nm or larger and smaller than 100 nm.

In this configuration, the grain structure provides a substrate with excellent inplane uniformity, so that resulting devices are less varied in characteristics. Furthermore, a TFT including the thin film which includes the first area where the average grain size is 100 nm to 500 nm, inclusive, has excellent ON-state current characteristics.

For example, the thin-film-device substrate may include a plurality of the strip-shaped first areas, wherein pitches between the first areas may be approximately regular.

With this, the grain structure provides a substrate with excellent inplane uniformity, so that resulting devices are less varied in characteristics.

For example, in the thin-film-device substrate, each of the strip-shaped first areas may be formed to have a Raman shift peak having a full width at half maximum of 4.8 $cm^{-1}$ to 5.5 $cm^{-1}$, inclusive, in a Raman scattering spectrum measured using Raman spectroscopy.

With this, the formed crystalline thin film has grain structure including strip-shaped first areas where grain size is large.

For example, in the thin-film-device substrate, the regular pitch between adjacent ones of the strip-shaped first areas may be 2.0 μm or shorter.

With this, the strip-shaped first areas formed at a regular pitch in the plane of the substrate and include crystal grains large in size. Thus, TFTs including, as a channel layer, a crystalline thin film which includes such first areas have excellent ON-state current characteristics and excellent inplane uniformity.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings.

The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

EMBODIMENTS

Hereinafter, certain exemplary embodiments are described in greater detail with reference to the accompanying Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

It should be noted that each of the drawings is a schematic drawing and therefore is not always accurate. It should also be noted that structural elements common among the drawings are denoted with the same reference signs.

Embodiment 1

First, a method of manufacturing a substrate with a thin film thereabove (thin-film substrate) according to Embodiment 1 is described below using FIG. 1. Specifically, this method is a method of forming a crystalline thin film such as a crystalline silicon thin film on a substrate. FIG. 1 shows cross-sectional views and plan views schematically illustrating steps of a method of manufacturing a substrate with a thin film thereabove according to Embodiment 1. In FIG. 1, (a2) to (e2) are the plan views, and (a1) to (e1) are the cross-sectional views through X-X in (a2) to (e2), respectively.

First, a substrate 10 is prepared as shown in (a1) and (a2) in FIG. 1 (step of preparing a substrate). The substrate 10 is, for example, a glass substrate. Here, the step of preparing a substrate may include washing of the glass substrate to remove extraneous matter from the surface of the glass substrate, etching of a surface of the glass substrate to remove alkali metal components from the surface, or forming of an undercoat layer (for example, a SiN film) on a surface of the glass substrate to prevent diffusion of alkali metal components in the glass substrate into a semiconductor film. These processes are mere examples of processes which may be included in the step of preparing a substrate.

Next, a thin film such as an amorphous semiconductor thin film is formed above the substrate 10 as shown in (b1) and (b2) in FIG. 1 (step of forming a thin film) For example, an amorphous silicon film is formed as an amorphous silicon thin film 13 above the substrate 10.

Next, a preparation is made to irradiate the amorphous silicon thin film 13 with light having a predetermined wavelength to crystallize the amorphous silicon thin film 13 as shown in (c1) and (c2) in FIG. 1. In Embodiment 1, the light having a predetermined wavelength is a laser light 30 having predetermined light intensity distribution as described later. The profile of the predetermined light intensity distribution of the laser light 30 on the surface of the amorphous silicon thin film 13 is substantially rectangular in shape and has a short axis in a direction along a scanning direction 40 of the laser light 30 and a major axis in a direction crossing the scanning direction 40. Thus, the projection of the laser light 30 on the surface of the amorphous silicon thin film 13 is also substantially rectangular in shape and has a minor axis in a direction along a scanning direction 40 of the laser light 30 and a major axis in a direction crossing the scanning direction 40. The curve shown above the laser light 30 in (c2) in FIG. 1 represents an example of intensity distribution of the laser light 30 along the short axis. For example, the curve is a Gaussian curve.

Next, relative scan with the laser light 30 is performed on the amorphous silicon thin film 13 in a scanning direction 40 at a predetermined speed while the amorphous silicon thin film 13 is being irradiated with the laser light 30 as shown in (c1) and (c2) to (d1) to (d2) in FIG. 1. The area of the amorphous silicon 13 irradiated with the laser light 30 is thereby crystallized, so that a crystalline silicon thin film 15 which is a polycrystalline silicon thin film including a crystallized area 50 is formed (step of laser light irradiation (or the step of crystallization)) More specifically, an area of the amorphous silicon thin film 13 irradiated with the laser light 30 is annealed to be crystallized by heat energy of the laser light 30, and in the region, the amorphous silicon thin film 13 turns into the crystalline silicon thin film 15. Subsequently, the irradiation of the amorphous silicon thin film 13 with the laser light 30 is continued up to a predetermined position of the amorphous silicon thin film 13, so that crystallization of a predetermined region of the amorphous silicon thin film 13 is completed as shown in (e1) and (e2) of FIG. 1.

In this step, irradiation of the laser light is conditioned so that first areas (bead lines) 51 and second areas 52 adjacent to the first areas 51 are formed in the crystallized area 50 as shown in (d1) and (d2) in FIG. 1. Each of the first regions 51 is a strip-shaped area extending in a direction crossing the direction of the relative scan using the laser light 30 (that is, the scanning direction 40). In (d2) and (e2) of FIG. 1, the strip-shaped first areas 51 and the second areas 52 are illustrated as curved zones lying along the Y axis. The shapes of the first areas 51 and the second areas 52 are not limited to this. The first areas 51 and the second areas 52 may have any shape extending in a direction crossing the scanning direction of the laser light 30. For example, the laser light 30 may extend straight. It should be noted that as shown in (d2) in FIG. 1, the "direction crossing the scanning direction of laser light" is not limited to the direction perpendicular to the X axis, which is the scanning direction of the laser light 30, or the direction along the Y axis. The "direction crossing the scanning direction of laser light" may be any direction crossing the X direction at an angle from the X axis toward the Y axis.

Figure 2:
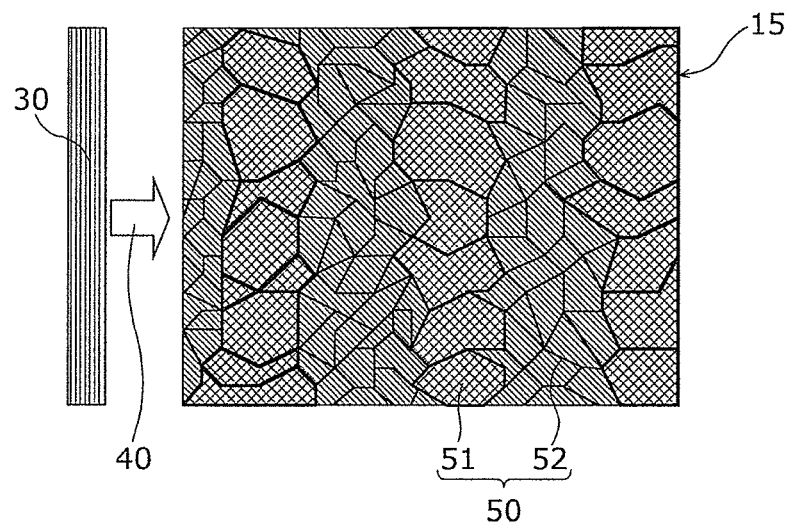
FIG. 2 is a plain view schematically illustrating grain structure of a crystallized area a crystalline silicon thin film in Embodiment 1.

The following describes grain structure of the crystallized area 50 in the crystalline silicon thin film 15 in detail using FIG. 2. FIG. 2 is a plain view schematically illustrating grain structure of the crystallized area 50 in the crystalline silicon thin film 15 in Embodiment 1, and is a magnified view of a region R indicated by a dashed line in (e2) in FIG. 1.

As shown in FIG. 2, the crystalline silicon thin film 15 includes crystal grains (crystal particles) having different grain sizes, and interfaces between the crystal grains form crystal grain boundaries. The crystallized area 50 of the crystalline silicon thin film 15 in Embodiment 1 has grain structure in which the first areas (strip-shaped first areas) 51 and the second areas (strip-shaped second areas) 52 coexist. The first areas 51 and the second areas 52 lie in a direction substantially perpendicular to the scanning direction 40 of the laser light 30. The direction substantially perpendicular to the scanning direction 40 of the laser light 30 is an example of the direction crossing the scanning direction 40 of the laser light 30.

Lying side by side with each other, the strip-shaped first areas 51 and the strip-shaped second areas 52, are disposed alternately in the scanning direction 40. The grain structure in which the first areas 51 and the second areas 52 coexist is provided in stripes substantially perpendicular to the scanning direction 40 by scanning the amorphous silicon thin film 13 with the laser light 30 in the scanning direction 40 at a predetermined speed in the step of crystallizing the amorphous silicon thin film 13.

Each of the first areas 51 is a band of crystal grains having relatively large average grain size. Each of the second areas 52 is a band of crystal grains having relatively small average grain size. In other words, the first areas 51 and the second areas 52 are formed so that the average grain size of silicon grains in the first areas 51 is larger than the average grain size of silicon grains in the second areas 52. In Embodiment 1, the average grain size of silicon grains in the first areas 51 is 100 nm and 500 nm, inclusive. The average grain size of silicon grains in the second areas 52 is 30 nm or larger and smaller than 100 nm. The second areas 52 may be an area of amorphous silicon including crystal grains having an average grain size smaller than the average grain size of crystal grains in the first areas 51. This aspect is useful to implement a switching TFT with excellent OFF-state characteristics, for example.

Here, charge carriers such as electrons and holes movable in the crystalline silicon thin film 15 pass through crystal grains (or through crystal grain boundaries between the crystal grains). However, since crystal grain boundaries are defects in a crystal structure, charge carriers are likely to be trapped at crystal grain boundaries. The larger the grain size is, the smaller the number of crystal grain boundaries is. Accordingly, increasing the grain size reduces the likelihood of trapping of charge carriers and thereby increases mobility of charge carriers. Thus, in the crystalline silicon thin film 15, charge carriers are more likely to move in the first areas 51 than in the second areas 52, where crystal grains are relatively small in grain size compared to the first areas 51. Thus, forming the first areas 51 in the crystalline silicon thin film 15 is a way to increase mobility of charge carriers.

Furthermore, as shown in FIG. 2, each of the strip-shaped first areas 51 includes crystals (crystal grains) in contact with the second areas 52 on both sides of the strip-shaped first area 51. In other words, each of the first areas 51 includes crystals having such a length substantially equal to the width of the first area 51 as to connect the adjacent second areas 52 at a high rate. Crystal grains included in each of the strip-shaped first areas 51 and in contact with the second area on both sides of the strip-shaped first area 51 account for at least 80% of the strip-shaped first area 51 in length.

This structure provides the first areas 51 with less variation. Furthermore, crystal grain boundaries in each of the first area 51 is so few that the TFTs have excellent ON-state current characteristics, and thus are less varied in charge carrier mobility as described later. This is described in detail later.

The strip-shaped first areas 51 in Embodiment 1 are formed to have substantially equal width as shown in FIG. 1 and FIG. 2. Optionally, a single first area 51 may be formed under a different condition for irradiation of the laser light. It is also possible to form a plurality of the first areas 51 so that the pitches between adjacent ones of the first areas 51 are regular as shown in FIG. 1 by conditioning the scanning speed of the laser light 30. In other words, it is possible to form the first areas 51 at a regular pitch.

Thus, in the method of manufacturing a substrate with a thin film thereabove according to Embodiment 1, the strip-shaped first areas 51 where crystal grains have large average grain size are formed by irradiating the amorphous silicon thin film 13 (amorphous silicon film) with laser light at a predetermined scanning speed.

More specifically, in Embodiment 1, laser light scanning on the amorphous silicon thin film 13 is performed across the whole area of the amorphous silicon thin film 13 at a speed which is higher than the scanning speed to form a crystalline silicon thin film of crystal grains having an average grain size of the second area 52. By doing this, the crystallized area 50 is formed such that the strip-shaped first area 51 where crystal grains are larger in size lies between the second areas 52. The following discusses how the strip-shaped first areas 51 are formed by laser irradiation at a higher scanning speed.

When the thin film is irradiated with laser at a higher scanning speed, the temperature profile along the direction of laser scanning at a point (location) on the thin film (silicon thin film) has a steep rise followed by a steep fall within a short time (that is, the point is heated to a high temperature and cooled down within a short time), compared to irradiation using a laser at a lower scanning speed. On the other hand, the temperature profile along a direction crossing the direction of laser scanning (in Embodiment 1, a direction substantially perpendicular to the scanning direction) is almost flat. Along the scanning direction, the temperature of the thin film rapidly rises and drops in a short time at a point as indicated by the steep temperature gradient. Along the direction crossing the scanning direction, since the temperature gradient is almost flat, the temperature of the thin film remains high for a time long enough for crystals to grow. In this manner, when laser scanning is performed at a higher speed, the above-described temperature gradient arises in a lateral direction on the substrate which is the direction of the laser scanning (hereinafter the direction is referred to as a lateral direction). Crystal growth in the thin film is promoted according to the temperature gradient, so that crystals grow along the lateral direction. As a result, the grain size of resulting crystal grains is large in the direction crossing the direction of laser scanning. When the laser scanning is performed at an even higher speed, temperature distribution and the rate of crystal growth are balanced so that crystals grow on the thin film more uniformly in the lateral direction.

As described above, when a temperature gradient having steepness at a certain level or above arises along the direction of laser scanning, crystal growth in a direction crossing the direction of laser scanning is promoted and a crystalline area where crystal grains have larger grain size is formed. In Embodiment 1, growth of crystalline silicon in the amorphous silicon thin film 13 is promoted in a direction substantially perpendicular to the direction of laser scanning, and the strip-shaped first areas 51 extending in a direction crossing the direction of laser scanning are formed as shown in FIG. 2. The volume of each silicon crystal grain expands with its growth. In Embodiment 1, since the growth of crystal grains is promoted more in the first areas 51 than in the second areas 52, the crystal grains in the first areas 51 expands more in volume than the crystal grains in the second areas 52. As a result, at boundaries between the crystal grains in the first areas 51, the crystal grains collide with each other and form lifts.

As described above, the strip-shaped first areas 51 are formed by scanning a silicon thin film to be crystallized with laser light at a higher speed. This is achieved as a result of earnest study by the inventors. Based on the result, the inventors found that the temperature gradient having steepness at a certain level or above along the direction of laser scanning enables formation of crystalline areas including crystal grains having larger grain size (the first areas 51) extending in a direction crossing the direction of laser scanning. The inventors also found that the temperature gradient which is steep enough to generate crystalline areas including crystal grains having larger grain size (the first areas 51) is generated by performing laser light irradiation for a shorter time, and consider that the temperature gradient can be steepened not only by performing fast laser light scanning but also by performing laser light scanning with laser light having intensity distribution with a shorter minor axis.

The strip-shaped first areas 51 are usually considered as a cause of variation in device characteristics. However, through further earnest study, the inventors found that the strip-shaped first areas 51 can be formed with regular intervals therebetween by laser irradiation conditioned in a manner as described later (for example, scanning with a laser at a conditioned speed). This provided the inventors with an idea for manufacturing devices with less variation.

Figure 3A:
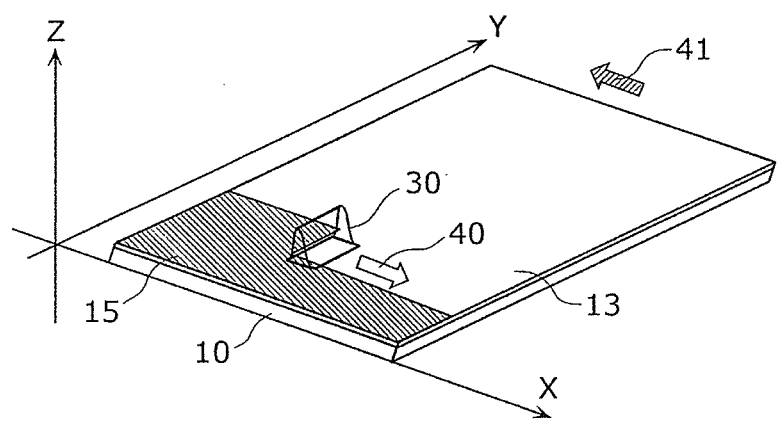
FIG. 3A is a perspective view schematically illustrating irradiation of an amorphous silicon thin film with laser light in the method of manufacturing a substrate with a thin film thereabove according to Embodiment 1.
Figure 3B:
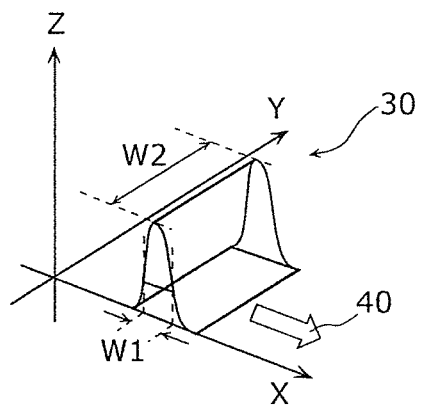
FIG. 3B shows intensity distribution of the laser light for use in a step of crystallization in the method of manufacturing a substrate with a thin film thereabove according to Embodiment 1.

Next, crystallization of the amorphous silicon thin film 13 is described using FIG. 3A and FIG. 3B. FIG. 3A is a perspective view schematically illustrating irradiation of the amorphous silicon thin film 13 with the laser light 30 in the method of manufacturing a substrate with a thin film thereabove according to Embodiment 1. FIG. 3B shows intensity distribution (beam profile) of the laser light 30 for use in the step of crystallization in the method of manufacturing a substrate with a thin film thereabove according to Embodiment 1.

As shown in FIG. 3A, when the amorphous silicon thin film 13 formed on the substrate 10 is crystallized using a laser, relative scan with the laser light 30 is performed on the amorphous silicon thin film 13 in a predetermined direction of relative scan. More specifically, the relative scan with the laser light 30 is performed on the amorphous silicon thin film 13 by moving at least one of the laser light 30 and the substrate 10 having the amorphous silicon thin film 13 formed thereabove. For example, in Embodiment 1, the laser light 30 is positionally fixed and the substrate 10 having the amorphous silicon thin film 13 formed thereabove is moved in a first direction 41 along the X axis so that the scanning with the laser light 30 is performed on the amorphous silicon thin film 13 in a scanning direction 40 (a second direction which is opposite to the first direction 41 along the X axis) as shown in FIG. 3A. The scanning along the X axis is repeatedly performed with shifting of the substrate 10 along the Y axis so that the whole area of the amorphous silicon thin film 13 can be irradiated with the laser light 30.

The laser for use in Embodiment 1 is preferably a continuous wave laser (CW laser). The CW laser emits laser light in continuous wave mode so that scanning can be performed faster than when using a pulsed laser. Furthermore, scanning using a CW laser is more than one digit faster than scanning using a pulsed laser, so that throughput can be easily increased.

The laser for use in Embodiment 1 preferably has a wavelength of 405 nm to 632 nm. Examples of applicable semiconductor lasers include a range of semiconductor lasers such as a semiconductor laser which emits blue laser light having a wavelength of 405 nm and a semiconductor laser which emits green laser light having a wavelength of 632 nm. Laser light having a wavelength of 308 nm emitted by an eximer laser is completely absorbed by the surface of the amorphous silicon film. As a result, crystal grain grows predominantly according to the temperature gradient in the thickness direction downward from the surface of the amorphous silicon film, so that it is difficult to form the first area 51 which results from lateral growth of crystal grains. Even when a pulsed laser is used, lateral crystallization in an amorphous silicon film can be promoted by laser light having a wavelength of 405 nm to 632 nm, which passes through the amorphous silicon film in its thickness direction. It is therefore presumable that the first area 51 can be easily formed by using the pulsed laser light having a wavelength of 405 nm to 632 nm.

As shown in FIG. 3B, the laser light for use in Embodiment 1 is shaped to have light intensity in Gaussian distribution along the minor axis (X axis) and in flat-top distribution along the major axis (Y axis) perpendicular to the minor axis. The beam minor axis width W1 in FIG. 3B is a full width at half maximum (FWHM) of the intensity distribution along the minor axis of the laser light 30. The beam major axis width W2 in FIG. 3B is a width of the intensity distribution along the major axis of the laser light (flat width). The laser light 30 thus configured is used for irradiation of the amorphous silicon thin film 13. In the irradiation, the laser light 30 is oriented so that the minor axis of intensity distribution is aligned with the direction of the scanning direction 40, and the amorphous silicon thin film 13 is scanned with the laser light 30 moving relative to the amorphous silicon thin film 13. Irradiation of the silicon thin film 13 with the laser light 30 having intensity distribution shown in FIG. 3B is performed in this manner, so that the projection of the laser light 30 on the silicon thin film 13 is substantially rectangular in shape.

In Embodiment 1, a CW laser used includes a semiconductor laser which emits green light having a wavelength of 532 nm. The beam minor axis width W1 is 32 μm and the beam major axis width W2 is 300 μm, that is, the beam major axis width W2 is set to be longer than the beam minor axis width W1.

In Embodiment 1, the amorphous silicon thin film 13 is irradiated with the laser light 30 shaped in this manner. Then, as described above, the inventors found that the grain structure of the resulting crystalline silicon thin film 15 depends on the time length of irradiation with the laser light 30 at each point (that is, the speed of scanning of the laser light 30 and the beam minor axis width W1 of the laser light 30).

Figure 4:
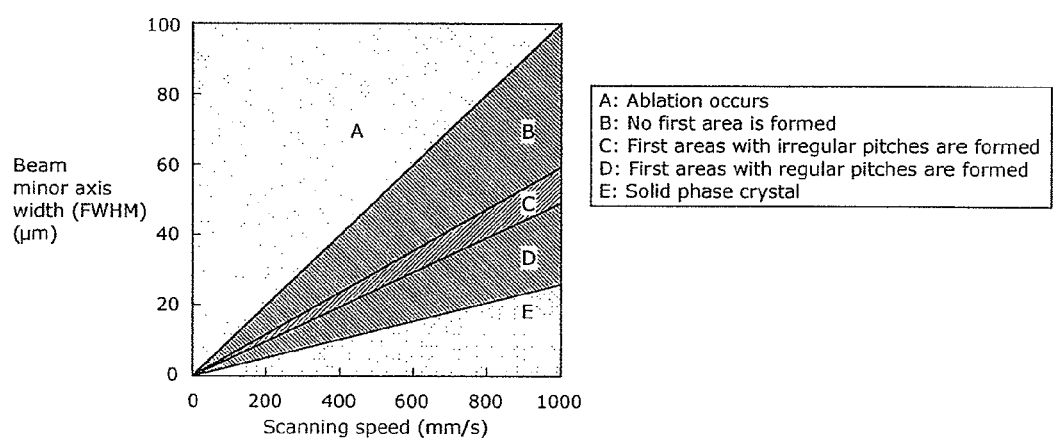
FIG. 4 shows a relationship between irradiation conditions (scanning speed and beam minor axis width) of the laser light and grain structure of the crystalline silicon thin film in the step of crystallization in the method of manufacturing a substrate with a thin film thereabove according to Embodiment 1.

The following describes a relationship between grain structure of the crystalline silicon thin film 15 and irradiation conditions of the laser light 30 using FIG. 4 and FIG. 5A to FIG. 5E. More specifically, the following describes irradiation conditions (laser scanning speed and the minor axis width of the laser light 30) for formation of strip-shaped crystalline areas (the first areas 51) in which crystal grains have large grain size. FIG. 4 shows a relationship between grain structure of the crystalline silicon thin film 15 and irradiation conditions (laser scanning speed and beam minor axis width) of the laser light 30 in the step of crystallization in the method of manufacturing a substrate with a thin film thereabove according to Embodiment 1. FIG. 5A to FIG. 5E schematically show grain structure of the crystalline silicon thin film 15 formed under different sets of the conditions of laser irradiation corresponding to the regions A to E in FIG. 4. Irradiation time of the laser light 30 is calculated by dividing the beam minor axis width W1 (FWHM) of the laser light 30 by scanning speed, that is, irradiation time=(minor axis width)/(scanning speed).

Figure 5A:
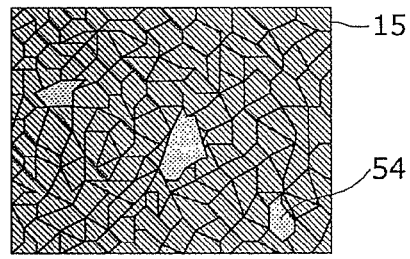
FIG. 5A schematically shows grain structure of a crystalline silicon thin film formed under the conditions of laser irradiation of the region A in FIG. 4.

When the amorphous silicon thin film 13, which is a film of amorphous silicon, is crystallized by irradiation with the laser light 30 under a set of conditions corresponding to the region A in FIG. 4, the amorphous silicon film has such ablation 54 as shown in FIG. 5A that the crystalline silicon thin film 15 sheds. A possible cause of the ablation 54 is an excessively large amount of irradiation energy working on the amorphous silicon thin film 13 because of excessively low speed of scanning with laser light or excessively wide beam minor axis width W1 of laser light.

Figure 5B:
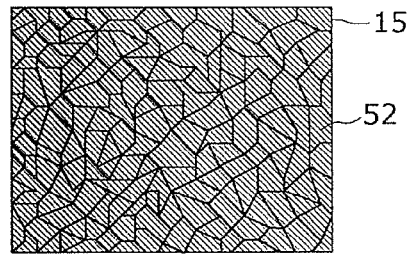
FIG. 5B schematically shows grain structure of a crystalline silicon thin film formed under the conditions of laser irradiation of the region B in FIG. 4.
Figure 5C:
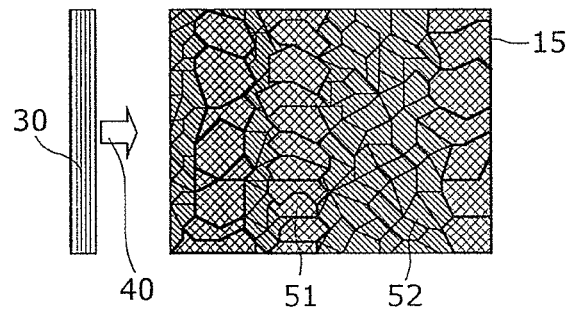
FIG. 5C schematically shows grain structure of a crystalline silicon thin film formed under the conditions of laser irradiation of the region C in FIG. 4.
Figure 5D:
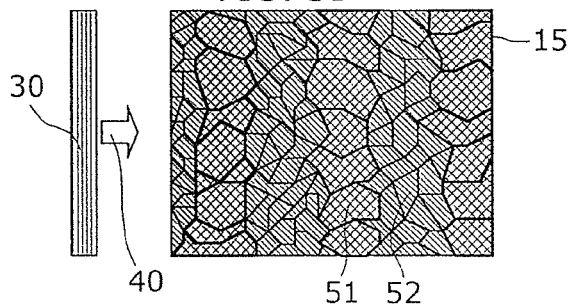
FIG. 5D schematically shows grain structure of a crystalline silicon thin film formed under the conditions of laser irradiation of the region D in FIG. 4.
Figure 5E:
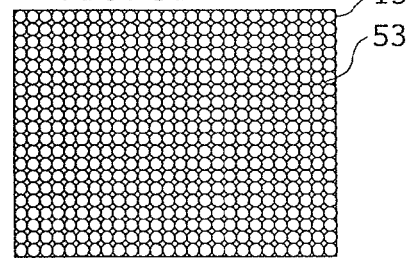
FIG. 5E schematically shows grain structure of a crystalline silicon thin film formed under the conditions of laser irradiation of the region E in FIG. 4.

When the amorphous silicon thin film 13, which is a film of amorphous silicon, is crystallized by irradiation with the laser light 30 under a set of conditions corresponding to the region E in FIG. 4, the crystalline silicon thin film 15 has SPC grain structure 53 which includes not molten silicon crystals but crystal grains formed by solid phase crystallization (SPC) and having small grain size as shown in FIG. 5E. A possible cause of the formation of the SPC grain structure 53 is an excessively small amount of irradiation energy working on the amorphous silicon thin film 13 because of excessively high speed of scanning with laser light or excessively narrow beam minor axis width W1 of the laser light. This causes the amorphous silicon thin film 13 to crystallize at the melting point of silicon, 1414° C., or below.

When the amorphous silicon thin film 13, which is a film of amorphous silicon, is crystallized by irradiation with the laser light 30 under sets of conditions corresponding to the regions B to D between the regions A and E in FIG. 4, the crystalline silicon thin film 15 has SPC grain structure including molten silicon crystals under any of the sets of conditions corresponding to the regions B to D. However, under the set of irradiation conditions corresponding to the region B where the scanning with laser light is relatively slow or the beam minor axis width W1 of the laser light is relatively wide, the resulting crystalline silicon thin film 15 has SPC grain structure in which no strip-shaped first area 51 is formed as shown in FIG. 5B. The crystalline silicon thin film 15 shown in FIG. 5B has grain structure only including silicon grains having an average grain size corresponding to the average grain size of the second area 52.

Under a set of irradiation conditions where the scanning with laser light is faster or the beam minor axis width W1 of the laser light is narrower than the set of irradiation conditions corresponding to the region B, the resulting crystalline silicon thin film 15 has grain structure in which the first areas 51 are present. The first areas 51 are strip-shaped regions extending substantially perpendicular to the scanning direction 40 of the laser light 30 and have an average grain size larger than the average grain size of the other regions (second areas 52).

More specifically, when irradiation of the laser light 30 is performed under the set of conditions corresponding to the region C in FIG. 4, the strip-shaped first areas 51 are formed at irregular pitches. When irradiation of the laser light 30 is performed under the set of conditions corresponding to the region D in FIG. 4, that is, under a set of irradiation conditions where the scanning with laser light is faster or the beam minor axis width W1 of the laser light is narrower than the irradiation conditions of the region C, the strip-shaped first areas 51 are formed at a regular pitch as shown in FIG. 5D.

Figure 6A:
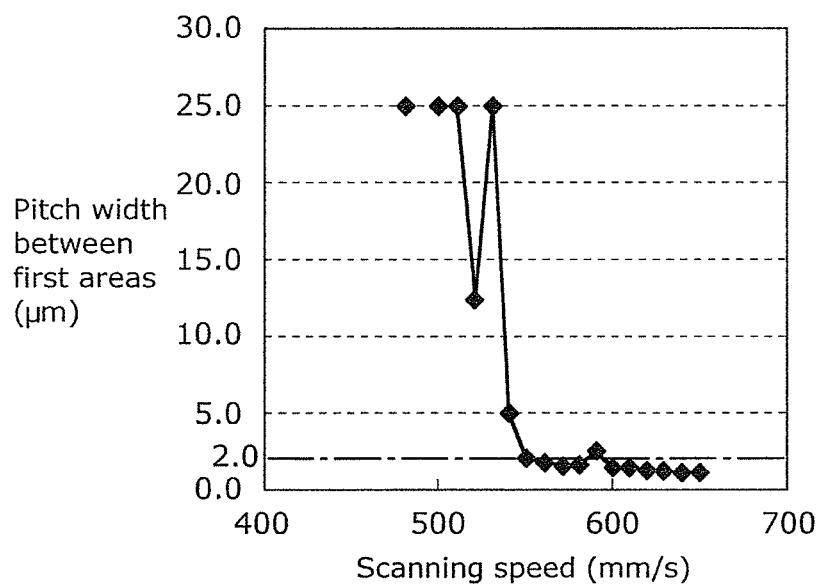
FIG. 6A shows relationship between the speed of scanning with laser light and pitches between first areas in the step of crystallization in the method of manufacturing a substrate with a thin film thereabove according to Embodiment 1.
Figure 6B:
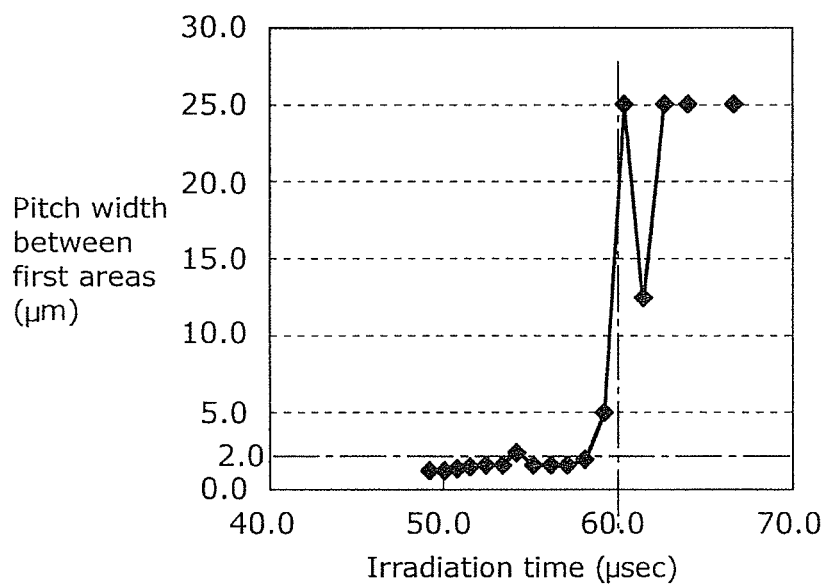
FIG. 6B shows relationship between irradiation time of laser light and pitches between first areas in the step of crystallization in the method of manufacturing a substrate with a thin film thereabove according to Embodiment 1.

The following describes a relationship between intervals (pitches) between adjacent ones of the first areas 51 and irradiation time of laser light using FIG. 6A and FIG. 6B. FIG. 6A shows pitches between first areas 51 against the scanning speed of the laser light 30 in the step of crystallization in the method of manufacturing a substrate with a thin film thereabove according to Embodiment 1. FIG. 6B shows pitches between the first areas 51 against the irradiation time of the laser light 30 converted from the scanning speed in FIG. 6A. More specifically, scanning speed is converted into laser irradiation time by dividing a beam minor axis width by a scanning speed, that is, dividing 32 (μm) by a scanning speed (mm/s). For example, a laser irradiation time of 60 μsec in FIG. 6B corresponds to a scanning speed of 533 mm/s in FIG. 6A. It should be noted that data shown in FIG. 6A and FIG. 6B is obtained by measuring pitches between the first areas 51 above a gate electrode having a width of 25 μm, and when the width of any of the strip-shaped first areas 51 is wider than the width of the gate electrode (25 μm), the pitch of the first area 51 is plotted as a width of 25 μm.

As can be seen from FIG. 6A and FIG. 6B, the pitch between adjacent ones of the first areas 51 almost saturates at 2.0 μm or narrower for scanning speeds of 550 mm/s and above, that is, irradiation times of approximately 58.2 μsec and shorter. In other words, adjacent ones of the first areas 51 have a regular pitch when formed to have pitches 2.0 μm or narrower. Thus, the first areas 51 are formed at a regular pitch therebetween as shown in FIG. 5D when the scanning speed and the beam minor axis width W1 are conditioned so that the irradiation time (minor axis width/scanning speed) of the laser light 30 is 60 μsec or shorter. Here, the pitch between adjacent one of the first areas 51 is a distance between the center of one of two adjacent first areas 51 and the center of the other first area 51.

As described above, by using the method of manufacturing a substrate with a thin film thereabove according to Embodiment 1, the crystalline thin film formed in the method has grain structure including regions which are formed in the same process and have different crystalline states. The crystalline thin film can be formed at higher speed without increase in input energy of the laser light 30, by crystallizing an amorphous thin film such as an amorphous silicon film under the set of conditions corresponding to the region C or the region D for irradiation of the laser light 30 in FIG. 4. To put it another way, it is possible to manufacture a substrate with a thin film thereabove having a crystalline thin film with the crystallized area 50 including the strip-shaped first areas 51 and the second areas 52 which are formed in the same process and have different average grain size. Thus, a single device having two types of devices (TFTs, for example) having different characteristics can be easily manufactured.

Furthermore, in Embodiment 1, the resulting crystalline thin film has the crystallized area where the grain size is large (the first area 51). Thus, for example, a TFT including the crystalline thin film according to Embodiment 1 as a channel layer is excellent in ON-state current characteristics with high charge carrier mobility.

Furthermore, in Embodiment 1, the crystallized area 50 including the strip-shaped first areas 51 is formed by performing high-speed scanning using a continuous wave laser light 30 for irradiation. This increases throughput compared to a method in which a pulsed laser is used for crystallization. More specifically, throughput of the method according to Embodiment 1 is high compared to a method in which the crystalline silicon thin film 15 having grain structure where only crystal grains having grain size corresponding to that of the second areas 52 are present is formed by laser crystallization.

Figure 7A:
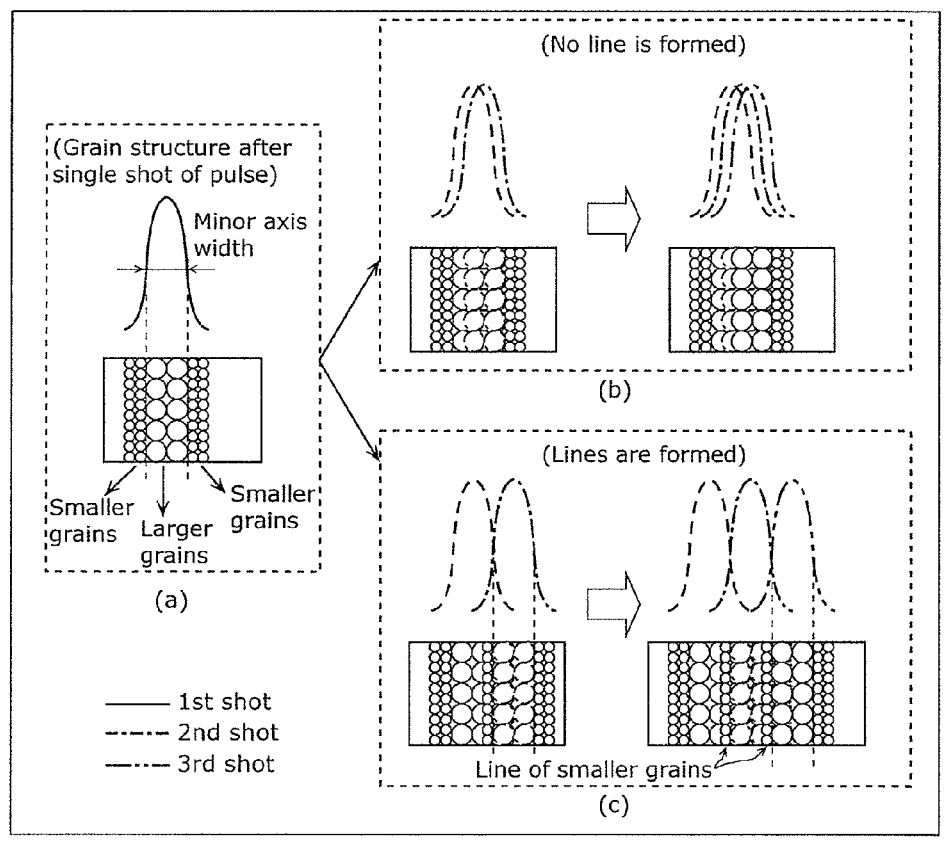
FIG. 7A shows crystallization of amorphous silicon thin film using a pulsed laser.

It should be noted that the crystalline method in which continuous wave laser light is used as in Embodiment 1 is different from the method in which a pulsed laser is used in grain structure of resulting strip-shaped areas (lines), specifically in grain size. In other words, when a thin film is crystallized using continuous wave laser light as in Embodiment 1, the temperature profile along a scanning direction has a sharp pulse at a point of the thin film as described above. Then, crystal growth is promoted along a temperature gradient so that crystals grow laterally to have larger grain size. In contrast, when a thin film is crystallized using pulsed laser light, each shot of which is emitted for an extremely short time (on the order of nanoseconds per shot), the shots are overlapped with each other so that the thin film can have uniform grain structure. Thus, in larger-grain areas, temperature gradient along the scanning direction is unlikely to be formed, and crystal grains do not grow laterally to have larger grain size as can be seen when continuous wave laser light is used. For example, a single shot of pulse forms grain structure in a thin film as shown in (a) in FIG. 7A. Thus, no strip-shaped (linear) area as shown in (b) in FIG. 7A is formed when scanning speed is so slow that energy is high and pitches between shots are narrow. When scanning speed is so fast that energy is small and pitches between shots are wide, strip-shaped (linear) areas are formed as shown in (c) in FIG. 7A. However, although such strip-shaped areas are formed, physical length of the grain size is very short even in the area where crystals are relatively large. Accordingly, strip-shaped areas crystals large in grain size as in Embodiment 1 cannot be formed using a pulsed laser.

In this manner, principle for crystal growth in a thin film when crystallization is performed using continuous wave laser light is different from when crystallization is performed using a pulsed laser. As a result of growth of large crystal grains in each of the strip-shaped first areas 51 in Embodiment 1, each of the strip-shaped first areas 51, which are larger-grain areas, includes a plurality of crystal grains in contact with the second areas 52 on both sides of the strip-shaped first area 51. In other words, the strip-shaped first area 51 includes a plurality of crystal grains stretching from one end of a shorter dimension of the strip-shaped first area 51 to the other end (or across the full width of the strip-shaped first area) (that is, the strip-shaped first area 51 includes a plurality of crystal grains connecting the adjacent second areas 52 having the strip-shaped first area 51 therebetween). In contrast, when a pulsed laser is used, the resulting larger-grain area does not include any crystalline grain stretching from one end to the other end of the strip-shaped first area 51 in the scanning direction (the width direction of the larger-grain area) because of insufficient crystal growth. As a result, the larger-grain area includes a plurality of crystal grains in the scanning direction. Furthermore, the minor axis width (FWHM) of the pulsed laser is on the order of micrometers or longer. Because of this, crystal growth is slow and the width of the strip-shaped area is inevitably large. Accordingly, crystal grains in contact with both sides of the strip-shaped area cannot be formed.

Figure 7B:
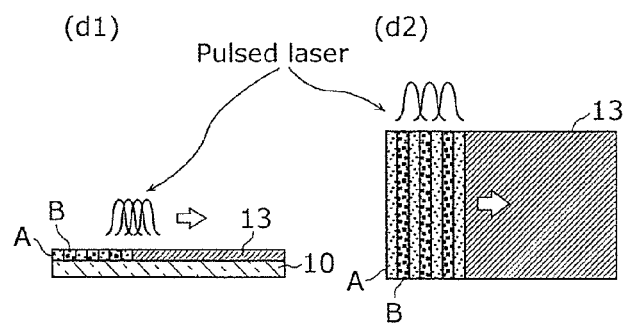
FIG. 7B schematically shows grain structure of the crystalline silicon thin film formed using a pulsed laser.

When scanning with a pulsed laser is performed at high speed, two types of crystalline areas (longitudinal area A and longitudinal area B) different in grain size may be alternately formed to extend in a direction crossing the direction of laser scanning as shown in FIG. 7B. This is disclosed in Patent Literature 2 (Japanese Unexamined Patent Application Publication No. 2008-016717). A possible principle for this formation is as follows. For the wavelength range of visible light, light absorptivity of a crystalline silicon thin film is one-tenth of that of an amorphous silicon film. Thus, when crystal grains formed by the first shot of a pulsed laser are irradiated with the pulsed laser again, the laser light is absorbed by the crystal grains so poorly that the grain structure formed as a result of the first shot is likely to remain unchanged. In this case, for the grain structure of an area B in FIG. 7B where the grain size is small in size, it is presumable that the grain structure of an area B includes fine crystals having a size of 30 nm or smaller formed in an edge area by the first shot. This causes a problem that the area A and the area B greatly differ in grain size. Furthermore, as shown in FIG. 5 of Patent Literature 2, the two types of crystalline longitudinal areas formed by irradiation with a pulsed laser are discontinuous in the direction crossing the direction of laser scanning, that is, the two types of longitudinal areas lack discontinuity. Charge carriers are trapped at the locations where the longitudinal areas are discontinued, and mobility of the charge carriers thereby deteriorates. The discontinuity of the crystalline areas also lowers uniformity of the thin film in characteristics. Patent Literature 2 points out in paragraphs [0048] to [0051] that presence of such longitudinal areas is unfavorable. In contrast, in Embodiment 1, the strip-shaped first areas 51 are formed to be continuous across the length along the major axis of the area irradiated with a laser (or the Y direction). In other words, each of the strip-shaped first area 51 is continuous across the length of the major axis of the laser light (along the Y direction). With this, crystalline silicon thin films thus formed are provided with increased mobility of charge carriers and are excellent in uniformity.

It is preferable in Embodiment 1 that the crystalline silicon thin film 15 be formed under a set of conditions for laser irradiation corresponding to the region D in FIG. 4. When the crystalline silicon thin film 15 is formed by crystallizing the amorphous silicon thin film 13 under a set of conditions corresponding to the region D, the strip-shaped first areas 51 are formed at a regular pitch. In the crystalline silicon thin film 15 in Embodiment 1, crystal grains in the first areas 51 have grain size not less than 100 nm and not more than 500 nm, and thus smaller than the size on the order of micrometers. In other words, the grain size of crystal grains in the first area 51 does not fall within large grain size. In this manner, the grain size of crystal grains in the strip-shaped first areas 51 is not less than 100 nm and not more than 500 nm, and the strip-shaped first areas 51 are formed at a regular pitch. Accordingly, the crystalline silicon thin film 15 has excellent uniformity over the substrate, and, in particular when a TFT array substrate for a large-screen display device, allows formation of devices with less variation in characteristics.

It is also preferable in Embodiment 1 that laser light for use in the step of crystallization be green laser light emitted from a CW laser for the following reasons.

When the crystalline silicon thin film 15 is formed using green laser light emitted from a CW laser, TFTs having the crystalline silicon thin film as a channel layer have high charge carrier mobility and therefore are excellent in ON-state current characteristics. On the other hand, a possible way to increase throughput is to use laser light having a longer beam major axis width to decrease the number of scans. However, when the beam major axis width of green laser light is large, it is difficult to secure uniformity in intensity of the laser light across the major axis because of light interference. Another possible way to increase throughput is to use a plurality of lasers to decrease the number of scans. However, this causes a problem of a large increase in initial cost due to increase in the number of lasers. In this manner, it has been difficult to increase throughput when green laser light is used for crystallization of thin films in conventional techniques. In contrast, in Embodiment 1, since a desired crystallized area can be formed by scanning a thin film with green light at higher speed, throughput can be still increased even when green laser light is used. Thus, the method of manufacturing a substrate having a thin film thereabove according to Embodiment 1 is appropriate for crystallization of thin films using green laser light.

Figure 8:
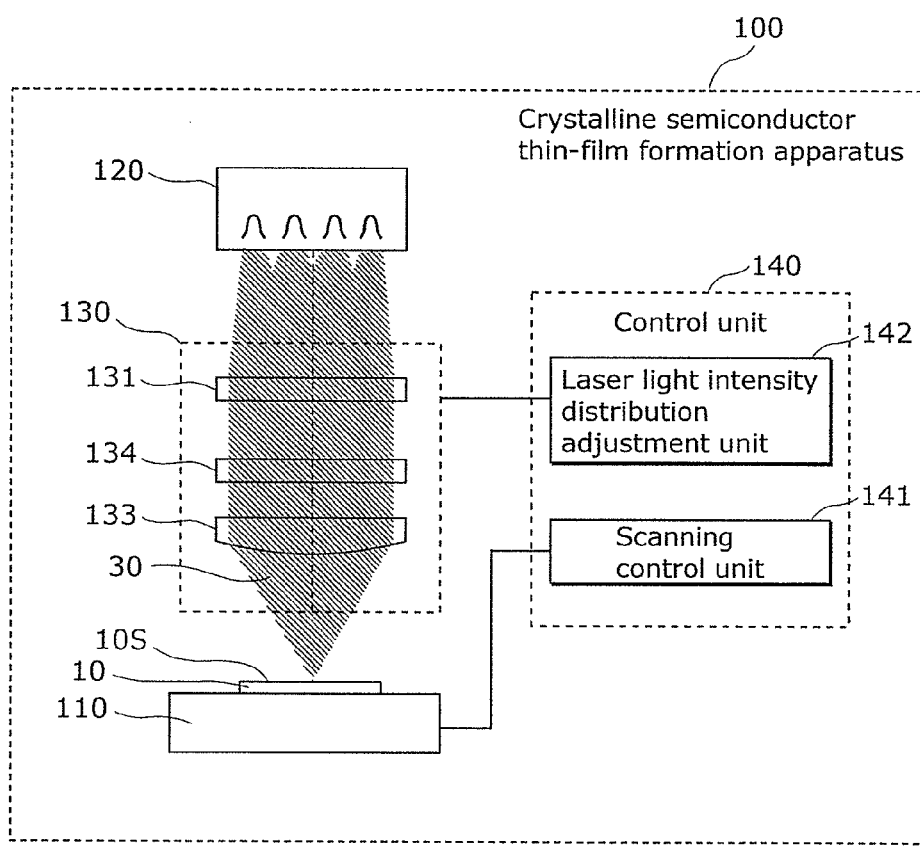
FIG. 8 shows a configuration of a crystalline semiconductor thin film formation apparatus according to Embodiment 1.

The following describes a crystalline semiconductor thin film formation apparatus 100 using FIG. 8. The crystalline semiconductor thin film formation apparatus 100 is used for the step of the crystallization in the method of manufacturing a substrate having a thin film thereabove according to Embodiment 1. FIG. 8 shows a configuration of the crystalline semiconductor thin film formation apparatus according to Embodiment 1. The crystalline semiconductor thin film formation apparatus 100 according to Embodiment 1 is an apparatus for crystallization of amorphous semiconductor thin films such as the amorphous silicon thin film 13 using the laser light 30 shaped to have light intensity distribution as shown in FIG. 3B.

As shown in FIG. 8, the crystalline semiconductor thin film formation apparatus 100 is an apparatus for crystallization of silicon thin films using CW laser light including a substrate support unit 110, a laser light oscillation unit 120, an optical system unit 130, and a control unit 140 including a scanning control unit 141 and a laser light intensity distribution adjustment unit 142.

The substrate support unit 110 is a stage which supports the substrate 10 on which an amorphous silicon thin film to be crystallized. The substrate 10 has a surface 10S to be irradiated with the laser light 30. On the surface 10S, for example, an amorphous silicon thin film is formed.

The laser light oscillation unit 120 is a laser light source which oscillates a laser light 30 for crystallization of amorphous silicon thin films. The laser light oscillation unit 120 in Embodiment 1 is provided with four semiconductor laser devices. Each of the semiconductor laser devices oscillates laser light having a monomodal, bilaterally symmetric light intensity distribution. Examples of the semiconductor laser devices include a semiconductor laser device which oscillates blue laser light or green laser light having a wavelength of 405 nm to 632 nm in continuous wave mode on the order of micro seconds, for example, 10 to 100 μsec.

The optical system unit 130 includes a plurality of beam shaping lenses and is configured to shape the laser light 30 oscillated from the laser light oscillation unit 120 into a beam having a predetermined intensity distribution and irradiate a predetermined area with the laser light 30. In Embodiment 1, the optical system unit 130 includes a homogenizer 131, a condenser lens 132, and a diffractive optical element (DOE) lens 133. The beam shaping lenses may include a lens which determines a beam profile along the major axis and a lens which determines a beam profile along the minor axis.

The scanning control unit 141 included in the control unit 140 controls the substrate support unit 110 or the optical system unit 130 so that scanning of the amorphous silicon thin film with the laser light 30 is performed by moving the laser light 30 relative to the silicon thin film. The scanning control unit 141 according to Embodiment 1 moves the substrate 10 by controlling the substrate support unit 110 to move it to a predetermined position as shown in FIG. 3A.

The laser light intensity distribution adjustment unit 142 shapes the laser light 30 to have a predetermined intensity distribution. The laser light intensity distribution adjustment unit 142 according to Embodiment 1 adjusts lenses included in the optical system unit 130 to form the laser light 30 oscillated by the laser light oscillation unit 120 so that the laser light 30 has the light intensity distribution shown in FIG. 3B.

The crystalline semiconductor thin film formation apparatus 100 may further include optical parts such as a mirror and a condenser lens, and may also include a beam profiler for measurement of a beam profile of laser light. When a beam profile is measured using a beam profiler, a result of the measurement can be used to adjust laser light for irradiation of silicon thin films to have a desired light intensity distribution using, for example, the laser light intensity distribution adjustment unit 142 adjusting the position of the lenses of the optical system unit 130.

The following describes a method of manufacturing TFTs according to Embodiment 1. The method of manufacturing the TFTs according to Embodiment 1 includes: preparing a substrate (step of preparing a substrate); forming a gate electrode above the substrate (step of forming a gate electrode); forming a gate insulating film above the substrate (step of forming a gate insulating film); forming a source electrode and a drain electrode above the substrate (step of forming a source electrode and a drain electrode); forming a silicon thin film above the substrate (step of forming a silicon thin film); and crystallizing the silicon thin film formed on the substrate, by irradiating the silicon thin film with laser light (step of crystallizing a silicon thin film).

The step of crystallizing a silicon thin film in the method of manufacturing TFTs according to Embodiment 1 can be performed in the same manner as the above-described method of manufacturing a substrate with a thin film formed thereabove. The crystalline silicon thin film obtained in the step of crystallizing a silicon thin film is to function as a channel layer of TFTs.

TFTs are grouped into two types in construction: bottom-gate type and top-gate type. The bottom-gate type TFT includes a stack of a gate electrode, a gate insulating film, and a channel layer (silicon semiconductor film), from bottom to top. On the other hand, the top-gate type TFT includes a stack of a channel layer, a gate insulating film, and a gate electrode, from bottom to top. Hereinafter, a method of manufacturing bottom-gate type TFTs and a method of manufacturing top-gate type TFTs will be concretely described with reference to the drawings.

Figure 9:
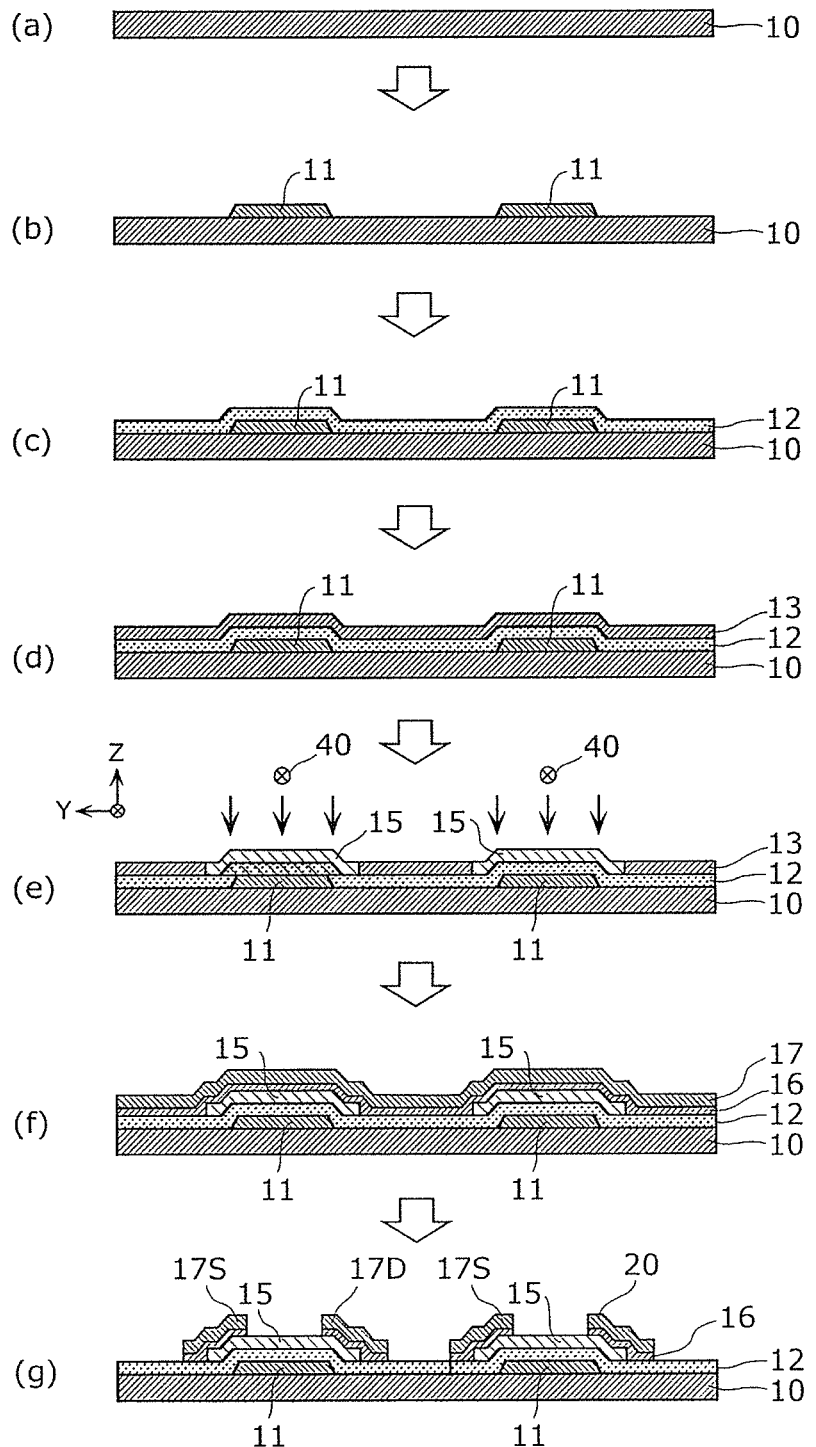
FIG. 9(a)-(g) shows cross-sectional views schematically illustrating steps of a method of manufacturing bottom-gate type channel-etched TFTs according to Embodiment 1.

The following describes a method of manufacturing bottom-gate type channel-etched TFTs using FIG. 9. FIG. 9 shows cross-sectional views schematically illustrating steps of a method of manufacturing bottom-gate type channel-etched TFTs according to Embodiment 1.

First, a substrate 10 is prepared as shown in (a) in FIG. 9 (step of preparing a substrate). The substrate 10 is, for example, a glass substrate. In the step of preparing a substrate, an undercoat film which is an insulating film such as a film of silicon oxide or a film of silicon nitride may be formed on the substrate 10.

Next, gate electrodes 11 are formed in a pattern above the substrate 10 as shown in (b) in FIG. 9 using a patterning method (step of forming a gate electrode). For example, a gate metal film having a thickness of 10 to 500 nm is formed all over the substrate 10 by sputtering. The gate metal film is a film of molybdenum (Mo), tungsten (W), copper (Cu), silver (Ag), aluminum (Al), chrome (Cr), titanium (Ti), tantalum (Ta), or an alloy of any of them. The gate metal film is then processed by photolithography and wet-etching so that a pattern is made on the gate metal film and the gate electrodes 11 having a predetermined shape are formed.

Next, a gate insulating film 12 is formed above the substrate 10 as shown in (c) in FIG. 9 (step of forming a gate insulating film). For example, a gate insulating film 12 having a thickness of 10 to 500 nm is formed all over the substrate 10 by plasma CVD, covering over the gate electrode 11. The gate insulating film 12 is an insulating film such as a silicon oxide (SiO) film, a silicon nitride ($SiN_x$) film, or a silicon oxynitride (SiON) film. Optionally, the gate insulating film may have single-layer structure or laminated structure.

Next, an amorphous silicon thin film 13 is formed above the substrate 10 as shown in (d) in FIG. 9 (step of forming a silicon thin film). For example, an amorphous silicon film having a thickness of 10 to 200 nm is formed as an amorphous silicon thin film 13 on the gate insulating film 12 by plasma CVD.

Next, a predetermined area of the amorphous silicon thin film 13 is crystallized into the crystalline silicon thin film 15 as shown in (e) in FIG. 9 through relative scan with laser light which is performed on the amorphous silicon thin film 13 in a scanning direction 40 while the predetermined area of the amorphous silicon thin film 13 is being irradiated with the laser light 30 (step of crystallizing a silicon thin film). The step of crystallizing a silicon thin film is performed in the same manner as the step of crystallization in the above-described method of manufacturing a substrate with a thin film formed thereabove.

More specifically, the amorphous silicon thin film 13 is irradiated with laser light by scanning the amorphous silicon thin film 13 with the laser light in the X-axis direction (the direction perpendicular to the plane of the drawing) under a set of irradiation conditions corresponding to the region C or the region D shown in FIG. 4. By doing this, strip-shaped first areas extending in a direction approximately perpendicular to the scanning direction 40 are formed on the crystalline silicon thin film 15. In (e) in FIG. 9, part of the amorphous silicon thin film 13 is crystallized. Alternatively, the whole of the amorphous silicon thin film 13 may be crystallized.

Next, photolithography and wet etching are performed to selectively form, into respective patterns, the amorphous part of the silicon thin film 13 not irradiated with laser light and the crystalline silicon thin film 15 crystallized by laser irradiation, so that the amorphous silicon thin film 13 is removed, and the crystalline silicon thin film 15 is formed into an insular-shaped pattern.

Next, as shown in (f) in FIG. 9, the amorphous silicon film is doped with dopant such as phosphor when a film is formed by plasma CVD so that an $n^+$ layer doped with dopant having a thickness of 10 to 100 nm. The $n^+$ layer is a contact layer 16. Next, a source-drain metal film 17 having three-layer structure of MoW, Al, and MoW are formed on the contact layer 16 as shown in (f) in FIG. 9 by sputtering.

Next, a source electrode 17S and a drain electrode 17D are formed in a pattern above the substrate 10 by photolithography and wet etching as shown in (g) in FIG. 9 (step of forming a source electrode and drain electrode). For example, an opposite pair of the source electrode 17S and the drain electrode 17D is formed in a pattern by performing photolithography and wet etching on the source-drain metal film 17.

Next, dry etching is performed to divide the contact layer 16 using a resist as it is for forming the source-drain metal film 17 in a pattern (or without using the resist) to make an opposite pair in the contact layer 16. Bottom-gate type TFTs are thus made as shown in (g) in FIG. 9. A passivation film which is a silicon nitride film covering over the TFTs may further be formed by plasma CVD.

As described above, in the method of manufacturing bottom-gate TFTs according to Embodiment 1, laser light irradiation for crystallization of a silicon thin film to be a channel layer is conditioned by controlling beam minor axis width and scanning speed according to a set of conditions corresponding to the region C or D of FIG. 4, so that the crystalline silicon thin film 15 is formed to have grain structure including second areas 52 and strip-shaped first areas 51 where crystal grains have a larger average grain size than in the second areas 52. Thus, the crystalline silicon thin film 15 including crystal grains having increased size can be formed by performing faster scanning with a laser which is not increased in output energy. This enables manufacture of TFTs excellent in ON-state current characteristics at a higher throughput.

The technique in Embodiment 1 as described above using the method of manufacturing channel-etched TFTs as an example is also applicable to the method of manufacturing channel-stopper type (channel protection type) TFTs, in which a channel protection film is formed on the crystalline silicon thin film 15.

It is preferable in Embodiment 1 that the crystalline silicon thin film 15 be formed under a set of conditions for laser irradiation corresponding to the region D. When the crystalline silicon thin film 15 is formed by crystallizing the amorphous silicon thin film 13 under a set of conditions corresponding to the region D, the strip-shaped first areas 51 are formed at a regular pitch. This enables manufacture of a TFT array including TFTs having TFT characteristics excellent in inplane uniformity.

Figure 10:
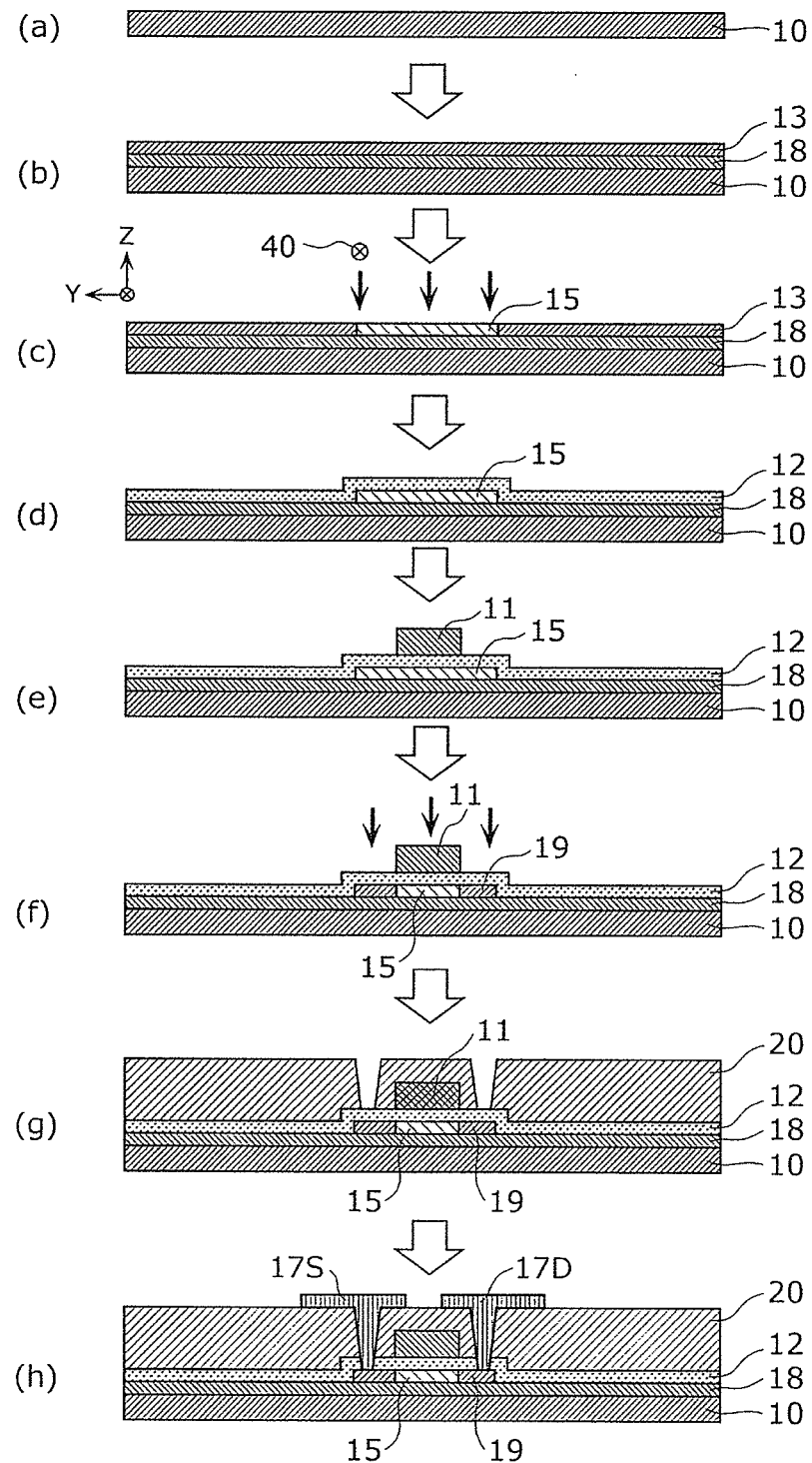
FIG. 10(a)-(h) shows cross-sectional views schematically illustrating steps of a method of manufacturing top-gate type TFTs according to Embodiment 1.

The following describes the method of manufacturing a top-gate type TFT according to Embodiment 1 using FIG. 10. FIG. 10 shows cross-sectional views schematically illustrating steps of the method of manufacturing top-gate type TFTs according to Embodiment 1.

First, a substrate 10 is prepared as shown in (a) in FIG. 10 (step of preparing a substrate). The substrate 10 is, for example, a glass substrate.

Next, an undercoat film 18 which is an insulating film such as a film of silicon oxide or a film of silicon nitride is formed on the substrate 10 as shown in (b) in FIG. 10. Next, an amorphous silicon thin film 13 is formed above the substrate 10 as shown in (b) in FIG. 10 (step of forming a silicon thin film). For example, an amorphous silicon film is formed as an amorphous silicon thin film 13 on the undercoat film 18 by plasma CVD.

Next, a predetermined area of the amorphous silicon thin film 13 is crystallized into the crystalline silicon thin film 15 as shown in (c) in FIG. 10 through relative scan with laser light which is performed on the amorphous silicon thin film 13 in a scanning direction 40 while the predetermined area of the amorphous silicon thin film 13 is being irradiated with the laser light (step of crystallizing a silicon thin film). The step of crystallizing a silicon thin film is performed in the same manner as the step of crystallization in the above-described method of manufacturing a substrate with a thin film formed thereabove in Embodiment 1.

More specifically, the amorphous silicon thin film 13 is irradiated with laser light by scanning the amorphous silicon thin film 13 with the laser light in the X-axis direction (the direction perpendicular to the plane of the drawing) under a set of conditions for laser irradiation corresponding to the region C or the region D shown in FIG. 4. By doing this, strip-shaped first areas extending in a direction approximately perpendicular to the scanning direction 40 are formed on the crystalline silicon thin film 15. In (c) in FIG. 10, part of the amorphous silicon thin film 13 is crystallized. Alternatively, the whole of the amorphous silicon thin film 13 may be crystallized.

Next, photolithography and wet etching are performed to selectively form, into respective patterns, the amorphous part of the silicon thin film 13 not irradiated with laser light and the crystalline silicon thin film 15 crystallized by laser irradiation, so that the amorphous silicon thin film 13 is removed, and the crystalline silicon thin film 15 is formed into an insular-shaped pattern as shown in (d) in FIG. 10.

Next, a gate insulating film 12 is formed above the substrate 10 as shown in (d) in FIG. 10 (step of forming a gate insulating film). For example, the gate insulating film 12 which is an insulating film such as a film of silicon dioxide is formed all over the substrate 10 by plasma CVD, covering over the insular-shaped crystalline silicon thin film 15.

Next, gate electrodes 11 are formed in a pattern above the substrate 10 as shown in (e) in FIG. 10 (step of forming a gate electrode). For example, a gate metal film of molybdenum-tungsten is formed all over the substrate 10 by sputtering. Next, the gate metal film is formed in a pattern by photolithography and wet etching, so that the gate electrodes 11 having a predetermined shape are formed above the crystalline silicon thin film 15 with the gate insulating film 12 disposed therebetween.

Next, as shown in (f) in FIG. 10, each end part of the crystalline silicon thin film 15 is lightly doped with dopant using the gate electrodes 11 as a mask, so that lightly doped drain (LDD) areas 19 are formed.

Next, as shown in (g) in FIG. 10, a passivation film 20 is formed above the substrate 10. For example, the passivation film 20 which is an insulating film such as a film of silicon dioxide is formed all over the substrate 10 by plasma CVD, covering over the gate electrodes 11 and the gate insulating film 12. Next, contact holes are opened in the passivation film 20 so that the LDD areas 19 are exposed in the contact holes as shown in (g) in FIG. 10.

Next, as shown in (h) in FIG. 10, a pair of a source electrode 17S and a drain electrode 17D is formed on and in the passivation film 20, filling the contact holes in the passivation film 20. A top-gate type TFT is thus made as shown (h) in FIG. 10.

As described above, in the method of manufacturing top-gate TFTs according to Embodiment 1, laser light irradiation for crystallization of a silicon thin film to be a channel layer is conditioned by controlling beam minor axis width and scanning speed according to a set of conditions corresponding to the region C or D of FIG. 4, so that the crystalline silicon thin film 15 is formed to have grain structure including second areas 52 and strip-shaped first areas 51 where crystal grains have a larger average grain size than in the second areas 52. Thus, the crystalline silicon thin film 15 including crystal grains having increased size can be formed by performing faster scanning with a laser which is not increased in output energy. This enables manufacture of TFTs excellent in ON-state current characteristics at a higher throughput.

It is preferable in Embodiment 1 that the crystalline silicon thin film 15 be formed under a set of conditions for laser irradiation corresponding to the region D. When the crystalline silicon thin film 15 is formed by crystallizing the amorphous silicon thin film 13 under a set of conditions corresponding to the region D, the strip-shaped first areas 51 are formed at a regular pitch. This enables manufacture of a TFT array including TFTs having TFT characteristics excellent in inplane uniformity.

Examples of Embodiment 1

The following describes examples of the method of manufacturing a substrate having a thin film thereabove, the thin-film substrate, the method of manufacturing a TFT, and the TFT according to Embodiment 1 with reference to FIG. 9. The examples described below using a method of manufacturing a bottom-gate type TFT are also applicable to a method of manufacturing a top-gate type TFT.

First, as shown in (a) in FIG. 9, a glass substrate is prepared as the substrate 10, and an undercoat film which is a silicon oxide insulating film having a thickness of 500 nm is formed on the glass substrate by plasma CVD. Next, a metal film of molybdenum-tungsten (MoW) having a thickness of 50 nm is deposited on the undercoat film by sputtering, and the metal film is formed in a pattern, so that the gate electrodes 11 are formed as shown in (b) in FIG. 9. Next, the gate insulating film 12 which is a stacked film of a 70-nm thick silicon oxide film and an 85-nm thick silicon nitride film is formed over the gate electrode 11 by plasma CVD as shown in (c) in FIG. 9, and then the amorphous silicon thin film 13 having a thickness of 50 nm is continuously formed as shown in (d) in FIG. 9. Next, dehydrogenation treatment is performed on the amorphous silicon film at 500° C. so that hydrogen content in the amorphous silicon film decreases to 3.0 atomic percent or below.

Next, the substrate 10 with the amorphous silicon thin film 13 thereabove is fixed onto the substrate support unit (stage 110) of the crystalline semiconductor thin film formation apparatus 100 shown in FIG. 8, and then the amorphous silicon thin film 13 is irradiated with a laser so that the amorphous silicon thin film 13 is crystallized and thereby the crystalline silicon thin film 15 is formed.

The inventors made two types of substrates by performing laser irradiation under different sets of conditions. Specifically, the laser used had a fixed beam minor axis width W1 (FWHM) of 32.0 μm and varied power densities, and the substrate support unit 110 was moved at varied scanning speeds. One of the substrates was made under a set of conditions for laser irradiation shown in Embodiment 1. Specifically, the power density was 70.0 kW/cm$^2$ and the scanning speed of the substrate support unit 110 was 400 to 580 mm/s. The other of the substrates was made under a set of conditions for laser irradiation in a comparative example. Specifically, the power density was 60.0 kW/cm$^2$, and the scanning speed of the stage was 340 to 480 mm/s.

Figure 11:
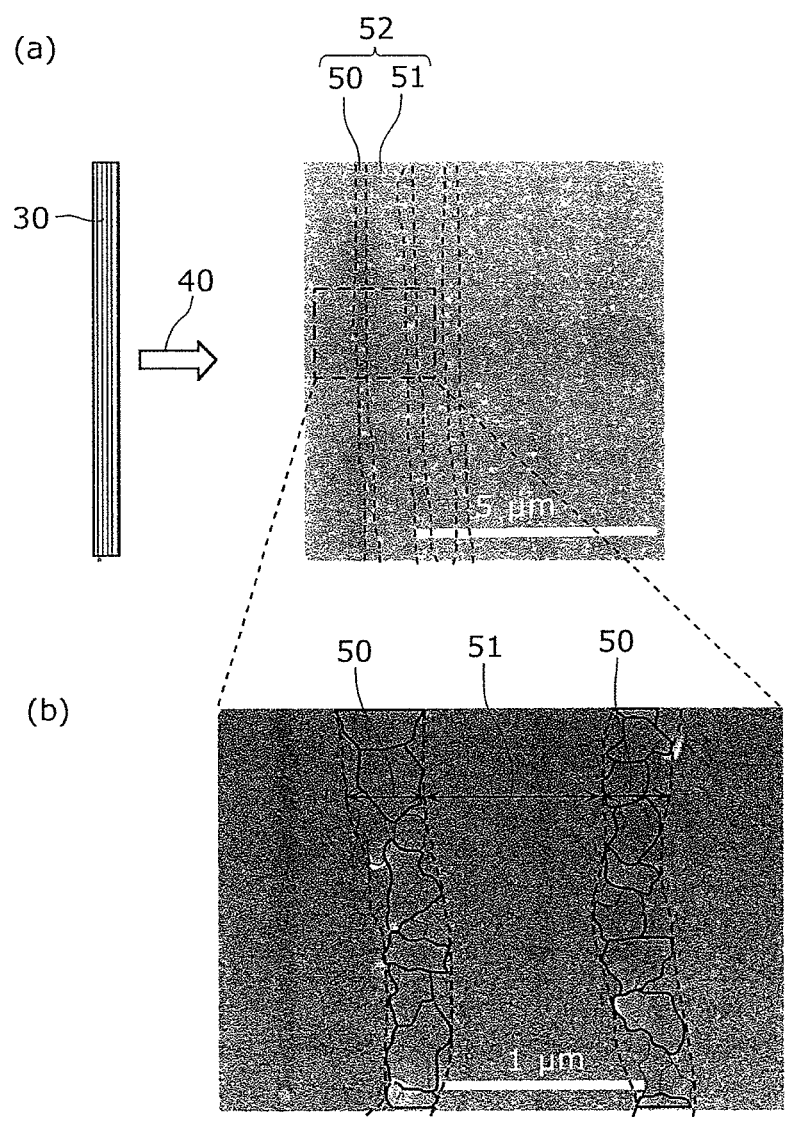
FIGS. 11(a) and (b) shows scanning electron microscope (SEM) images of a grain structure of a crystalline silicon thin film formed under a set of conditions for laser irradiation in Embodiment 1.
Figure 12:
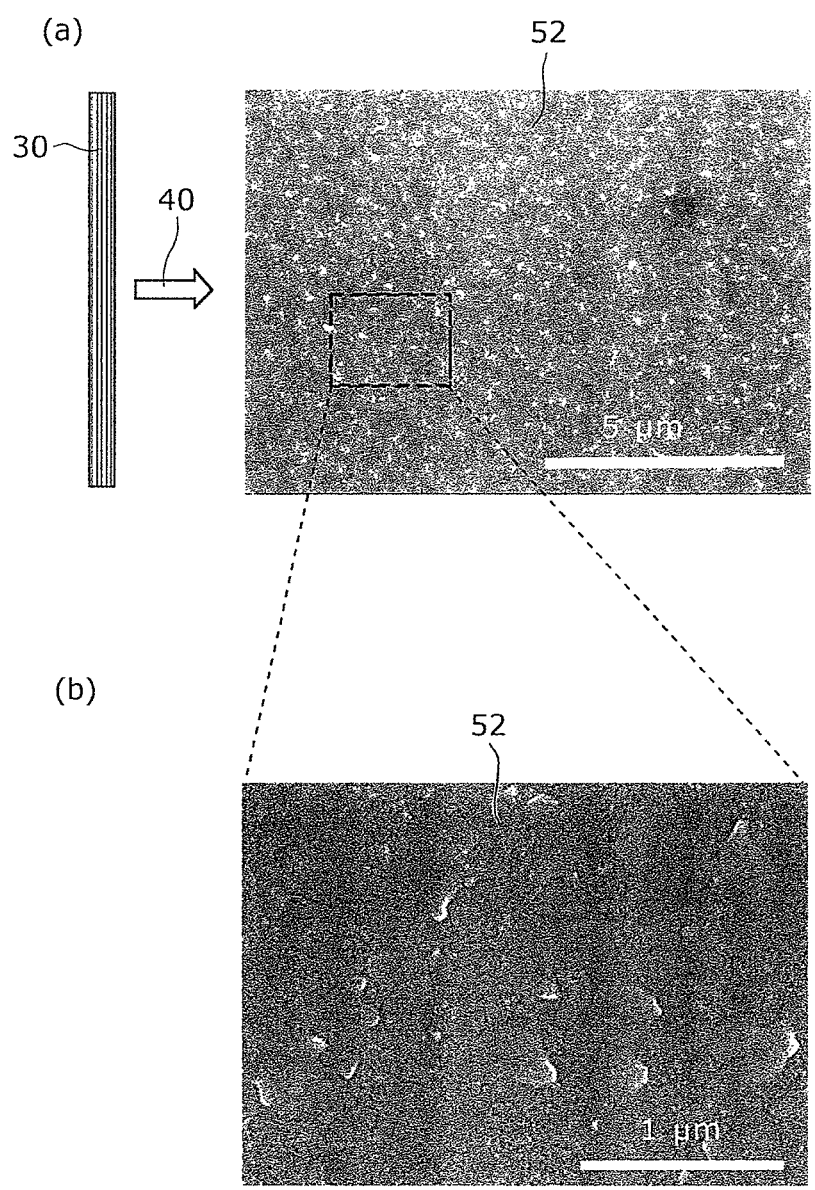
FIGS. 12(a) and (b) shows scanning electron microscope (SEM) images of a grain structure of a crystalline silicon thin film formed under a set of conditions for laser irradiation in a comparative example.

The following describes the grain structure of the crystalline silicon thin films 15 formed by laser irradiation under the two sets of conditions, using FIG. 11 and FIG. 12.

The drawings shown in (a) and (b) in FIG. 11 are plane scanning electron microscope (SEM) images of the grain structure of the crystalline silicon thin film 15 formed under a set of conditions for laser irradiation in Embodiment 1 (a power density of 70.0 kW/cm$^2$, a stage scanning speed of 580 mm/s, an irradiation time of 49.0 μsec, and an input energy density of 3.5 J/cm$^2$). The drawing in (b) is a magnified view of the region inside the dashed-line box in the drawing in (a) in FIG. 11.

As shown in (a) and (b) in FIG. 11, the crystalline silicon thin film 15 formed under the set of conditions for laser irradiation in Embodiment 1 includes both the strip-shaped first areas 51 and the second areas 52. In (b) in FIG. 11, the whitish spots are lifts formed as a result of collision between silicon grains in the first areas 51 as a result of volume expansion of the silicon grains.

In Embodiment 1, the average grain size of silicon grains in the first areas 51 is 440 nm. The average grain size of silicon grains in the second areas 52 is 80 nm. The pitches between the first areas 51 were uniformly 1.8 μm.

The drawings shown in (a) and (b) in FIG. 12 are plane SEM images of the grain structure of the crystalline silicon thin film 15 formed under a set of conditions for laser irradiation in the comparative example (a power density of 60.0 kW/cm$^2$, a stage scanning speed of 400 mm/s, an irradiation time of 80.0 μsec, and an input energy density of 4.8 J/cm$^2$). The drawing in (b) is a magnified view of the region inside the dashed-line box in the drawing in (a) in FIG. 12.

As shown in (a) and (b) in FIG. 12, the crystalline silicon thin film 15 formed by laser irradiation as long as 60.0 μsec or longer under the set of conditions for laser irradiation in the comparative example includes no strip-shaped first area 51 but only the second area 52. The average grain size of silicon grains in the second areas 52 is 75 nm.

In this manner, as can be seen from the results shown in FIG. 11 and FIG. 12, irradiation as shown in FIG. 11 is performed by faster scanning with a laser having a low input energy density under the set of conditions for laser irradiation according to Embodiment 1, and still enables making of the strip-shaped first areas 51 having an average grain size of 100 to 500 nm with pitches of 2.0 μm or narrower between the strip-shaped first areas 51.

Furthermore, as shown in (b) in FIG. 11, each of the strip-shaped first areas 51 includes crystal grains in contact with the second areas 52 on both sides of the strip-shaped first area 51. In other words, the strip-shaped first area 51 includes a plurality of crystal grains stretching from one end of a shorter dimension of the strip-shaped first area 51 to the other end (or across the full width of the strip-shaped first area 51) (that is, the strip-shaped first area 51 includes a plurality of crystal grains connecting the adjacent second areas 52 having the strip-shaped first area 51 therebetween).

The fewer crystal grain boundaries (traps) in a TFT are, the higher the ON-state current is. Thus, a TFT including the crystalline silicon thin film 15 shown in the present example as a channel layer has excellent ON-state current characteristics. It should be noted that when crystallized using a pulsed laser, each of the larger-grain areas includes a plurality of crystal grains lying side by side in the scanning direction, and thus has more grain boundaries (traps) in the scanning direction as described above. Accordingly, a TFT including a crystalline silicon thin film obtained by crystallization using a pulsed laser is not as excellent in ON-state current characteristics as TFT including a crystalline silicon thin film obtained by crystallization using continuous wave laser light.

Crystal grains included in each of the strip-shaped first areas 51 and in contact with the second area on both sides of the strip-shaped first area 51 account for at least 80% of the strip-shaped first area 51 in length. In other words, at least 80% of the crystal grains across a longitudinal direction of each of the strip-shaped first area 51 grows laterally. Furthermore, a majority of the crystal grains in each of the first areas 51 connects adjacent ones of the second areas 52 so that the TFTs have excellent ON-state current characteristics and thus have less variation in charge carrier mobility as described later.

Furthermore, each of the larger-grain areas crystallized using a pulsed laser includes a plurality of crystal grains lying side by side in the scanning direction. Because of this, the amount of current may vary depending on a current path in each larger-grain area. This may cause variation in ON-state characteristics of the larger-grain area between transistors on a surface of a substrate.

In contrast, since crystal grains in a larger-grain area stretches from one end to the other in Embodiment 1, such variation due to variation in the number of crystal grain boundaries in each larger-grain area is small compared to the case of a pulsed laser. Thus, variation in ON-state current across the surface can be reduced.

Figure 13A:
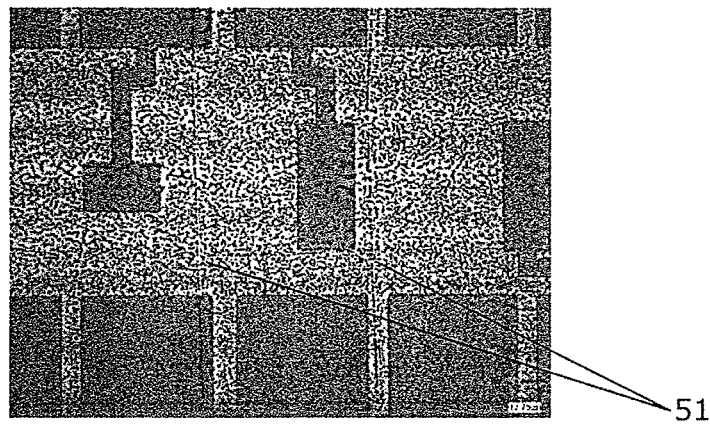
FIG. 13A shows an optical microscopic image of grain structure of a crystalline silicon thin film formed under a set of conditions for laser irradiation in Embodiment 1 (stage scanning speed: 460 mm/s).
Figure 13B:
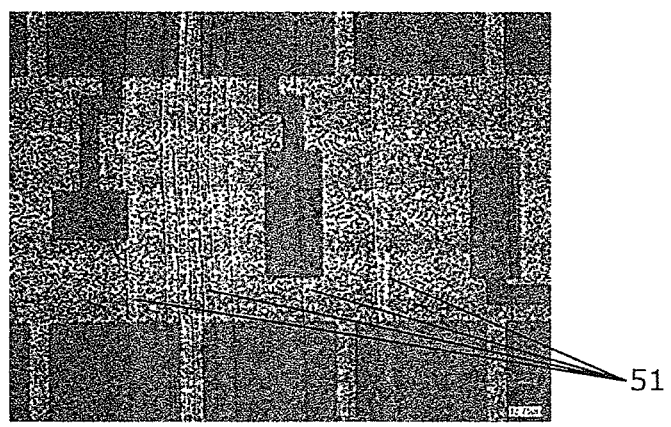
FIG. 13B shows an optical microscopic image of grain structure of a crystalline silicon thin film formed under a set of conditions for laser irradiation in Embodiment 1 (stage scanning speed: 480 mm/s).
Figure 13C:
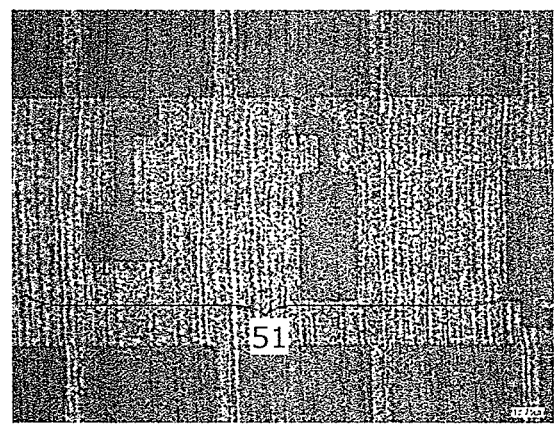
FIG. 13C shows an optical microscopic image of grain structure of a crystalline silicon thin film formed under a set of conditions for laser irradiation in Embodiment 1 (stage scanning speed: 520 mm/s).

In the above-described Embodiment 1, the laser irradiation was performed under the condition that the stage scanning speed was 580 mm/s. When the stage scanning speed was 460 mm/s, 480 mm/s, and 520 mm/s, strip-shaped first areas 51 were formed as shown in FIG. 13A to FIG. 13C, respectively. FIG. 13A to FIG. 13C each show an optical microscopic image of grain structure of the crystalline silicon thin films 15 formed under sets of conditions for laser irradiation in Embodiment 1. FIG. 13A, FIG. 13B, and FIG. 13C show the image taken when the stage scanning speed the was 460 mm/s, 480 mm/s, and 520 mm/s, respectively.

As shown in FIG. 13A and FIG. 13B, when the scanning speed of the stage was 460 mm/s and 480 mm/s, strip-shaped first areas 51 were formed at a regular pitch. As shown in FIG. 13C, when the scanning speed of the stage was 520 mm/s, strip-shaped first areas 51 were formed at a regular pitch in the same manner as shown in FIG. 11. The strip-shaped first areas 51 shown in FIG. 13A to FIG. 13C were formed under sets of conditions all of which but the stage scanning speed were the same as the sets of conditions for laser irradiation in Embodiment 1 shown in FIG. 11.

Figure 14A:
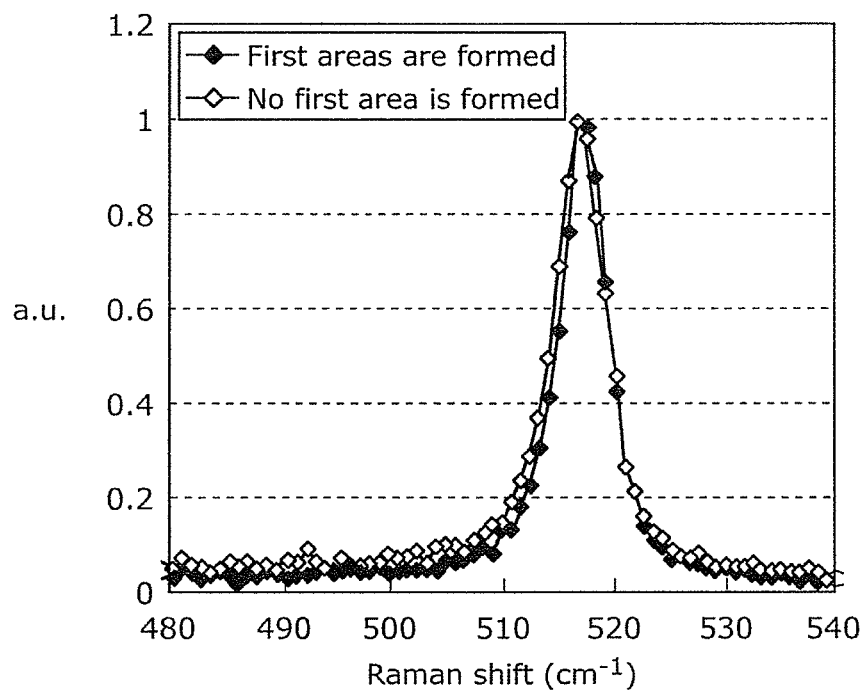
FIG. 14A shows Raman shift spectra obtained by performing Raman spectroscopy on a crystalline silicon thin film formed under a set of conditions for laser irradiation in Embodiment 1 and a crystalline silicon thin film formed under a set of conditions for laser irradiation in the comparative example.
Figure 14B:
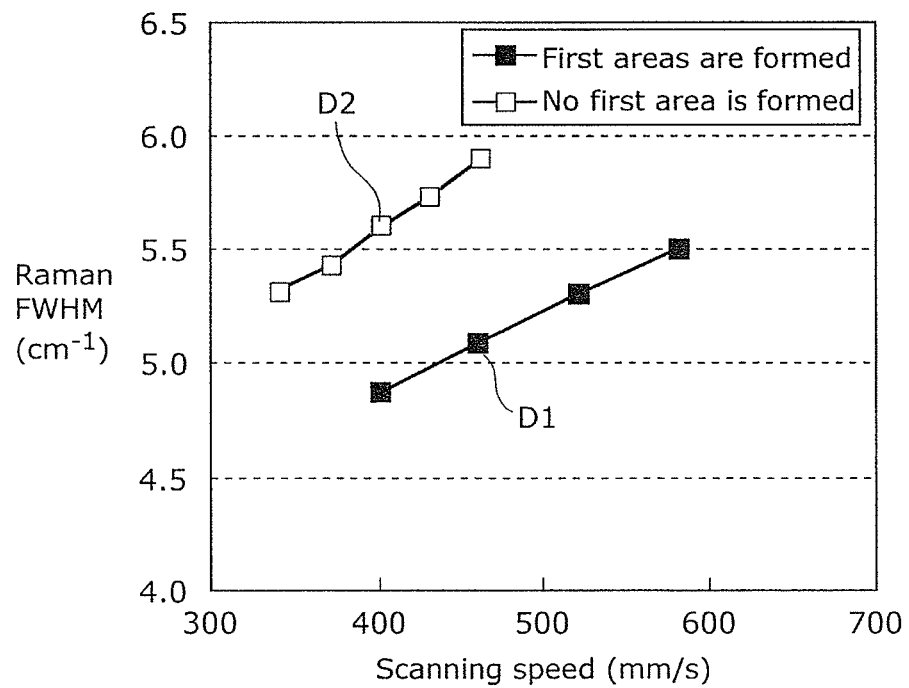
FIG. 14B shows relationships between scanning speed of laser and the FWHM of peak spectrum of crystal silicon (c-Si) for a Raman shift of around 520 cm$^{-1}$ which is obtained by performing Raman spectroscopy shown in FIG. 13A on a crystalline silicon thin film formed under a set of conditions for laser irradiation in Embodiment 1 and a crystalline silicon thin film formed under a set of conditions for laser irradiation in the comparative example.

The following describes Raman FWHM against the scanning speed of laser light with respect to a crystalline silicon thin film formed under a set of conditions for laser irradiation in Embodiment 1 (both the first areas and the second areas are formed) and a crystalline silicon thin film formed under a set of conditions for laser irradiation in the comparative example (no first areas but only the second area is formed), using FIG. 14A and FIG. 14B.

FIG. 14A shows Raman shift spectra obtained by performing Raman spectroscopy on a crystalline silicon thin film formed under a set of conditions for laser irradiation in Embodiment 1 and a crystalline silicon thin film formed under a set of conditions for laser irradiation in the comparative example. FIG. 14B shows relationships between the scanning speed of laser and the FWHM of peak spectrum of crystal silicon (c-Si) for a Raman shift of around 520 cm-1 which is obtained by performing Raman spectroscopy shown in FIG. 14A on a crystalline silicon thin film formed under the set of conditions for laser irradiation in Embodiment 1 and a crystalline silicon thin film formed under the set of conditions for laser irradiation in the comparative example.

Raman spectroscopy used for measurement shown in FIG. 14A was performed by measuring a spot having a diameter of 1.3 μmφ on the crystalline silicon thin film above the gate electrode using a laser having an excitation wavelength of 532 nm at a wavenumber resolution of 1.5 cm$^{-1}$. The data points in FIG. 14B indicates an average of values measured on 120 points on the crystalline silicon thin film above the gate electrodes. FIG. 14A illustrates a result measured on one of the 120 points when the data of the point D1 and the point D2 were obtained.

As can be seen from the result shown in FIG. 14B, the crystalline silicon thin film formed under a set of conditions for laser irradiation in Embodiment 1 where the first area 51 and the second area 52 coexist exhibits a FWHM of a Raman scattering peak spectrum smaller than that of the crystalline silicon thin film formed under a set of conditions for laser irradiation in the comparative example where no first area 51 but only the second area 52 is present. Such a small Raman FWHM indicates that the crystalline silicon thin film has grain structure including silicon grains have larger grain size.

Also as can be seen from FIG. 14B, the crystalline silicon thin film formed under a set of conditions for laser irradiation in Embodiment 1 has a Raman shift peak having a FWHM of 4.8 to 5.5 cm$^{-1}$, inclusive. This indicates that when the Raman FWHM of a crystalline silicon thin film is within the range of 4.8 to 5.5 cm$^{-1}$, inclusive, the crystalline silicon thin film has grain structure including strip-shaped first areas 51 in which crystal grains have larger grain size.

Next, referring back to FIG. 9, photolithography and wet etching are performed on the substrate on which the crystalline silicon thin film 15 shown in (e) in FIG. 9 formed, so that the amorphous silicon thin film 13 is selectively removed and the crystalline silicon thin film 15 is selectively formed into an insular-shaped pattern.

Next, as shown in (f) in FIG. 9, an intrinsic amorphous silicon film (not shown) having a thickness of 50 nm is formed by plasma CVD, and subsequently an n$^+$ layer having a thickness of 30 nm is formed on the amorphous silicon film by plasma CVD. The n$^+$ layer is a dopant-doped layer to be the contact layer 16 of an amorphous silicon film doped with a dopant such as phosphor. Next, a source-drain metal film 17 having three-layer structure of MoW (50 nm), Al (400 nm), and MoW (50 nm) are formed on the contact layer 16 as shown in (f) in FIG. 9 by sputtering.

For example, an opposite pair of the source electrode 17S and the drain electrode 17D is formed in a pattern by performing photolithography and wet etching on the source-drain metal film 17.

Next, dry etching is performed to divide the contact layer 16 using a resist as it is for forming the source-drain metal film 17 in a pattern to make an opposite pair of remains of the contact layer 16, and then the resist is removed. A bottom-gate type TFT is thus made.

Optionally, the above-described processing may be followed by forming of a silicon nitride film having a thickness of 400 nm by plasma CVD or other technique, performing photolithography and dry etching on the silicon nitride film to open contact holes in the silicon nitride film, depositing an ITO film having a thickness of 100 nm which is a transparent electrode by sputtering, and then performing photolithography and dry etching on the ITO film to form the ITO film in a pattern.

Figure 15A:
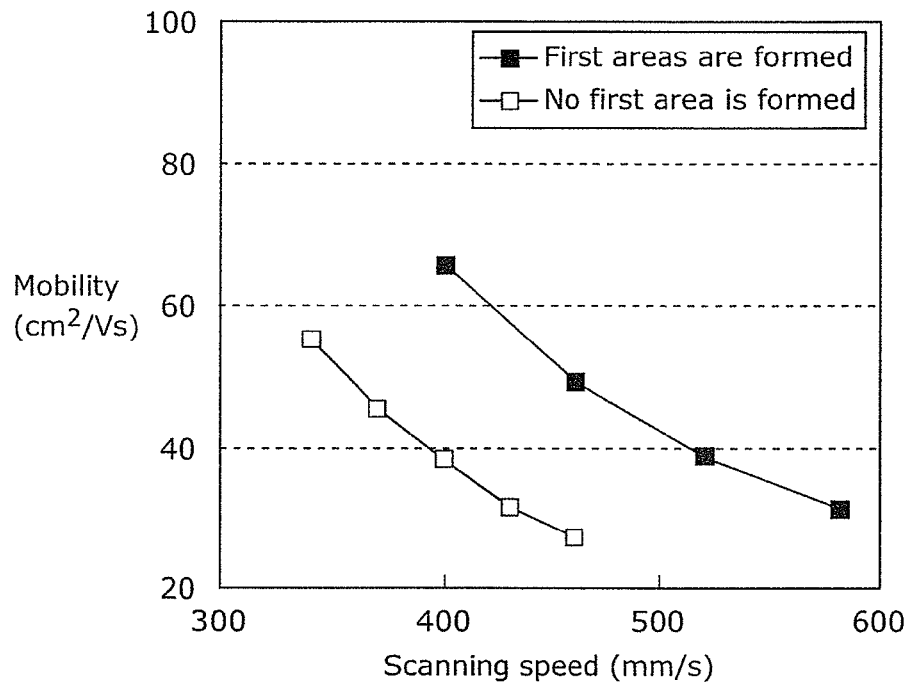
FIG. 15A shows a relationship between scanning speed in laser irradiation and mobility in a TFT including a crystalline silicon thin film formed under a set of conditions for laser irradiation in Embodiment 1 and a relationship between the scanning speed in laser irradiation and mobility in a TFT including a crystalline silicon thin film formed under a set of the conditions for laser irradiation in the comparative example.
Figure 15B:
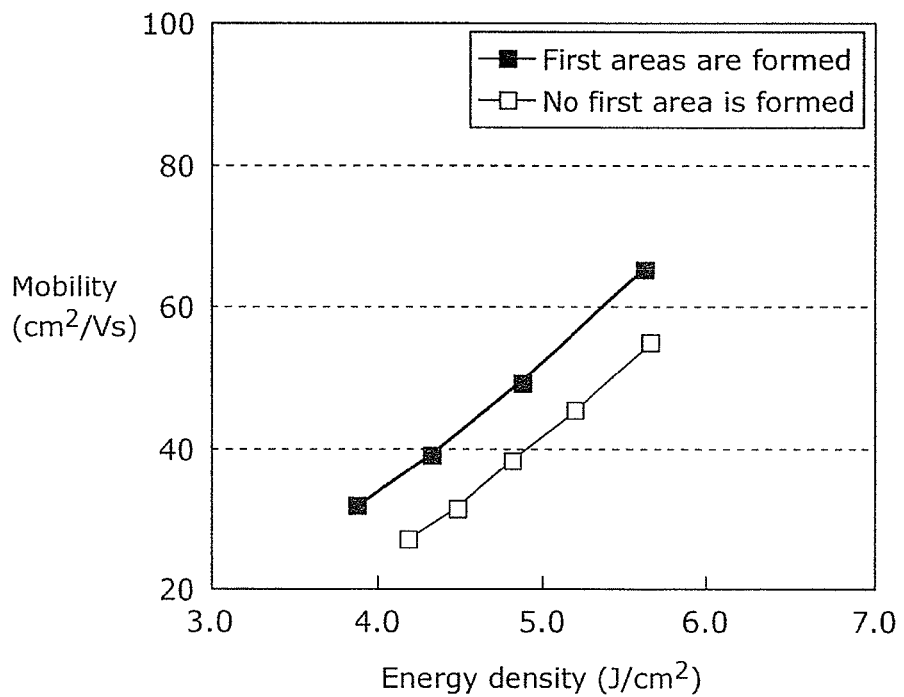
FIG. 15B shows a relationship between energy density of laser light and mobility in a TFT including a crystalline silicon thin film formed under a set of conditions for laser irradiation in Embodiment 1 and a relationship between energy density of laser light and mobility in a TFT including a crystalline silicon thin film formed under a set of the conditions for laser irradiation in the comparative example.

The following describes mobility in a TFT including a crystalline silicon thin film formed under a set of conditions for laser irradiation in Embodiment 1 (both the first areas and the second areas are formed) and mobility in a TFT including a crystalline silicon thin film formed under a set of conditions for laser irradiation in the comparative example (no first area but only the second area is formed), using FIG. 15A and FIG. 15B.

FIG. 15A shows a relationship between scanning speed in laser irradiation and mobility in a TFT including a crystalline silicon thin film formed under a set of conditions for laser irradiation in Embodiment 1 and in a TFT including a crystalline silicon thin film formed under a set of conditions for laser irradiation in the comparative example. FIG. 15B shows a relationship between energy density of laser light and mobility in the TFT including the crystalline silicon thin film formed under the set off conditions for laser irradiation in Embodiment 1 and in the TFT including the crystalline silicon thin film formed under the set of conditions for laser irradiation in the comparative example. The mobility shown in FIG. 15A and FIG. 15B was the result of measurement performed on the TFTs having a channel layer (crystalline silicon thin film) where the channel width is 50 µm and the channel length is 10 µm.

As can be seen from the result shown in FIG. 15A, the TFT including the crystalline silicon thin film formed under a set of conditions for laser irradiation in Embodiment 1 as a channel layer where the first area 51 and the second area 52 coexist exhibits mobility higher than that of the TFT including the crystalline silicon thin film formed under a set of conditions for laser irradiation in the comparative example as a channel layer where no first area 51 but only the second area 52 is present. This indicates that the crystalline silicon thin film formed under a set of conditions for laser irradiation in Embodiment 1 includes silicon grains having larger grain size than the silicon grains included in the crystalline silicon thin film formed under a set of conditions for the comparative example. Furthermore, the higher mobility in the TFT including the crystalline silicon thin film formed under a set of conditions for laser irradiation in Embodiment 1 as a channel layer indicates that the TFT is excellent in ON-state current characteristics.

Furthermore, FIG. 15B shows that when the energy density of laser light is 5.0 J/cm$^2$, the TFT including the crystalline silicon thin film formed under a set of conditions for laser irradiation in Embodiment 1 as a channel layer where the first area 51 and the second area 52 coexist exhibits a mobility of 39.0 (cm$^2$/V·sec), and the TFT including the crystalline silicon thin film formed under a set of conditions for laser irradiation in the comparative example where no first area 51 but only the second areas 52 are present exhibits a mobility of 27.1 (cm$^2$/V·sec). This indicates that when a crystalline silicon thin film is crystallized using laser light having an energy density under a set of conditions for laser irradiation according to Embodiment 1 or a set of conditions for laser irradiation in the comparative example, the mobility is higher in the TFT including the crystalline silicon thin film crystallized using laser light having an energy density under a set of conditions for laser irradiation according to Embodiment 1 as a channel layer, and thus the TFT is excellent in ON-state current characteristics. In other words, a crystalline silicon thin film having preferred mobility can be made using laser light having a smaller energy density by laser irradiation under a set of conditions in Embodiment 1.

Figure 16:
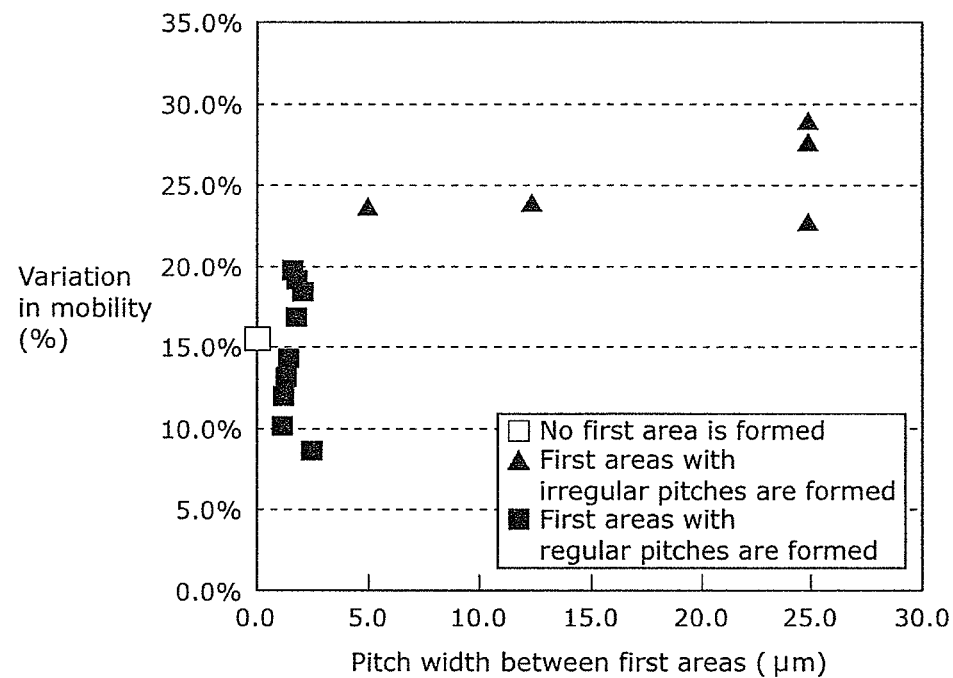
FIG. 16 shows a relationship between pitches between strip-shaped first areas and variation in mobility in a TFT including a crystalline silicon thin film formed under a set of conditions in Embodiment 1 and in a TFT including a crystalline silicon thin film under a set of the conditions in the comparative example.

The following describes a relationship between pitches between the first areas 51 and variation in mobility in TFTs including a crystalline silicon thin film formed under a set of conditions for laser irradiation in Embodiment 1 (both the first areas and the second areas are formed) and in a TFT including a crystalline silicon thin film formed under a set of conditions for laser irradiation in the comparative example (no first area but only the second area is formed), using FIG. 16. FIG. 16 shows a relationship between pitches between the strip-shaped first areas 51 and variation (3σ/Ave.) in mobility in a TFT including a crystalline silicon thin film formed by laser irradiation under a set of conditions in Embodiment 1 or under a set of conditions in the comparative example.

As shown in FIG. 16, in the TFT including a crystalline silicon thin film formed under a set of conditions for laser irradiation in the comparative example where no first area but only the second area is formed (a set of conditions corresponding to the region B in FIG. 4), variation in mobility is 15.5%. On the other hand, in the TFT including a crystalline silicon thin film formed under a set of conditions for laser irradiation in Embodiment 1 where both the first areas with irregular pitches therebetween and the second area are formed (a set of conditions corresponding to the region C in FIG. 4), variation in mobility is above 20%.

In comparison with this, in the TFT including a crystalline silicon thin film formed by faster laser scanning under a set of conditions for laser irradiation in Embodiment 1 where both the first areas with regular pitches therebetween and the second area are formed (a set of conditions corresponding to the region D in FIG. 4), variation in mobility is decreased to 10 to 20%. This low variation in mobility is preferable to the variation in mobility in the TFT including a crystalline silicon thin film formed under a set of conditions for laser irradiation in the comparative example.

Embodiment 2

The following describes a method of manufacturing a thin-film device (thin-film-device substrate) according to Embodiment 2. A thin-film device in Embodiment 2 includes the crystalline silicon thin film 15 in Embodiment 1, and is described below using a switching transistor and a driver transistor in each pixel of an organic light-emitting diode (OLED) display as an example.

Figure 17A:
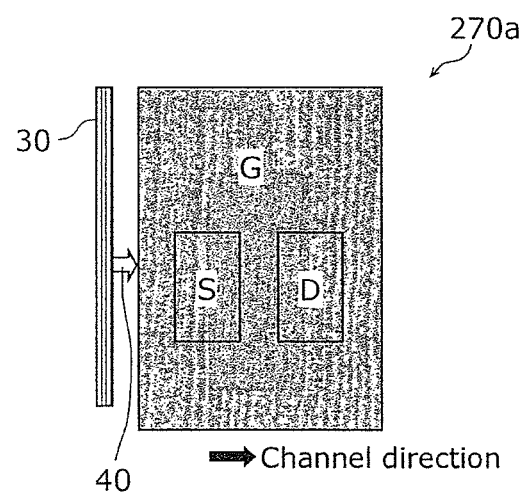
FIG. 17A is a plan view illustrating a configuration of a switching transistor included in a pixel of an OLED display according to Embodiment 2.
Figure 17B:
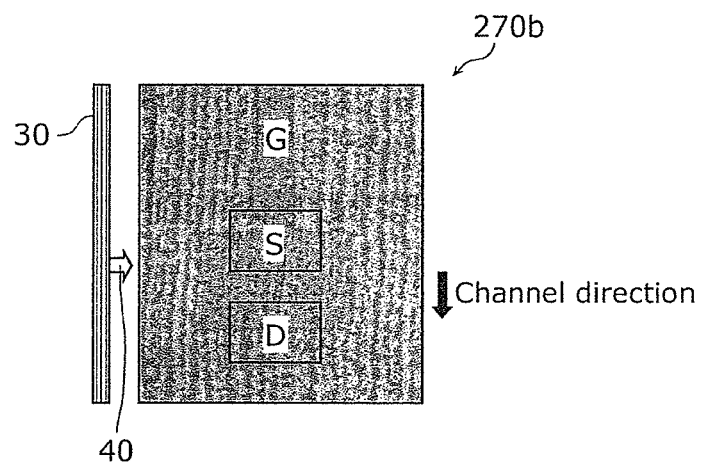
FIG. 17B is a plan view illustrating a configuration of a driver transistor included in a pixel of an OLED display according to Embodiment 2.

FIG. 17A is a plan view illustrating a configuration of a switching transistor included in a pixel of an OLED display according to Embodiment 2. FIG. 17B is a plan view illustrating a configuration of a driver transistor included in a pixel of an OLED display according to Embodiment 2. FIG. 17A shows arrangement of a source electrode and a drain electrode of a switching transistor in grain structure of a crystalline silicon thin film in Embodiment 2 as viewed under an optical microscope. FIG. 17B shows arrangement of a source electrode and a drain electrode of a driver transistor in grain structure of a crystalline silicon thin film in Embodiment 2 as viewed under an optical microscope. In FIG. 17A and FIG. 17B, the reference signs G, S, and D denotes a gate electrode, a source electrode, and a drain electrode, respectively, of the switching transistor and the driver transistor. The driver transistor corresponds to a first device (first device unit), and the switching transistor to a second device (second device unit). The channel direction is a direction along which the source electrode and the drain electrode are arranged.

As shown in FIG. 17A and FIG. 17B, in each of the switching transistor 270a and the driver transistor 270b, a crystalline silicon thin film irradiated with laser under the above-described set of conditions includes two or more strip-shaped first areas 51 and two or more second areas 52 so that the crystalline silicon thin film has streaky structure. Crystal grains in the first areas 51 have grain size larger than the grain size of crystal grains in the second areas 52. As shown in FIG. 17A, in the switching transistor, the source electrode and the drain electrode are formed to be arranged in a direction parallel to the scanning direction 40 of the laser light 30, so that the channel direction is approximately perpendicular to the longitudinal direction of the strip-shaped first areas 51. As shown in FIG. 17B, in the driver transistor, the source electrode and the drain electrode are formed to be arranged in a direction approximately perpendicular to the scanning direction 40 of the laser light 30, so that the channel direction is parallel to the longitudinal direction of the strip-shaped first areas 51. Thus, in Embodiment 2, the center line of the region where the source electrode and the drain electrode of the driver transistor faces each other crosses the center line of the region where the source electrode and the drain electrode of the switching transistor faces each other.

Figure 18:
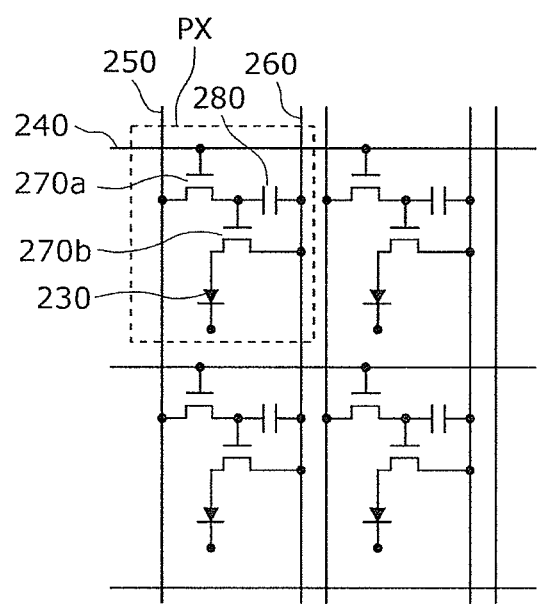
FIG. 18 shows an equivalent circuit of a pixel circuit including a thin-film device according to Embodiment 2.

The following describes a circuit configuration of pixels of an OLED display including the thin-film device according to Embodiment 2 using FIG. 18. FIG. 18 shows an equivalent circuit of a pixel circuit including the thin-film device according to Embodiment 2.

As shown in FIG. 18, a pixel PX according to Embodiment 2 is a thin-film device including a switching transistor 270a, a driver transistor 270b, an OLED element 230, and a capacitor 280. The driver transistor 270b is a transistor which drives the OLED element 230. The switching transistor 270a is a transistor for selection of the pixel. The OLED display includes a plurality of such pixels each of which is a thin-film device. Thus, in the OLED display, a plurality of such thin-film devices are arranged to form an array, or a pixel array.

The switching transistor 270a has a source electrode connected to a data line 250, a gate electrode connected to a scanning line 240, and a drain electrode connected to a condenser 280 and a gate electrode of the driver transistor 270b.

The driver transistor 270b has a drain electrode connected to a current supply line (power line) 260 and a source electrode connected to an anode of the OLED element 230.

In this configuration, when the switching transistor 270a is turned on by inputting a gate signal to the scanning line 240, a signal voltage provided through the data line 250 is written in the capacitor 280. The voltage written in the capacitor 280 (hold voltage) is held through a frame. The hold voltage causes analog change in the conductance of the driver transistor 270b, so that a drive current corresponding to a light emission level flows from the anode to the cathode of the OLED element 230. This causes the OLED element 230 to emit light, so that a certain image is displayed.

Figure 19:
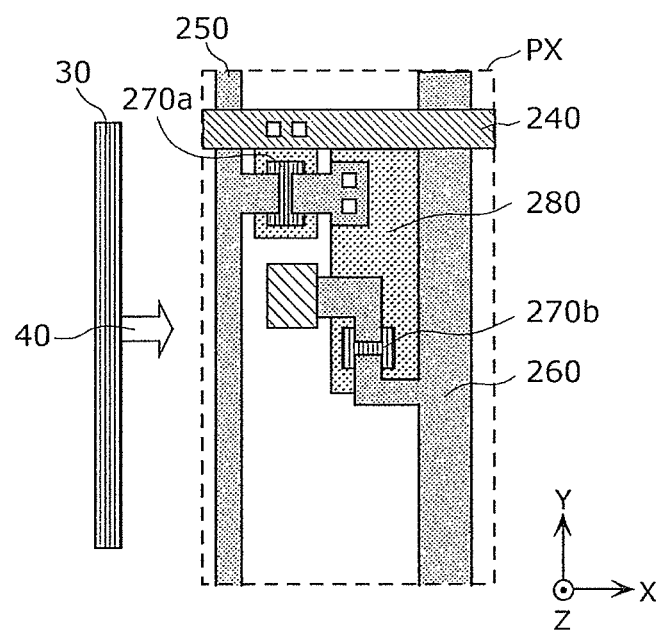
FIG. 19 is a plan view illustrating a configuration of a pixel of the OLED display according to Embodiment 2.

The following describes an example of layout of the electrodes and lines in the pixel PX using FIG. 19.

FIG. 19 is a plan view illustrating a configuration of a pixel of the OLED display according to Embodiment 2. As shown in FIG. 19, the pixel PX includes a scanning line 240, a data line 250, a current supply line 260, a capacitance 280, a switching transistor 270a, a driver transistor 270b, and an OLED element 230.

The pixel PX includes a substrate on which a crystalline silicon thin film is formed. The crystalline silicon thin film is irradiated with laser light 30 which moves in the scanning direction 40 as shown in FIG. 19. As a result, strip-shaped first areas extending in a direction approximately perpendicular to the scanning direction 40 are formed in the crystalline silicon thin film.

As described above, the switching transistor 270a is formed so that the channel direction runs parallel to the scanning direction 40, and the driver transistor 270a is formed so that the channel direction is approximately perpendicular to the scanning direction 40. Thus, the channel direction of the switching transistor 270a and the channel direction of the driver transistor 270b thus arranged are approximately perpendicular to each other.

The data line 250 is formed integral with the source electrode of the switching transistor 270a. More specifically, the data line 250 and the source electrode of the switching transistor 270a are made by forming a single metal film in a pattern. The current supply line 260 is formed integral with the drain electrode of the driver transistor 270b. More specifically, the current supply line 260 and the drain electrode of the driver transistor 270b are made by forming a single metal film in a pattern.

The scanning line 240 is connected to the gate electrode of the switching transistor 270a via a contact hole. The drain electrode of the switching transistor 270a is connected to the capacitance 280 via a contact hole. The capacitance 280 is connected to the current supply line 260.

The switching transistor 270a and the driver transistor 270b are thus configured, so that OFF-state current Ioff of the switching transistor 270a is lowered and at the same time ON-state current Ion of the driver transistor 270b is increased.

Figure 20A:
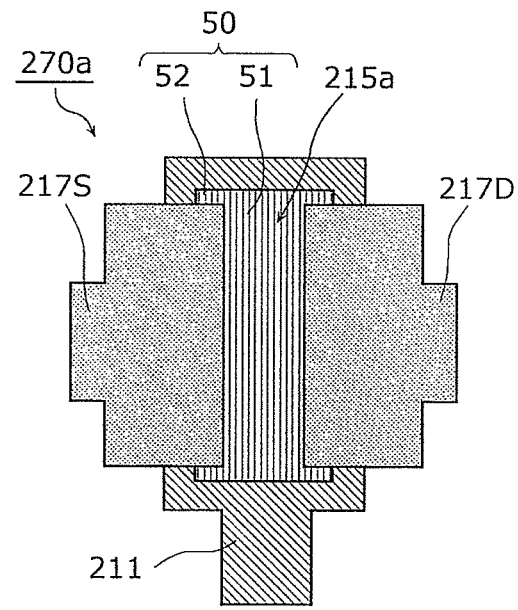
FIG. 20A shows a schematic configuration of a switching transistor in Embodiment 2.
Figure 20B:
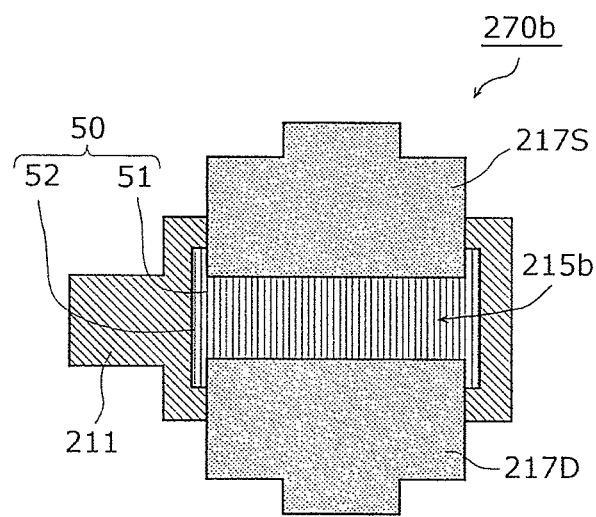
FIG. 20B shows a schematic configuration of a driver transistor in Embodiment 2.

The following describes a configuration of a TFT according to Embodiment 2 using FIG. 20A and FIG. 20B. FIG. 20A shows a schematic configuration of the switching transistor in Embodiment 2. FIG. 20B shows a schematic configuration of the driver transistor in Embodiment 2. FIG. 20A and FIG. 20B each show a bottom-gate transistor as an example of the switching transistor and the driver transistor, respectively.

As shown in FIG. 20A, the switching transistor 270a in Embodiment 2 includes, as a channel layer, a crystalline silicon thin film having a crystallized area 50 shown in FIG. 2. In the switching transistor 270a, a source electrode 217S and a drain electrode 217D are formed to have a channel direction approximately perpendicular to the longitudinal direction of strip-shaped first areas 51. Each of the strip-shaped first areas 51 in the switching transistor 270a is preferably continuous across the length of the channel region. The crystalline silicon thin film thus formed has enhanced OFF-state current characteristics due to lowered mobility of charge carriers, and is excellent in uniformity.

As shown in FIG. 20B, the driver transistor 270b in Embodiment 2 includes, as a channel layer, a crystalline silicon thin film having a crystallized area 50 shown in FIG. 2. The driver transistor 270b has a source electrode 217S and a drain electrode 217D formed so that the channel direction is parallel to the longitudinal direction of strip-shaped first areas 51. Each of the strip-shaped first areas 51 in the driver transistor 270b is preferably continuous across the length of the channel region. The crystalline silicon thin film thus formed has enhanced ON-state current characteristics due to increased mobility of charge carriers, and is excellent in uniformity.

Figure 21A:
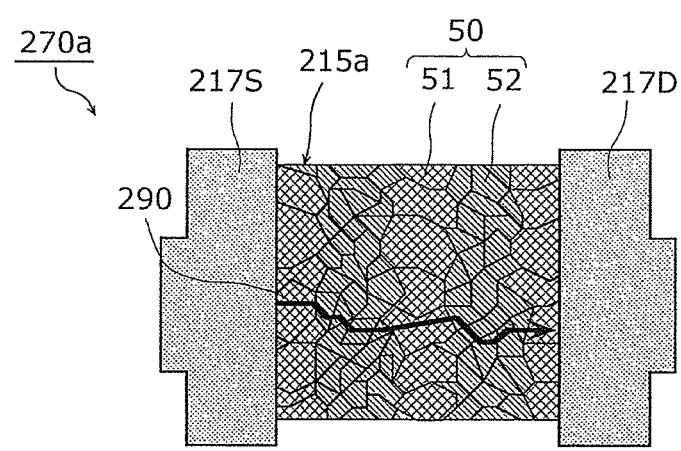
FIG. 21A is a drawing for illustration of mobility of electrons in the switching transistor according to Embodiment 2.
Figure 21B:
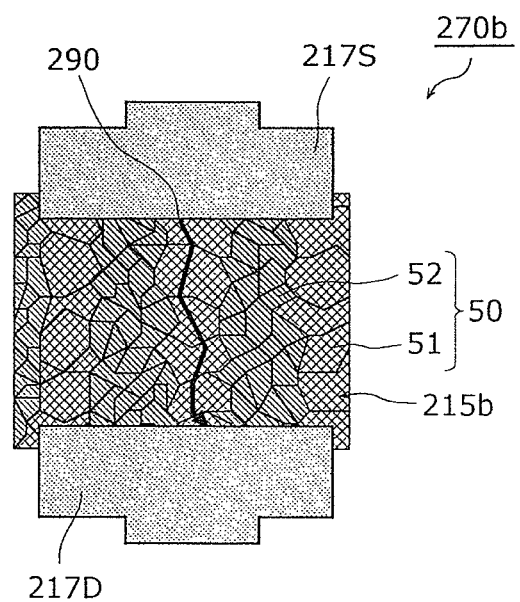
FIG. 21B is a drawing for illustration of mobility of electrons in the driver transistor according to Embodiment 2.

The following describes mobility of charge carriers (electrons) in the switching transistor 270a and the driver transistor 270b using FIG. 21A and FIG. 21B. FIG. 21A is a drawing for illustration of mobility of electrons in the switching transistor according to Embodiment 2. FIG. 21B is a drawing for illustration of mobility of electrons in the driver transistor according to Embodiment 2.

The switching transistor 270a is desired to have enhanced OFF-state current characteristics. More specifically, the switching transistor 270a preferably has a smaller OFF-state current Ioff. In order to lower the OFF-state current Ioff, the source electrode 217S and the drain electrode 217D are formed as shown in FIG. 21A so that the channel direction of the switching transistor 270a is approximately perpendicular to the strip-shaped first areas 51 formed in the crystalline silicon thin film. Thus, in the strip-shaped second areas 52 where crystal grains have smaller grain size, an electron transfer pathway 290 between the source electrode and the drain electrode runs through more crystal grain boundaries. Accordingly, charge carriers are more likely to be trapped by the crystal grain boundaries. Current therefore flows less easily between the source electrode and the drain electrode, so that OFF-state current Ioff in the switching transistor 270a decreases. ON-state current Ion of the switching transistor 270a is also lowered by the same mechanism. However, since it is particularly desirable for the switching transistor 270a to have lowered OFF-state current characteristics, lowering of ON-state current Ion has a small effect.

The driver transistor 270b is desired to have enhanced ON-state current characteristics. More specifically, the driver transistor 270b preferably has a larger ON-state current Ion. In order to increase the ON-state current Ion, the source electrode 217S and the drain electrode 217D are formed as shown in FIG. 21B so that the channel direction of the driver transistor 270b is parallel to the strip-shaped first areas 51 formed in the crystalline silicon thin film. Thus, in the first areas 51 where crystal grains have larger grain size and crystal grain boundaries are fewer, an electron transfer pathway 290 between the source electrode and the drain electrode runs through fewer crystal grain boundaries. Accordingly, charge carriers are less likely to be trapped by the crystal grain boundaries. Current therefore flows more easily between the source electrode and the drain electrode, so that ON-state current Ion in the driver transistor 270b increases.

The following describes a method of manufacturing TFTs according to Embodiment 2. The TFTs refer to the switching transistor 270a and the driver transistor 270b formed in each pixel.

As with Embodiment 2, a method of manufacturing the TFTs according to Embodiment 3 includes: preparing a substrate (step of preparing a substrate); forming a gate electrode above the substrate (step of forming a gate electrode); forming a gate insulating film above the substrate (step of forming a gate insulating film); forming a silicon thin film above the substrate (step of forming a silicon thin film); crystallizing the silicon thin film formed on the substrate, by irradiating the silicon thin film with laser light (step of crystallizing a silicon thin film); and forming a source electrode and a drain electrode above the substrate (step of forming a source electrode and a drain electrode).

The step of crystallizing a silicon thin film in Embodiment 2 can be performed in the same manner as the step of crystallizing in the method of manufacturing the TFTs according to Embodiment 1. The crystalline silicon thin film obtained in the step of crystallizing a silicon thin film is to function as a channel layer of TFTs.

Figure 22:
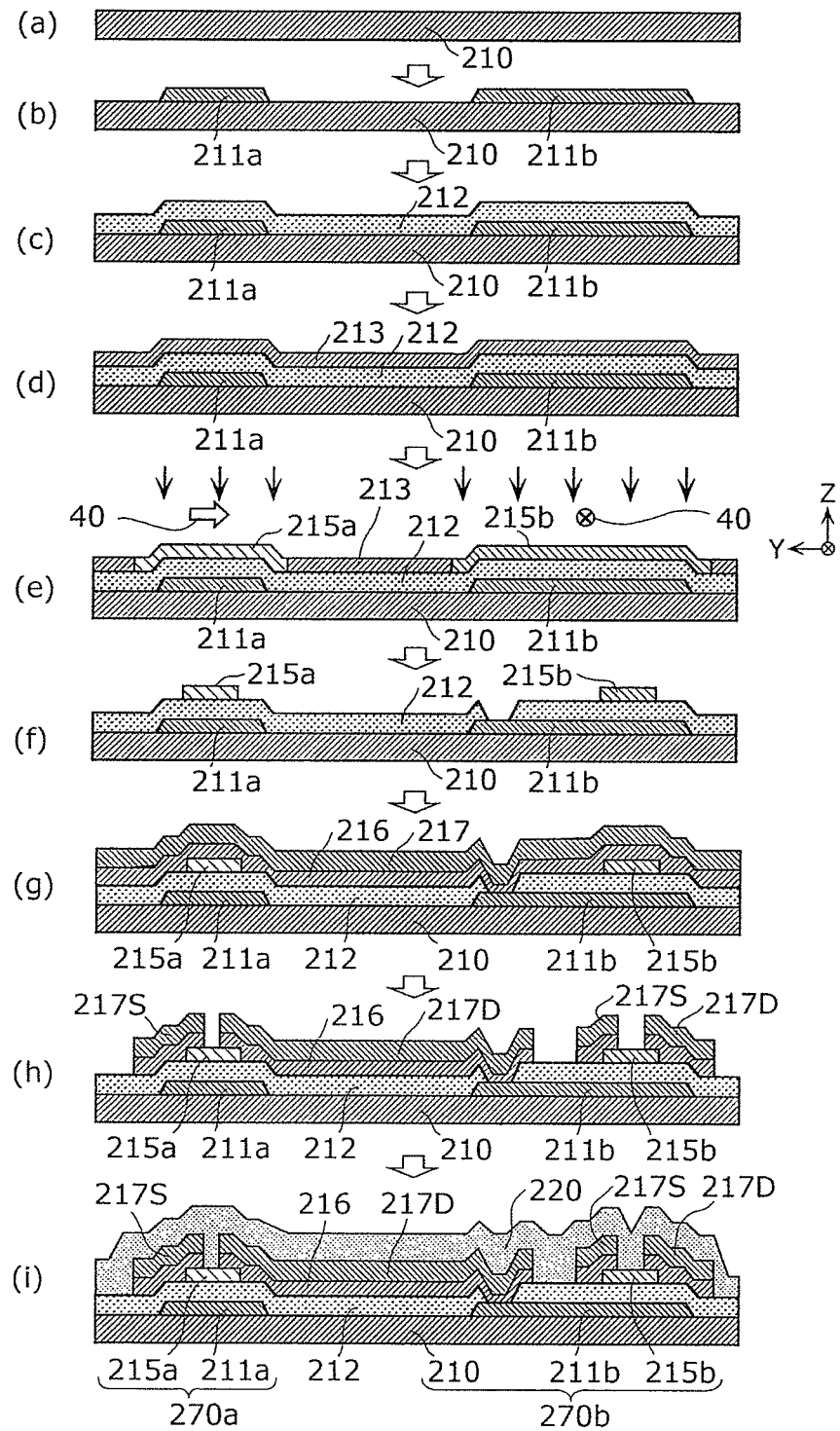
FIG. 22($a$)-($i$) shows cross-sectional views schematically illustrating steps of a method of manufacturing bottom-gate type TFTs according to Embodiment 2.

The following describes a method of manufacturing bottom-gate type TFTs as an example of the switching transistor 270a using FIG. 22. FIG. 22 shows cross-sectional views schematically illustrating steps of a method of manufacturing bottom-gate type TFTs according to Embodiment 2. In FIG. 22, each cross-section of the switching transistor 270a is a view taken along the X direction and viewed from the Y direction shown in FIG. 19, and each cross-section of the driver transistor 270b is a view taken along the Y direction and viewed from the X direction shown in FIG. 19.

First, as shown in (a) in FIG. 22, a substrate 210 is prepared in the same manner as shown in (a) in FIG. 9 (step of preparing a substrate).

Next, as shown in (b) in FIG. 22, gate electrodes 211a and 211b are formed in a pattern above the substrate 210 in the same manner as shown in (b) in FIG. 9 (step of forming a gate electrode).

Next, as shown in (c) in FIG. 22, a gate insulating film 212 is formed above the substrate 210 in the same manner as shown in (c) in FIG. 9 (step of forming a gate insulating film).

Next, as shown in (d) in FIG. 22, an amorphous silicon thin film 213 is formed above the substrate 210 in the same manner as shown in (d) in FIG. 9 (step of forming a silicon thin film).

Next, predetermined areas (where the switching transistor 270a and the driver transistor 270b are to be formed) of the amorphous silicon thin film 213 is crystallized into crystalline silicon thin films 215a and 315b as shown in (e) in FIG. 22 through relative scan with laser light which is performed on the amorphous silicon thin film 213 in a scanning direction 40 while the predetermined areas of the amorphous silicon thin film 213 are being irradiated with the laser light (step of crystallizing a silicon thin film). This step of crystallizing a silicon thin film is performed in the same manner as the step of crystallization in the above-described method of manufacturing a substrate with a thin film formed thereabove.

More specifically, the amorphous silicon thin film 213 irradiated with laser light by scanning the amorphous silicon thin film 213 with the laser light in the scanning direction 40 under a set of conditions for laser irradiation corresponding to the region C or the region D shown in FIG. 4. For example, the laser used for irradiation may have a fixed beam minor axis width W1 (FWHM) of 32.0 μm and a power density of 70.0 kW/cm$^2$, and scanning speed of the substrate support unit 110 may be 400 to 580 mm/s.

In this step, the area where the switching transistor 270a is to be formed is irradiated with laser light by scanning the area with the laser light in a scanning direction 40 which is parallel to the Y axis (the direction from left to right on the plane of the drawing). Also in this step, the area where the driver transistor 270b is to be formed is irradiated with laser light by scanning the area with the laser light in a scanning direction 40 which is parallel to the X axis (the direction from front to back with respect to the plane of the drawing). By doing this, strip-shaped first areas 51 and second areas 52 extending in a direction approximately perpendicular to the scanning direction 40 are formed on the crystalline silicon thin film 215a and the crystalline silicon thin film 215b as shown in FIG. 17A and FIG. 17B. Furthermore, in Embodiment 2, the longitudinal direction of the strip-shaped first areas 51 of the crystalline silicon thin film 215a and the longitudinal direction of the strip-shaped first areas 51 of the crystalline silicon thin film 215b are approximately perpendicular to each other.

In (e) in FIG. 22, part of the amorphous silicon thin film 213, that is, only the areas where switching transistor 270a and the driver transistor 270b are to be formed is crystallized. Alternatively, the whole of the amorphous silicon thin film 213 may be crystallized.

Next, photolithography and wet etching are performed to selectively form, into respective patterns, the amorphous part of the silicon thin film 213 not irradiated with laser light and the crystalline silicon thin film 215 crystallized by laser irradiation, so that the amorphous silicon thin film 213 is removed, and the crystalline silicon thin film 215a and the crystalline silicon thin film 215b are each formed into an insular-shaped pattern as shown in (f) in FIG. 22.

As shown in (f) in FIG. 22, contact holes may be formed in the gate insulating film 212 as necessary after the crystalline silicon thin films 215a and the 215b are formed into an insular-shaped pattern.

Next, as shown in (g) in FIG. 22, an n$^+$ layer which is an impurity-doped layer to be a contact layer 216 is formed, and a source drain metal film 217 is formed on the contact layer 216 in the same manner as in (f) in FIG. 9.

Next, as shown in (h) in FIG. 22, photolithography and wet etching are performed to form, in patterns, a source electrode 217S and a drain electrode 217D of the switching transistor 270a and a source electrode 217S and a drain electrode 217D of the driver transistor 270b above the substrate 210 in the same manner as shown in (g) in FIG. 9 (step of forming a source electrode and a drain electrode).

Next, dry etching is performed to divide the contact layer 216 to form an opposite pair of remains of the contact layer 216. Bottom-gate type TFTs (switching transistor 270a and driver transistor 270b) are thus made as shown in (h) in FIG. 22.

Next, a passivation film 220 which is a silicon nitride film covering over the TFTs may further be formed as shown in (i) in FIG. 22.

Figures 23, 24:
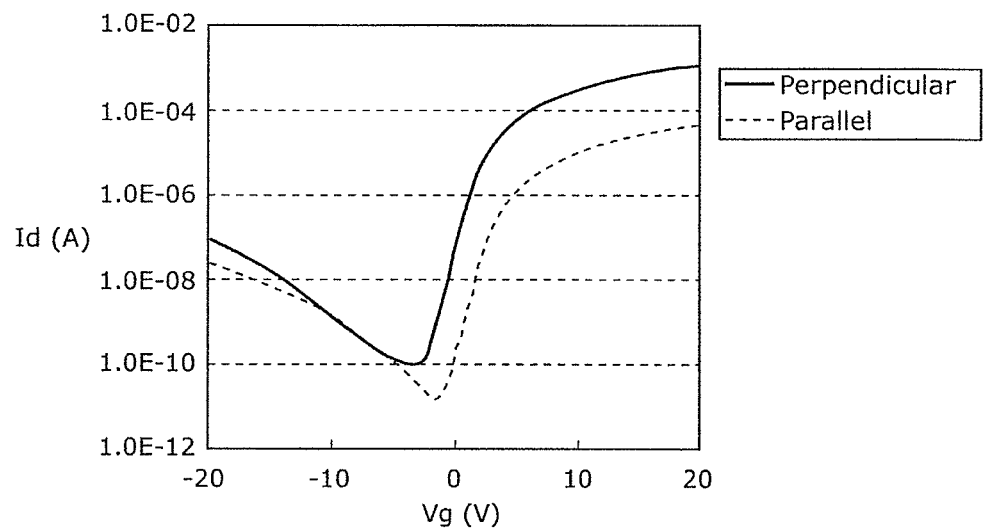
FIG. 23 shows Id-Vg characteristics of the switching transistor and the driver transistor according to Embodiment 2.
FIG. 24 shows Ion and Ioff of the switching transistor and the driver transistor according to Embodiment 2.

The following describes Id-Vg characteristics of a TFT according to Embodiment 2 using FIG. 23 and FIG. 24. FIG. 23 shows Id-Vg characteristics of a switching transistor and a driver transistor according to Embodiment 2. FIG. 24 shows Ion and Ioff of a switching transistor and a driver transistor according to Embodiment 2. The Id-Vg characteristics shown in FIG. 23 and FIG. 24 were obtained as a result of measurement under the following conditions: FWHM along the minor axis of laser for irradiation . . . 32 µm; laser power density . . . 70.0 kW/cm², stage scanning speed . . . 580 mm/s; TFT type . . . bottom-gate; channel width and channel length of switching transistor and driver transistor . . . 20 µm and 13 µm; and voltage applied between source and drain . . . 10.0 V.

As shown in FIG. 23, when the same gate voltage Vg is applied, the current value Id of a driver transistor having a channel direction approximately perpendicular to the scanning direction 40 is higher than the current value Id of a switching transistor having the channel direction parallel to the scanning direction 40.

More specifically, as shown in FIG. 24, when the gate voltage Vg is 10.0 V, the ON-state current Ion of the driver transistor is $3.48 \times 10^{-4}$ A, and the ON-state current Ion of the switching transistor is $1.09 \times 10^{-5}$ A. This shows that the driver transistor has enhanced ON-state current characteristics.

Also as shown in FIG. 24, the minimum current, that is, the OFF-state current Ioff of the driver transistor is $9.34 \times 10^{-11}$ A, and the minimum current, that is, the OFF-state current Ioff of the switching transistor is $1.53 \times 10^{-11}$ A. This shows that the switching transistor has enhanced OFF-state current characteristics.

As described above, in the thin-film device according Embodiment 2, the switching transistor 270a has a source electrode and a drain electrode formed so that the channel direction is channel direction approximately perpendicular to the longitudinal direction of the strip-shaped first areas in the crystalline silicon thin film 215a. Also as described above, in the thin-film device according Embodiment 2, the driver transistor 270b has a source electrode and a drain electrode formed so that the channel direction is parallel to the longitudinal direction of the strip-shaped first areas in the crystalline silicon thin film 215b. The switching transistor and the driver transistor are thus configured, so that OFF-state current Ioff of the switching transistor is lowered and at the same time ON-state current Ion of the driver transistor is increased.

It is preferable in Embodiment 2 that the crystalline silicon thin films 215a and 215b be formed under a set of conditions for laser irradiation corresponding to the region D shown in FIG. 4. When the crystalline silicon thin films 215a and 215b are formed by crystallizing the amorphous silicon thin film 313 under a set of conditions corresponding to the region D, the strip-shaped first areas 51 are formed at a regular pitch.

The laser irradiation may be performed under the following set of conditions: power density . . . 70.0 kW/cm²; stage scanning speed . . . 580 mm/s; irradiation time . . . 49.0 µsec; and input energy density . . . 3.5 J/cm². The crystalline silicon thin films 215a and 215b formed under a set of conditions for laser irradiation in Embodiment 2 include both strip-shaped first areas 51 and second areas 52. The crystalline silicon thin film formed under a set of conditions for laser irradiation in Embodiment 2 has a Raman shift peak having a FWHM of 4.8 to 5.5 cm$^{-1}$, inclusive. This indicates that when the Raman FWHM of the crystalline silicon thin film is within the range of 4.8 to 5.5 cm$^{-1}$, inclusive, the crystalline silicon thin film has grain structure including strip-shaped first areas 51 in which crystal grains have larger grain size.

For example, in the crystalline silicon thin films 215a and 215b, the average grain size of silicon grains in the first areas 51 of is 440 nm, and the average grain size of silicon grains in the second areas 52 is 80 nm. The pitches between the first areas 51 are 1.8 µm wide, which is a regular width of the pitches not wider than 2.0 µm. This enables manufacture of TFT arrays including TFTs having TFT characteristics excellent in inplane uniformity.

The example described above using a method of manufacturing bottom-gate type TFTs is also applicable to top-gate type TFTs. More specifically, the switching transistor driver transistor 270a and the driver transistor 270b shown in FIG. 19 can be formed in a top-gate type TFT.

Figure 25:
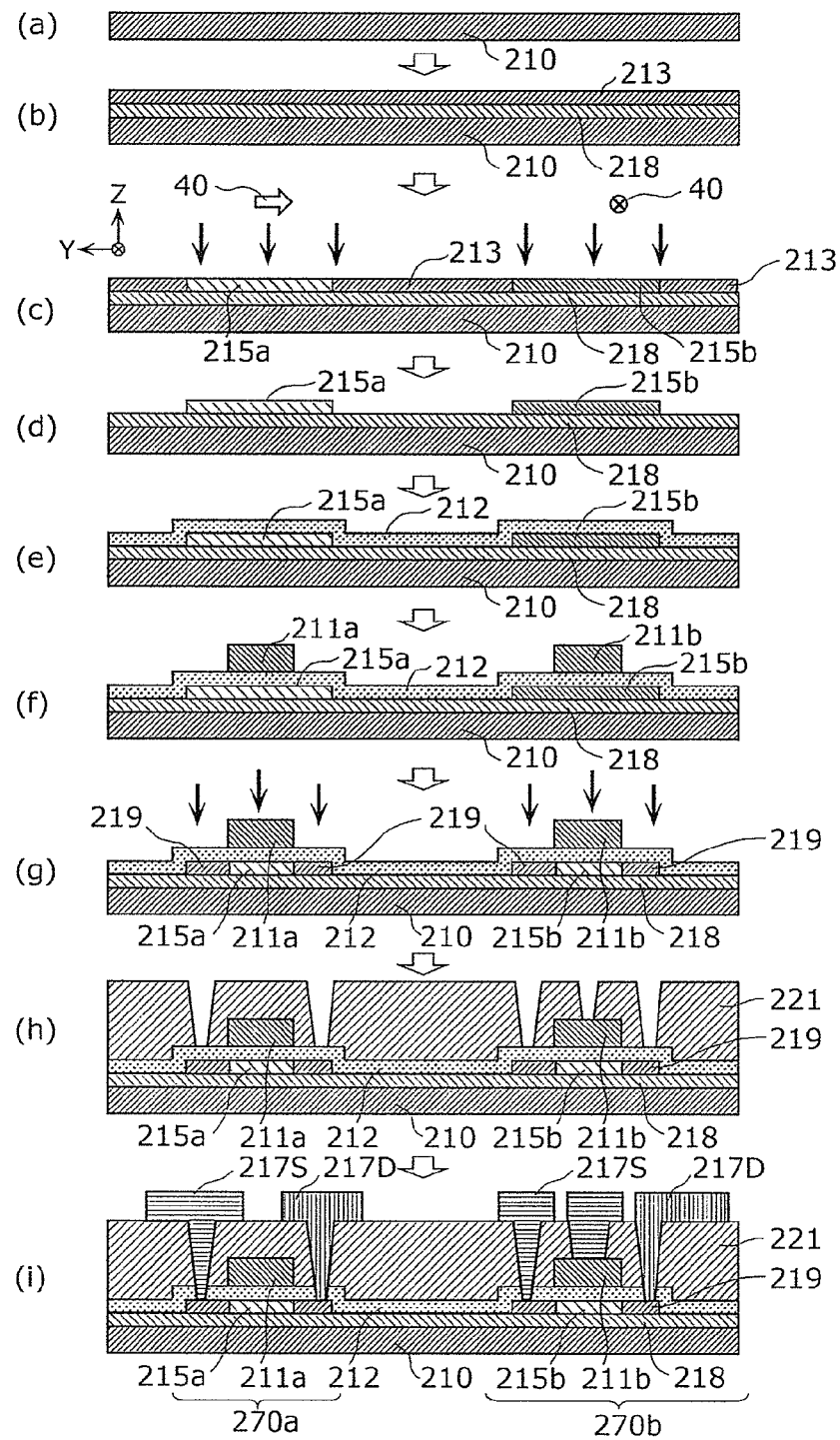
FIG. 25($a$)-($i$) shows cross-sectional views schematically illustrating steps of a method of manufacturing top-gate type TFTs according to Embodiment 2.

The following describes a method of manufacturing a top-gate type TFT according to Embodiment 2 using FIG. 25. FIG. 25 shows cross-sectional views schematically illustrating steps of a method of manufacturing top-gate type TFTs according to Embodiment 2. In FIG. 25, each cross-section of a switching transistor is a view taken along the X direction and viewed from the Y direction shown in FIG. 19, and each cross-section of a driver transistor is a view taken along the Y direction and viewed from the X direction shown in FIG. 19.

First, as shown in (a) in FIG. 25, a substrate 210 is prepared in the same manner as shown in (a) in FIG. 10 (step of preparing a substrate).

Next, as shown in (b) in FIG. 25, an undercoat film 218 which is an insulating film such as a film of silicon oxide or a film of silicon nitride is formed on the substrate 210, and then an amorphous silicon thin film 213 is formed in the same manner as shown in (b) in FIG. 10 (step of forming a silicon thin film).

Next, in the same manner as shown in (c) in FIG. 10, predetermined areas of the amorphous silicon thin film 213 is crystallized into crystalline silicon thin films 215a and 215b as shown in (c) in FIG. 25 through relative scan with laser light which is performed on the amorphous silicon thin film 213 in a scanning direction 40 while the predetermined areas of the amorphous silicon thin film 213 are being irradiated with the laser light (step of crystallizing a silicon thin film). This step of crystallizing a silicon thin film is performed in the same manner as the step of crystallization in the above-described method of manufacturing a substrate with a thin film formed thereabove in Embodiment 1.

More specifically, the amorphous silicon thin film 213 is irradiated with laser light by scanning the amorphous silicon thin film 213 with the laser light in a scanning direction 40 (X-axis direction) under a set of conditions for laser irradiation corresponding to of the region C or the region D shown in FIG. 4. For example, the laser used for irradiation may have a fixed beam minor axis width W1 (FWHM) of 32.0 µm and a power density of 70.0 kW/cm², and scanning speed of the substrate support unit 110 may be 400 to 580 mm/s.

In this step, the area where the switching transistor is to be formed is irradiated with laser light by scanning the area with the laser light in a scanning direction 40 which is parallel to the Y axis (the direction from left to right on the plane of the drawing). Also in this step, the area where the driver transistor is to be formed is irradiated with laser light by scanning the area with the laser light in a scanning direction 40 which is parallel to the X axis (the direction from front to back with respect to the plane of the drawing). By doing this, strip-shaped first areas 51 and second areas 52 extending in a direction approximately perpendicular to the scanning direction 40 are formed on the crystalline silicon thin film 215a and the crystalline silicon thin film 215b as shown in FIG. 20A and FIG. 20B. Furthermore, in Embodiment 2, the longitudinal direction of the strip-shaped first areas 51 of the crystalline silicon thin film 215a and the longitudinal direction of the strip-shaped first areas 51 of the crystalline silicon thin film 215b are approximately perpendicular to each other.

In (c) in FIG. 25, part of the amorphous silicon thin film 213 is crystallized. Alternatively, the whole of the amorphous silicon thin film 213 may be crystallized.

Next, in the same manner as shown in (d) in FIG. 10, photolithography and wet etching are performed to selectively form, into respective patterns, the amorphous part of the silicon thin film 213 not irradiated with laser light and the crystalline silicon thin film 215 crystallized by laser irradiation, so that the amorphous silicon thin film 213 is removed, and the crystalline silicon thin film 215*a* and the crystalline silicon thin film 215*b* are each formed into an insular-shaped pattern as shown in (f) in FIG. 22.

Next, a gate insulating film 212 is formed above the substrate 210 as shown in (e) in FIG. 25 (step of forming a gate insulating film). For example, the gate insulating film 212 which is an insulating film such as a film of silicon dioxide is formed all over the substrate 10 by plasma CVD, covering over the insular-shaped crystalline silicon thin films 215*a* and 215*b*.

Next, as shown in (f) in FIG. 25, gate electrodes 211*a* and 211*b* are formed in a pattern above the substrate 210 in the same manner as shown in (e) in FIG. 10 (step of forming gate electrodes).

Next, as shown in (g) in FIG. 25, each end part of the crystalline silicon thin films 215*a* and 215*b* is lightly doped with dopant using the gate electrodes 211*a* and 211*b* as a mask in the same manner as shown in (f) in FIG. 10, so that lightly doped drain (LDD) areas 219 are formed.

Next, as shown in (h) in FIG. 25, an interlayer insulating film 221 is formed above the substrate 210 and contact holes are formed in the interlayer insulating film 221 in the same manner as shown in (g) in FIG. 10 so that the LDD areas 219 are exposed in the contact holes.

Next, as shown in (i) in FIG. 25, a pair of a source electrode 217S and a drain electrode 217D is formed on and in the interlayer insulating film 221 in the same manner as shown in (h) in FIG. 10, filling the contact holes in the interlayer insulating film 221. Top-gate type TFTs (switching transistor 270*a* and driver transistor 270*b*) are thus made as shown (i) in FIG. 25.

As described above, in Embodiment 2, the switching transistor 270*a* has a source electrode and a drain electrode formed so that the channel direction is approximately perpendicular to the longitudinal direction of the strip-shaped first areas in the crystalline silicon thin film 215*a*. Also as described above, the driver transistor 270*b* has a source electrode and a drain electrode formed so that the channel direction is parallel to the longitudinal direction of the strip-shaped first areas in the crystalline silicon thin film 215*b*. The switching transistor and the driver transistor are thus configured, so that OFF-state current Ioff of the switching transistor is lowered and ON-state current Ion of the driver transistor is increased.

Embodiment 3

The following describes a thin-film device, a thin-film device array substrate, and a method of manufacturing the thin-film device and the thin-film device array substrate according to Embodiment 3. A thin-film device and a thin-film device array substrate in Embodiment 3 each include the crystalline silicon thin film 15 in Embodiment 1.

Figure 26A:
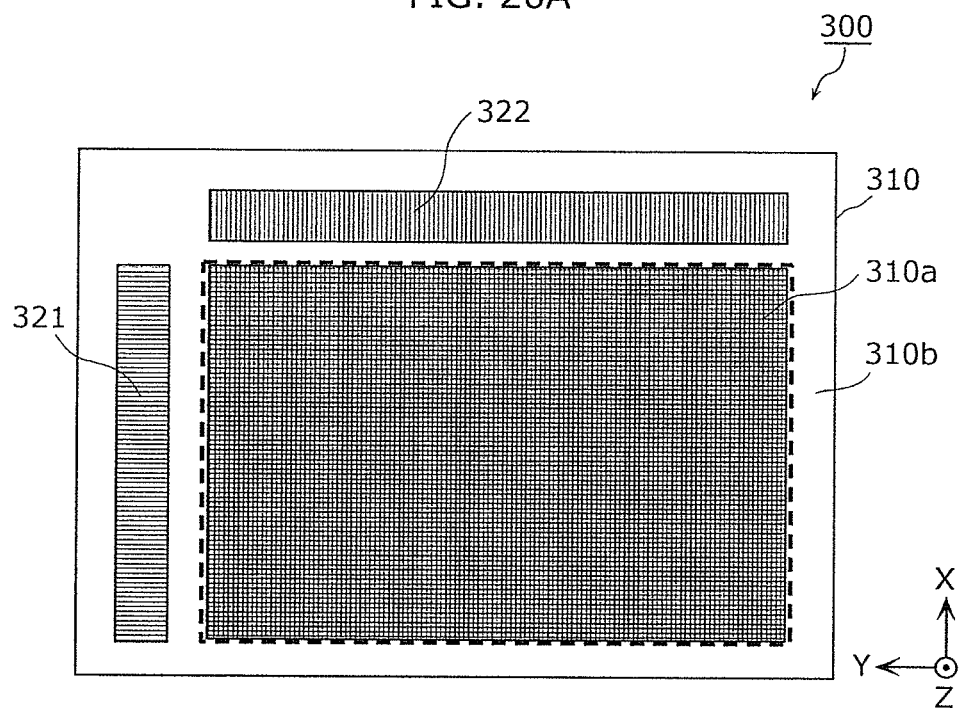
FIG. 26A is a plan view illustrating a configuration of a thin-film device array substrate according to Embodiment 3.

The following describes a configuration of a thin-film device array substrate including a thin-film device according to Embodiment 3 using FIG. 26A. FIG. 26A is a plan view illustrating a configuration of a thin-film device array substrate according to Embodiment 3.

As shown in FIG. 26A, a thin-film device array substrate 300 according to Embodiment 3 includes a substrate 310, a gate driver circuit 321, and a source driver circuit 322. The substrate 310 has a plane area divided into an inner area 310*a* and a peripheral area 310*b*. In FIG. 26A, the inner area 310*a* is the area inside a dashed-line boundary, and the peripheral area 310*b* is the area outside the dashed-line boundary.

In Embodiment 3, the inner area 310*a* is a rectangular area which is surrounded by the peripheral area 310*b* and corresponds to a pixel area (display area) where pixels are arranged in matrix (in rows and columns) on the substrate 310. The peripheral area 310*b* is a frame-like area surrounding the pixel area (inner area 310*a*) on the substrate 310. Each of the pixels in the inner area 310*a* includes TFTs such as a switching transistor.

The gate driver circuit 321 is connected to gate lines (not shown) formed along the rows of the pixels on the substrate 310 and provides gate signals to each of the pixels in the inner area 310*a* to drive the switching transistor in the pixel. The gate driver circuit 321 includes driver transistors which are TFTs such as CMOS and PMOS and other circuit elements.

The source driver circuit 322 is connected to source lines (not shown) formed along the columns of the pixels on the substrate 310 and provides video signals to each of the pixels in the inner area 310*a*. The source driver circuit 322 also includes driver transistors which are TFTs such as CMOS and PMOS and other circuit elements.

In the thin-film device array substrate 300 in Embodiment 3, the TFTs in the pixels, the gate driver circuit 321, and the source driver circuit 322 are made by thin-film formation using low temperature poly silicon (LTPS) techniques. Thus, the gate driver circuit 321 and the source driver circuit 322 may be made directly on the substrate 310 using chip-on-glass (COG) techniques and others.

Figure 26B:
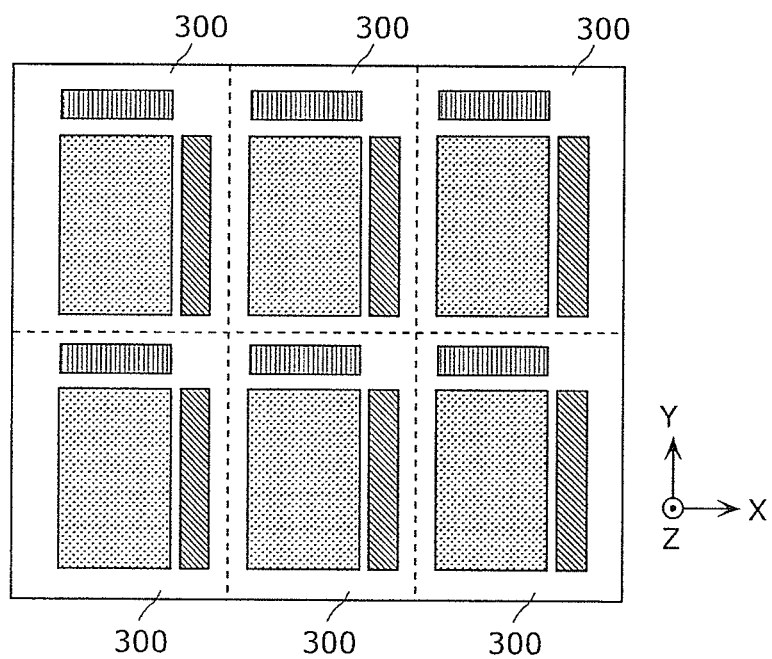
FIG. 26B shows a mother substrate of thin-film device array substrates according to Embodiment 3.

FIG. 26B shows a mother substrate of thin-film device array substrates according to Embodiment 3. FIG. 26B shows an exemplary case where six thin-film device array substrates 300 are obtained by cutting the mother substrates.

Each of the pixels in the inner area 310*a* includes a pixel transistor for switching between pixels (switching transistor).

The gate driver circuit 321 in the peripheral area 310*b* includes peripheral transistors (driver transistors) corresponding to respective rows of pixels arranged in matrix in the inner area 310*a*. The source driver circuit 322 in the peripheral area 310*b* includes peripheral transistors (driver transistors) corresponding to respective columns of pixels arranged in matrix in the inner area 310*a*.

The peripheral transistors in the peripheral area 310*b* are desired to have enhanced ON-state current characteristics, and the pixel transistors in the inner area 310*a* are desired to have enhanced OFF-state current characteristics.

Figure 27A:
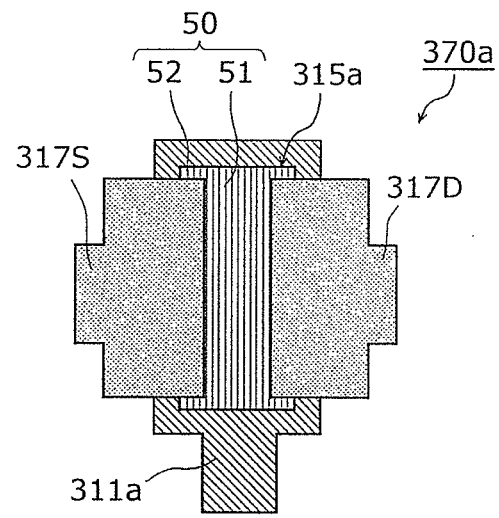
FIG. 27A shows a schematic configuration of a pixel transistor in Embodiment 3.
Figure 27B:
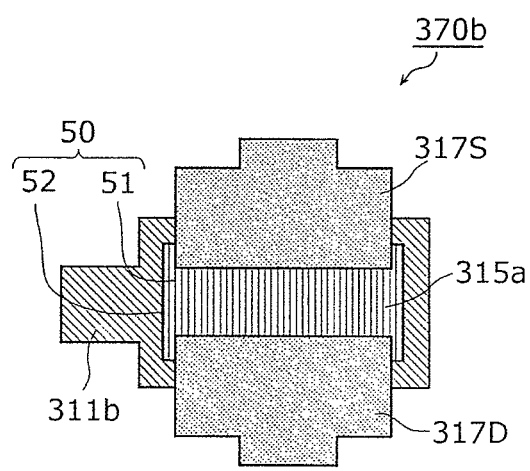
FIG. 27B shows a schematic configuration of a peripheral transistor in Embodiment 3.

The following describes a configuration of TFT (pixel transistors and peripheral transistors) according to Embodiment 2 using FIG. 27A and FIG. 27B. FIG. 27A shows a schematic configuration of a pixel transistor in Embodiment 3. FIG. 27B shows a schematic configuration of the peripheral transistor in Embodiment 3. FIG. 27A and FIG. 27B shows bottom-gate TFTs as examples of the pixel transistor and the peripheral transistor, respectively.

As shown in FIG. 27A, the switching transistor 370*a* in Embodiment 3 includes, as a channel layer, a crystalline silicon thin film having a crystallized area 50 shown in FIG. 2. The pixel transistor 370*a* has a source electrode 317S and a drain electrode 317D formed so that the channel direction is approximately perpendicular to the longitudinal direction of strip-shaped first areas 51. Each of the strip-shaped first areas 51 in the pixel transistor 370*a* is preferably continuous across the length of the channel region. The crystalline silicon thin film thus formed has enhanced OFF-state current characteristics due to lowered mobility of charge carriers, and is excellent in uniformity.

As shown in FIG. 27B, the peripheral transistor 370b in Embodiment 3 includes, as a channel layer, a crystalline silicon thin film having a crystallized area 50 shown in FIG. 2. The driver transistor 370b has a source electrode 317S and a drain electrode 317D formed so that the channel direction is parallel to the longitudinal direction of strip-shaped first areas 51. Each of the strip-shaped first areas 51 in the peripheral transistor 370b is preferably continuous across the length of the channel region. The crystalline silicon thin film thus formed has enhanced ON-state current characteristics due to increased mobility of charge carriers, and is excellent in uniformity.

Figure 28A:
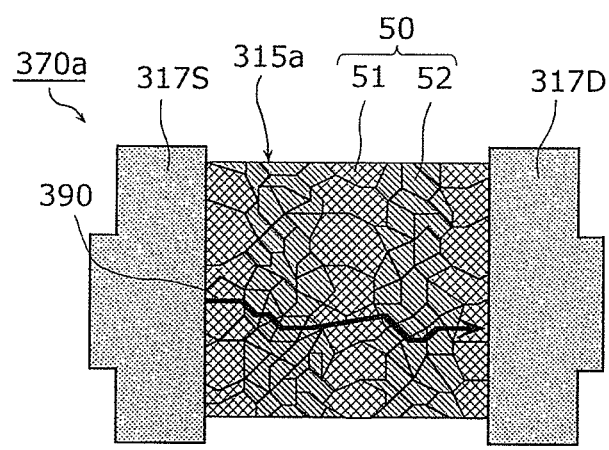
FIG. 28A is a drawing for illustration of mobility of electrons in the pixel transistor according to Embodiment 3.
Figure 28B:
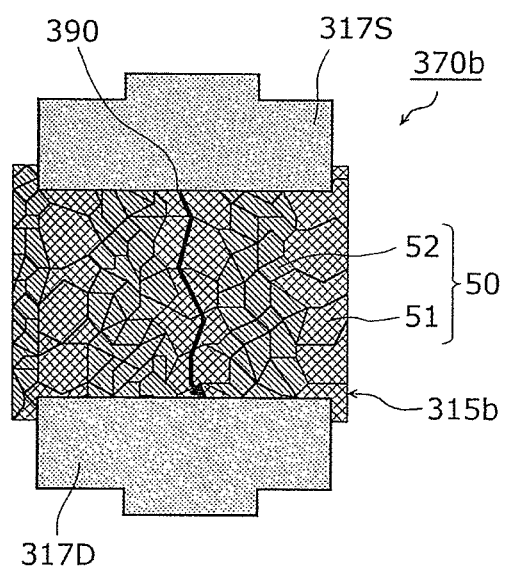
FIG. 28B is a drawing for illustration of mobility of electrons in the peripheral transistor according to Embodiment 3.

The following describes mobility of charge carriers (electrons) in the pixel transistor 370a and the peripheral transistor 370b using FIG. 28A and FIG. 28B. FIG. 28A is a drawing for illustration of mobility of electrons in the pixel transistor according to Embodiment 3. FIG. 28B is a drawing for illustration of mobility of electrons in the peripheral transistor according to Embodiment 3.

The pixel transistor 370a is desired to have enhanced characteristics of OFF-state current. More specifically, the pixel transistor 370a preferably has a smaller OFF-state current Ioff. In order to lower the OFF-state current Ioff, the source electrode 317S and the drain electrode 317D are formed as shown in FIG. 28A so that the channel direction of the pixel transistor 370a is approximately perpendicular to the longitudinal direction of the strip-shaped first areas 51 formed in the crystalline silicon thin film. Thus, in the strip-shaped second areas 52 where crystal grains have smaller grain size, an electron transfer pathway 390 between the source electrode and the drain electrode runs through more crystal grain boundaries. Accordingly, charge carriers are more likely to be trapped by the crystal grain boundaries. Current therefore flows less easily between the source electrode and the drain electrode, so that OFF-state current Ioff in the switching transistor 370a decreases. ON-state current Ion of the pixel transistor 370a is also lowered by the same mechanism. However, since it is particularly desirable for the pixel transistor 370a to have lowered OFF-state current characteristics, lowering of ON-state current Ion has a small effect.

The peripheral transistor 370b is desired to have enhanced characteristics of ON-state current. More specifically, the peripheral transistor 370b preferably has a larger ON-state current Ion. In order to increase the ON-state current Ion, the source electrode 317S and the drain electrode 317D are formed as shown in FIG. 28B so that the channel direction of the peripheral transistor 370b is parallel to the strip-shaped first areas 51 formed in the crystalline silicon thin film. Thus, in the first areas 51 where crystal grains have larger grain size and crystal grain boundaries are fewer, an electron transfer pathway 390 between the source electrode and the drain electrode runs through fewer crystal grain boundaries. Accordingly, charge carriers are less likely to be trapped by the crystal grain boundaries. Current therefore flows more easily between the source electrode and the drain electrode, so that ON-state current Ion in the peripheral transistor 370b increases.

The following describes a method of manufacturing TFTs (peripheral transistors in the peripheral area and pixel transistors in the inner area) according to Embodiment 3.

As with Embodiment 1 and Embodiment 2, a method of manufacturing the TFTs according to Embodiment 3 includes: preparing a substrate (step of preparing a substrate); forming a gate electrode above the substrate (step of preparing a gate electrode); forming a gate insulating film above the substrate (step of forming a gate insulating film); forming a silicon thin film above the substrate (step of forming a silicon thin film); crystallizing the silicon thin film formed on the substrate, by irradiating the silicon thin film with laser light (step of crystallizing a silicon thin film), and forming a source electrode and a drain electrode above the substrate (step of forming a source electrode and a drain electrode).

The step of crystallizing a silicon thin film in Embodiment 3 can be performed in the same manner as in the step of crystallizing in the method of manufacturing the TFTs according to Embodiment 1 and Embodiment 2. The crystalline silicon thin film obtained in the step of crystallizing a silicon thin film is to function as a channel layer of TFTs.

Figure 29:
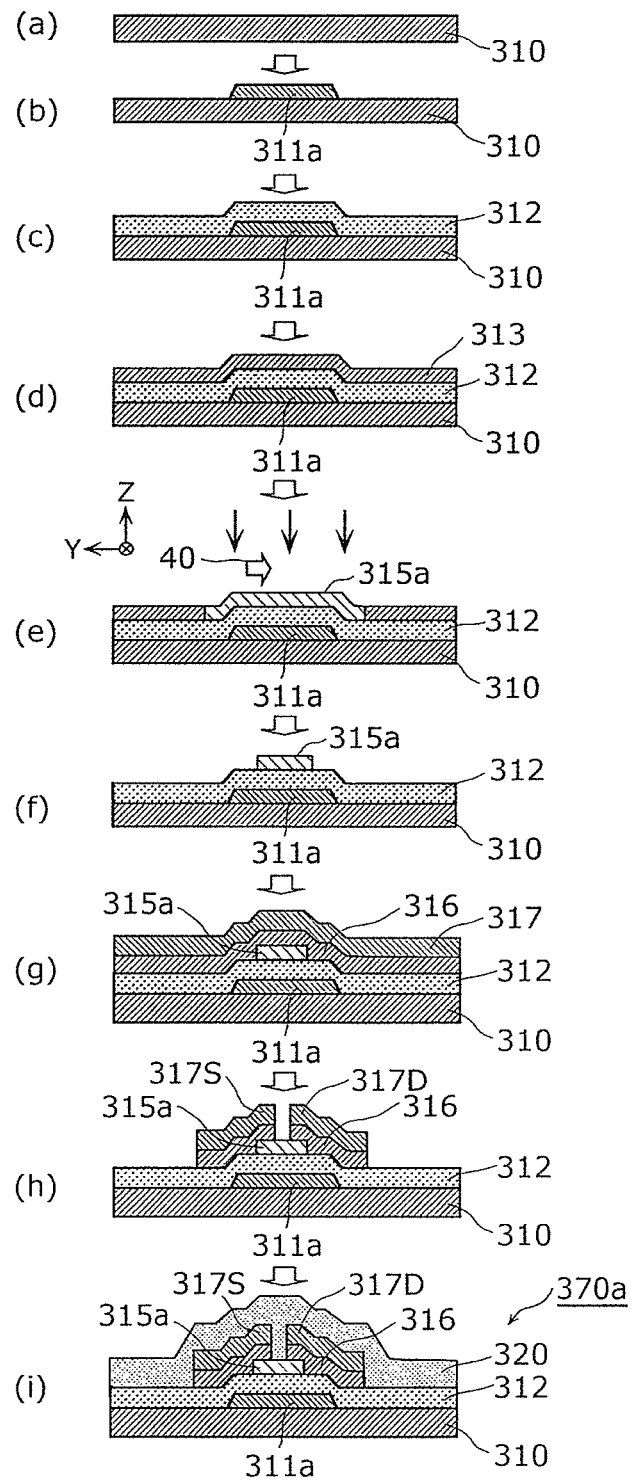
FIG. 29($a$)-($i$) shows cross-sectional views schematically illustrating steps of a method of manufacturing a bottom-gate type TFT (pixel transistor) according to Embodiment 3.

The following describes a method of manufacturing a bottom-gate type TFT which is an example of the pixel transistor 370a, using FIG. 29. FIG. 29 shows cross-sectional views schematically illustrating steps of a method of manufacturing a bottom-gate type TFT (pixel transistor) according to Embodiment 3.

First, as shown in (a) in FIG. 29, a substrate 310 is prepared in the same manner as shown in (a) in FIG. 9 (step of preparing a substrate).

Next, as shown in (b) in FIG. 29, a gate electrode 311a is formed in a pattern above the substrate 310 in the same manner as shown in (b) in FIG. 9 (step of forming a gate electrode).

Next, as shown in (c) in FIG. 29, a gate insulating film 312 is formed above the substrate 310 in the same manner as shown in (c) in FIG. 9 (step of forming a gate insulating film).

Next, as shown in (d) in FIG. 29, an amorphous silicon thin film 313 is formed above the substrate 310 in the same manner as shown in (d) in FIG. 9 (step of forming a silicon thin film).

Next, a predetermined area (where the pixel transistor 370a is to be formed) of the amorphous silicon thin film 313 is crystallized into crystalline silicon thin film 315a as shown in (e) in FIG. 29 through relative scan with laser light which is performed on the amorphous silicon thin film 313 in a scanning direction 40 while the predetermined area of the amorphous silicon thin film 313 is being irradiated with the laser light (step of crystallizing a silicon thin film). The step of crystallizing a silicon thin film is performed in the same manner as the step of crystallization in the above-described method of manufacturing a substrate with a thin film formed thereabove.

More specifically, the amorphous silicon thin film 313 is irradiated with laser light by scanning the amorphous silicon thin film 313 with the laser light in the scanning direction 40 (Y-axis direction) under a set of conditions for laser irradiation corresponding to the region C or the region D shown in FIG. 4. For example, the laser used for irradiation may have a fixed beam minor axis width W1 (FWHM) of 32.0 μm and a power density of 70.0 kW/cm$^2$, and scanning speed of the substrate support unit 110 may be 400 to 580 mm/s.

By doing this, strip-shaped first areas 51 and second areas 52 extending in a direction approximately perpendicular to the scanning direction 40 are formed on the crystalline silicon thin film 315a as shown in FIG. 27A.

In (e) in FIG. 29, part of the amorphous silicon thin film 313, that is, only the area where pixel transistor 370a is to be formed is crystallized. Alternatively, the whole of the amorphous silicon thin film 313 may be crystallized.

Next, photolithography and wet etching are performed to selectively form, into respective patterns, the amorphous part of the silicon thin film 313 not irradiated with laser light and the crystalline silicon thin film 315a crystallized by laser irradiation, so that the amorphous silicon thin film 313 is removed, and the crystalline silicon thin film 315a and the crystalline silicon thin film 315b are each formed into an insular-shaped pattern as shown in (f) in FIG. 29.

Next, as shown in (g) in FIG. 29, an n$^+$ layer which is an impurity-doped layer to be a contact layer 316 is formed, and a source drain metal film 317 is formed on the contact layer 316 in the same manner as in (f) in FIG. 9.

Next, as shown in (h) in FIG. 29, photolithography and wet etching are performed to form a source electrode 317S and a drain electrode 317D of the pixel transistor 370a above the substrate 310 in the same manner as shown in (g) in FIG. 9 (step of forming a source electrode and a drain electrode).

Next, dry etching is performed to divide the contact layer 316 to form an opposite pair of remains of the contact layer 316. A bottom-gate type pixel transistor 370a is thus made as shown (h) in FIG. 29.

Next, a passivation film 320 which is a silicon nitride film covering over the TFT may further be formed as shown in (i) in FIG. 29.

Figure 30:
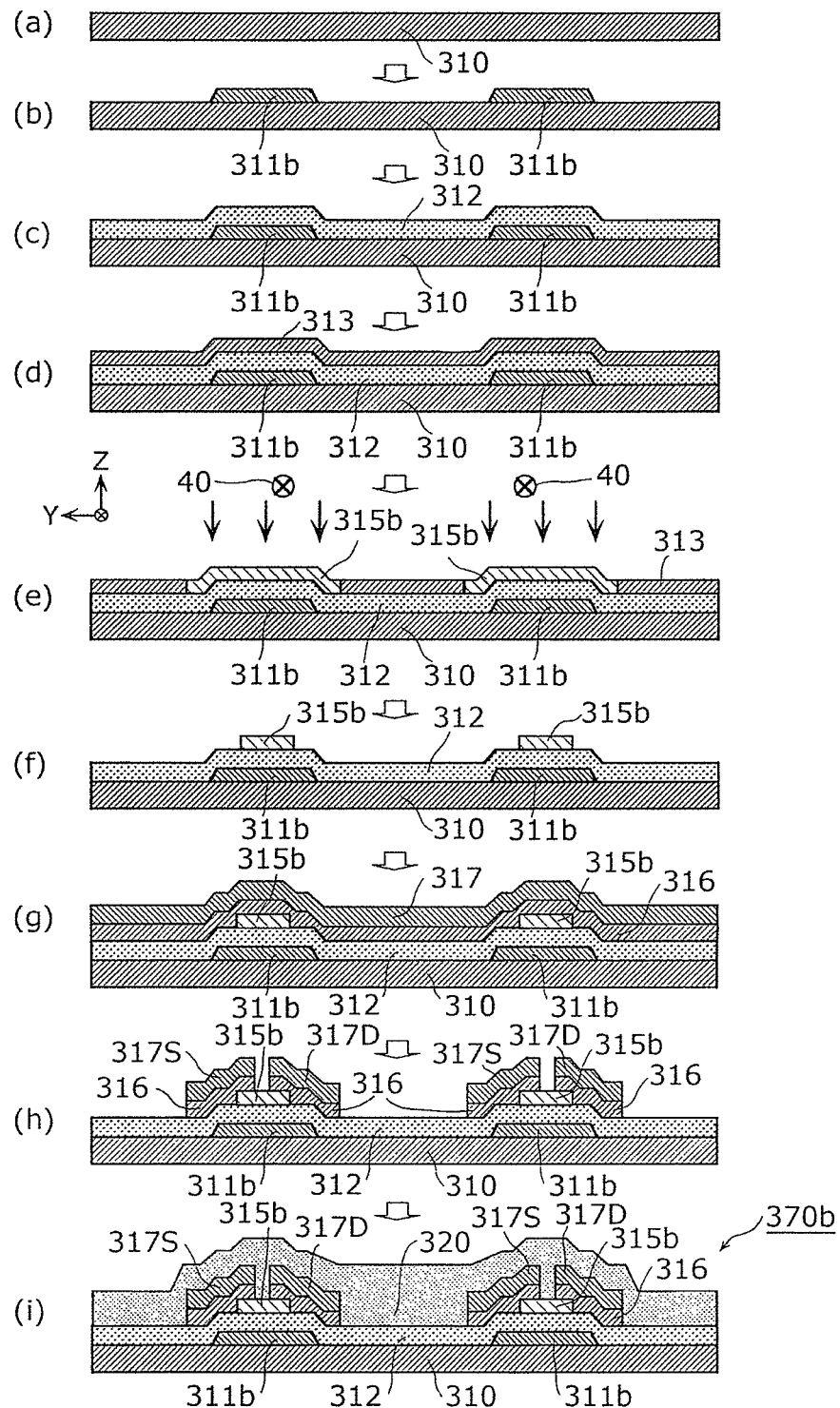
FIG. 30($a$)-($i$) shows cross-sectional views schematically illustrating steps of a method of manufacturing a bottom-gate type TFTs (peripheral transistors) according to Embodiment 3.

The following describes a method of manufacturing a bottom-gate type TFT according to Embodiment 3, which is an example of the peripheral transistor 370b, using FIG. 30. FIG. 30 shows cross-sectional views schematically illustrating steps of a method of manufacturing a bottom-gate type TFT (peripheral transistor) according to Embodiment 3.

First, as shown in (a) in FIG. 30, a substrate 310 is prepared in the same manner as shown in (a) in FIG. 9 (step of preparing a substrate).

Next, as shown in (b) in FIG. 30, gate electrodes 311b are formed in a pattern above the substrate 310 in the same manner as shown in (b) in FIG. 9 (step of forming a gate electrode).

Next, as shown in (c) in FIG. 30, a gate insulating film 313 is formed above the substrate 310 in the same manner as shown in (c) in FIG. 9 (step of forming a gate insulating film).

Next, as shown in (d) in FIG. 30, an amorphous silicon thin film 313 is formed above the substrate 310 in the same manner as shown in (d) in FIG. 9 (step of forming a silicon thin film).

Next, predetermined areas (where the pixel transistors 370b are to be formed) of the amorphous silicon thin film 313 is crystallized into through crystalline silicon thin films 315b as shown in (e) in FIG. 30 through relative scan with laser light which is performed on the amorphous silicon thin film 313 in a scanning direction 40 while the predetermined areas of the amorphous silicon thin film 313 is being irradiated with the laser light (step of crystallizing a silicon thin film). The step of crystallizing a silicon thin film is performed in the same manner as the step of crystallization in the above-described method of manufacturing a substrate with a thin film formed thereabove.

More specifically, the amorphous silicon thin film 313 is irradiated with laser light by scanning the amorphous silicon thin film 313 with the laser light in a scanning direction 40 (X-axis direction) under a set of conditions for laser irradiation of the region C or the region D shown in FIG. 4. For example, the laser used for irradiation may have a fixed beam minor axis width W1 (FWHM) of 32.0 µm and a power density of 70.0 kW/cm$^2$, and scanning speed of the substrate support unit 110 may be 400 to 580 mm/s.

By doing this, the crystalline silicon thin films 315b each have strip-shaped first areas and second areas extending in a direction parallel to the scanning direction 40 as shown in FIG. 27B.

In (e) in FIG. 30, part of the amorphous silicon thin film 313, that is, only the areas where peripheral transistors 370b are to be formed is crystallized. Alternatively, the whole of the amorphous silicon thin film 313 may be crystallized.

Next, photolithography and wet etching are performed to selectively form, into respective patterns, the amorphous part of the silicon thin film 313 not irradiated with laser light and the crystalline silicon thin films 315b crystallized by laser irradiation, so that the amorphous silicon thin film 313 is removed, and the crystalline silicon thin films 315b are each formed into an insular-shaped pattern as shown in (f) in FIG. 30.

Next, as shown in (g) in FIG. 30, an n$^+$ layer which is an impurity-doped layer to be a contact layer 316 is formed, and a source drain metal film 317 is formed on the contact layer 316 in the same manner as in (f) in FIG. 9.

Next, as shown in (h) in FIG. 30, photolithography and wet etching are performed to form a source electrode 317S and a drain electrode 317D of the peripheral transistors 370a above the substrate 310 in the same manner as shown in (g) in FIG. 9 (step of forming a source electrode and a drain electrode).

Next, dry etching is performed to divide the contact layer 316 to form an opposite pair of remains of the contact layer 316. Bottom-gate type peripheral transistors 370b are thus made as shown (h) in FIG. 30.

Next, a passivation film 320 which is a silicon nitride film covering over the TFT may further be formed as shown in (i) in FIG. 30.

The following describes Id-Vg characteristics of a TFT according to Embodiment 3 using FIG. 31 and FIG. 32. FIG. 31 shows Id-Vg characteristics of the pixel transistor and the peripheral transistors according to Embodiment 3. FIG. 32 shows Ion and Ioff of a pixel transistor and a peripheral transistor according to Embodiment 3. The Id-Vg characteristics shown in FIG. 31 and FIG. 32 were obtained as a result of measurement under the following conditions: FWHM along the minor axis of laser for irradiation . . . 32 µm; laser power density . . . 70.0 kW/cm$^2$; stage scanning speed . . . 580 mm/s; TFT type . . . bottom-gate; channel width and channel length of pixel transistor and peripheral transistor . . . 20 µm and 13 µm; and voltage applied between source and drain . . . 10.0 V.

As shown in FIG. 31, when the same gate voltage Vg is applied, the current value Id of a peripheral transistor having a channel direction approximately perpendicular to the scanning direction 40 is higher than the current value Id of the pixel transistor having the channel direction parallel to the scanning direction 40.

More specifically, as shown in FIG. 32, when the gate voltage Vg is 10.0 V, the ON-state current Ion of the peripheral transistor is $3.48 \times 10^{-4}$ A, and the ON-state current Ion of the pixel transistor is $1.09 \times 10^{-5}$ A. This indicates that the peripheral transistor has enhanced ON-state current characteristics.

Also as shown in FIG. 32, the minimum current, that is, the OFF-state current Ioff of the peripheral transistor is $9.34 \times 10^{-11}$ A, and the minimum current, that is, the OFF-state current Ioff of the pixel transistor is $1.53 \times 10^{-11}$ A. This indicates that the pixel transistor has enhanced OFF-state current characteristics.

As described above, in the thin-film device according to Embodiment 3, the pixel transistor has a source electrode and a drain electrode formed so that the channel direction is approximately perpendicular to the longitudinal direction of the strip-shaped first areas in the crystalline silicon thin film. Also as described above, in the thin-film device according to Embodiment 3, the peripheral transistor has a source electrode and a drain electrode formed so that the channel direction is parallel to the longitudinal direction of the strip-shaped first areas in the crystalline silicon thin film. The pixel transistor and the peripheral transistor are thus configured, so that OFF-state current Ioff of the pixel transistor is lowered and at the same time ON-state current Ion of the peripheral transistors is increased.

It is preferable in Embodiment 3 that the crystalline silicon thin films 315a and 315b be formed under a set of conditions for laser irradiation corresponding to the region D shown in FIG. 4. When the crystalline silicon thin films 315a and 315b are formed by crystallizing the amorphous silicon thin film 313 under a set of conditions of the region D, the strip-shaped first areas are formed at a regular pitch.

The laser irradiation may be performed under the following conditions: power density . . . 70.0 kW/cm$^2$; stage scanning speed . . . 580 mm/s; irradiation time . . . 49.0 μsec; and input energy density . . . 3.5 J/cm$^2$. The crystalline silicon thin films 315a and 315b formed under a set of conditions for laser irradiation in Embodiment 3 include both strip-shaped first areas 51 and second areas 52. The crystalline silicon thin film formed under a set of conditions for laser irradiation in Embodiment 3 has a Raman shift peak having a FWHM of 4.8 to 5.5 cm$^{-1}$, inclusive. This indicates that when the Raman FWHM of the crystalline silicon thin film is within the range of 4.8 to 5.5 cm$^{-1}$, inclusive, the crystalline silicon thin film has grain structure including strip-shaped first areas 51 in which crystal grains have larger grain size.

For example, in the crystalline silicon thin films 315a and 315b, the average grain size of silicon grains in the first areas is 440 nm, and the average grain size of silicon grains in the second areas is 80 nm. The pitches between the first areas are 1.8 μm wide, which is a regular width of the pitches not wider than 2.0 μm. This enables manufacture of TFT arrays (thin-film device array substrates) including TFTs having TFT characteristics excellent in inplane uniformity.

The thin-film device array substrates thus obtained can be used as thin-film device array substrates for liquid crystal panels.

Embodiment 3, which has been described using bottom-gate type TFTs as examples of the pixel transistor 370a and the peripheral transistor 370b, is not limited to the bottom-gate type TFTs. Alternatively, the pixel transistor 370a and the peripheral transistor 370b may be top-gate type TFTs. In this case, the pixel transistor 370a and the peripheral transistor 370b can be manufactured in the same manner as shown in FIG. 25.

As described above, in the TFTs (pixel transistors and peripheral transistors) manufactured using a method according Embodiment 3, the pixel transistor 370a has a source electrode and a drain electrode formed so that the channel direction is approximately perpendicular to the longitudinal direction of the strip-shaped first areas in the crystalline silicon thin film 315a. Also as described above, in the thin-film device manufactured using a method according Embodiment 3, the peripheral transistor 370b has a source electrode and a drain electrode formed so that the channel direction is parallel to the longitudinal direction of the strip-shaped first areas in the crystalline silicon thin film 315b. The pixel transistor 370a and the peripheral transistor 370b are thus configured, so that OFF-state current Ioff of the pixel transistor is lowered and at the same time ON-state current Ion of the peripheral transistors is increased.

Embodiment 4

The following describes Embodiment 4. In Embodiment 4, a display panel including the thin-film device array substrate described in Embodiment 3 is described. The display panel is described below with reference to FIG. 33A and FIG. 33B. FIG. 33A shows a plan view of a display panel according to Embodiment 4. FIG. 33B shows a cross-sectional view of the display panel according to Embodiment 4.

As shown in FIG. 33A, the display panel according to Embodiment 4 has a display device 466 on a thin-film device array substrate 465. The thin-film device array substrate 465 includes an inner area where transistors are disposed and a peripheral area where peripheral transistors are disposed as described in Embodiment 3. The display device 466 is disposed above the inner area of the thin-film device array substrate 465, covering over the inner area. The display device 466 may be a liquid display panel or an OLED panel including light-emitting elements, for example.

FIG. 33B is a cross-sectional view of the line Y-Y through the display panel shown in FIG. 33A. As shown in FIG. 33B, the thin-film device array substrate 465 has a gate driver circuit region 461 or a source driver circuit region (not shown) in the peripheral area where the display device 466 is not disposed. Peripheral transistors in the gate driver circuit region 461 or the source driver circuit region are required to have enhanced ON-state current characteristics. Thus, the peripheral transistors are formed to have a channel direction parallel to the strip-shaped first areas and second areas formed by irradiating an amorphous silicon thin film with laser light. Pixel transistors in the inner area are required to have enhanced OFF-state current characteristics. Thus, the pixel transistors are formed to have a channel direction crossing the strip-shaped first areas and second areas formed by irradiating an amorphous silicon thin film with laser light.

In this configuration, OFF-state current of the pixel transistors in the inner area is lowered and ON-state current of the peripheral transistors in the peripheral area is increased.

The present invention is not limited to the embodiments or examples described above on the basis of a method of manufacturing a substrate with a thin film thereabove, a method of manufacturing a thin-film substrate, a thin-film substrate, a thin-film device, a method of manufacturing a TFT, and a TFT.

For example, a semiconductor thin film which is not a silicon thin film can be used as a semiconductor thin film in the above-described embodiments instead of the silicon thin film used. For example, a crystalline semiconductor thin film can be formed by crystallizing a semiconductor film including germanium (Ge) or SiGe.

The laser light may have a beam minor axis width W1 larger than the beam major axis width W2 instead of the beam minor axis width W1 smaller than the beam major axis width W2 as described in the above-described embodiments. In this case, scanning with laser light is performed in the same direction as in the above-described embodiments, that is, scanning is performed so that the minor axis of the laser light aligns with the scanning direction.

The shape of the projection of laser light (or the shape of intensity distribution of laser light) on the silicon thin film is not limited to a rectangle having a major axis and a minor axis as in the above-described embodiments. For example, the shape of the projection of laser light (or the shape of intensity distribution of laser light) on the silicon thin film may be an oval having a major axis and a minor axis, a circle, or a square.

Furthermore, the TFT or TFT array substrate manufactured in the above-described embodiments may be included in a display device such as an OLED display device or a liquid crystal display device. Furthermore, the display devices may be used as flat displays applicable to electronic devices such as television sets, personal computers, and mobile phones.

Furthermore, the crystalline silicon thin film formed in the above-described embodiments may be applicable not only to TFTs but also to various electronic devices such as photoelectric conversion devices including solar cells and image sensors.

The crystalline silicon thin films in the above-described embodiments may be either n-type semiconductors or p-type semiconductors.

It should be noted that various modifications of the exemplary embodiments as well as embodiments resulting from arbitrary combinations of structural elements of the different exemplary embodiments that may be conceived by those skilled in the art are intended to be included within the scope of the present invention as long as these do not depart from the essence of the present invention.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The method of manufacturing a substrate having a thin film thereabove and the thin-film substrate according to any of the exemplary embodiments disclosed herein are advantageously applicable to TFTs, solar cells, and electronic devices including a crystalline silicon thin film such as sensors. Furthermore, the method of manufacturing a substrate having a thin film thereabove and the thin-film substrate according to any of the exemplary embodiments disclosed herein are advantageously applicable to display devices of television sets, personal computers, and mobile phones and other electric appliances.

The invention claimed is:

1. A method of manufacturing a substrate having a thin film thereabove, the method comprising:
    preparing a substrate;
    forming a thin film above the substrate; and
    crystallizing at least a predetermined area of the thin film into a crystallized area through relative scan of the thin film with the substrate irradiated with a continuous wave light beam,
    wherein a projection of the light beam on the thin film has a major axis in a direction crossing a direction of the relative scan, and
    in the crystallizing, the crystallized area is formed to include a strip-shaped first area extending in the direction crossing the direction of the relative scan and a second area adjacent to the strip-shaped first area in the direction of the relative scan, the strip-shaped first area including crystal grains having an average grain size larger than an average grain size of crystal grains included in the second area.

2. The method of manufacturing a substrate having a thin film thereabove according to claim 1,
    wherein the second area lies on each side of the strip-shaped first area, and
    the strip-shaped first area includes crystal grains which are in contact with the second area on the each side of the strip-shaped first area.

3. The method of manufacturing a substrate having a thin film thereabove according to claim 1,
    wherein the crystal grains included in the strip-shaped first area and in contact with the second area on the each side of the strip-shaped first area account for at least 80% of the strip-shaped first area in length.

4. The method of manufacturing a substrate having a thin film thereabove according to claim 1,
    wherein the strip-shaped first area is continuous within a length of the major axis.

5. The method of manufacturing a substrate having a thin film thereabove according to claim 1,
    wherein the average grain size of the crystal grains included in the strip-shaped first area formed in the crystallizing is 100 nm to 500 nm, inclusive, and
    the average grain size of the crystal grains included in the second area formed in the crystallizing is 30 nm or larger and smaller than 100 nm.

6. The method of manufacturing a substrate having a thin film thereabove according to claim 1,
    wherein in the crystallizing,
    a plurality of the strip-shaped first areas are formed at a regular pitch.

7. The method of manufacturing a substrate having a thin film thereabove according to claim 6,
    wherein in the crystallizing,
    each of the strip-shaped first areas is formed to have a Raman shift peak having a full width at half maximum of 4.8 $cm^{-1}$ to 5.5 $cm^{-1}$, inclusive, in a Raman scattering spectrum measured using Raman spectroscopy.

8. The method of manufacturing a substrate having a thin film thereabove according to claim 6,
    wherein the regular pitch between adjacent ones of the strip-shaped first areas formed in the crystallizing is 2.0 µm or shorter.

9. The method of manufacturing a substrate having a thin film thereabove according to claim 1,
    wherein the light beam is laser light having a wavelength of 405 nm to 632 nm, inclusive.

10. The method of manufacturing a substrate having a thin film thereabove according to claim 9,
    wherein division of a minor axis width of intensity distribution of the laser light by a speed of the relative scan of the thin film with the laser light gives a quotient of 60 µsec or less.

11. A method of manufacturing a thin-film-device substrate, the method comprising:
    preparing a substrate;
    forming a first gate electrode and a second gate electrode apart from each other above the substrate;
    forming a gate insulating film on the first gate electrode and the second gate electrode;
    forming a thin film on the gate insulating film;
    crystallizing the thin film above the first gate electrode and the second gate electrode through relative scan of the thin film with the substrate irradiated with a continuous wave light beam from above the first gate electrode and the second gate electrode; and
    forming a source electrode and a drain electrode above the thin film located above each of the first gate electrode and the second gate electrode,
    wherein a projection of the light beam on the thin film has a major axis in a direction crossing a direction of the relative scan, and
    in the crystallizing, the crystallized area is formed to include a strip-shaped first area extending in the direction crossing the direction of the relative scan and a second area adjacent to the strip-shaped first area in a direction of the relative scan, the strip-shaped first area including crystal grains having an average grain size larger than an average grain size of crystal grains included in the second area.

12. The method of manufacturing a thin-film-device substrate according to claim 11,
    wherein the second area lies on each side of the strip-shaped first area, and the strip-shaped first area includes crystal grains which are in contact with the second area on both of the each side of the strip-shaped first area.

13. The method of manufacturing a thin-film-device substrate according to claim 11,
wherein the crystal grains included in the strip-shaped first area and in contact with the second area on the each side of the strip-shaped first area account for at least 80% of the strip-shaped first area in length.

\* \* \* \* \*